(12) United States Patent
Mohan et al.

(10) Patent No.: US 12,500,594 B2
(45) Date of Patent: Dec. 16, 2025

(54) METHODS AND APPARATUS TO CALIBRATE ANALOG-TO-DIGITAL CONVERTERS

(71) Applicant: Texas Instruments Incorporated, Dallas, TX (US)

(72) Inventors: Arun Mohan, Bangalore (IN); Chetan P Hanakanahalli, Hubli (IN); Jagannathan Venkataraman, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 171 days.

(21) Appl. No.: 18/399,379

(22) Filed: Dec. 28, 2023

(65) Prior Publication Data
US 2025/0219648 A1 Jul. 3, 2025

(51) Int. Cl.
*H03M 1/10* (2006.01)
(52) U.S. Cl.
CPC ....... *H03M 1/1061* (2013.01); *H03M 1/1009* (2013.01)
(58) Field of Classification Search
CPC ........................... H03M 1/1009; H03M 1/1061
See application file for complete search history.

(56) References Cited

U.S. PATENT DOCUMENTS 11,387,838 B1 * 7/2022 Dyer .................... H03M 1/1033
11,962,318 B2 * 4/2024 Varshney ................ H03M 1/50

* cited by examiner

*Primary Examiner* — Khai M Nguyen
(74) *Attorney, Agent, or Firm* — Mandy Barsilai Fernandez; Frank D. Cimino

(57) ABSTRACT

An example apparatus includes: first voltage-to-delay circuitry having an output; second voltage-to-delay circuitry having an output; time domain converter circuitry having a first input, a trim input, and an output, the first input of the time domain converter circuitry coupled to the first voltage-to-delay circuitry; comparator circuitry having a first input, a second input, and an output, the first input of the comparator circuitry coupled to the output of the first voltage-to-delay circuitry and the first input of the time domain converter circuitry, the second input of the comparator circuitry coupled to the output of the second voltage-to-delay circuitry; and trim circuitry having a first input, a second input, and an output, the first input of the trim circuitry coupled to the output of the time domain converter circuitry, the second input of the trim circuitry coupled to the output of the comparator circuitry.

20 Claims, 20 Drawing Sheets

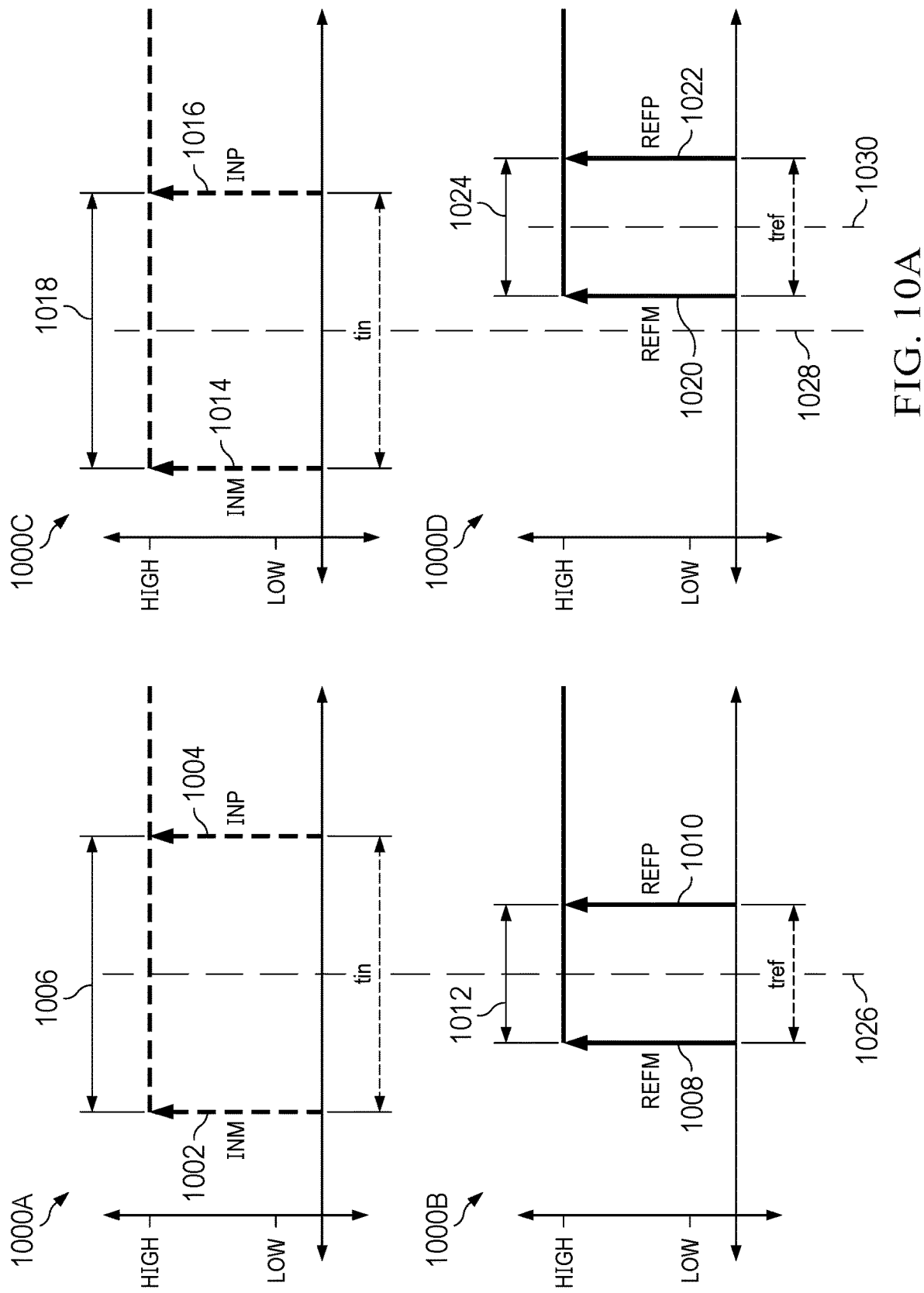

METHODS AND APPARATUS TO CALIBRATE ANALOG-TO-DIGITAL CONVERTERS

TECHNICAL FIELD

This description relates generally to analog-to-digital conversion and, more particularly, to methods and apparatus to calibrate analog-to-digital converters.

BACKGROUND

With continuing advancements in electronic design, analog-to-digital converters (ADCs) have become capable of operating at increasing speed, precision, and power efficiency. Some ADCs include circuitry to calibrate components. Such circuitry increases the precision of outputs of the ADC. As conversion times continue to decrease, ADCs have become capable of sampling signals at increasing speeds with increasing accuracy.

SUMMARY

For methods and apparatus to calibrate analog-to-digital converters, an example apparatus includes first voltage-to-delay circuitry having an output; second voltage-to-delay circuitry having an output; time domain converter circuitry having a first input, a trim input, and an output, the first input of the time domain converter circuitry coupled to the first voltage-to-delay circuitry; comparator circuitry having a first input, a second input, and an output, the first input of the comparator circuitry coupled to the output of the first voltage-to-delay circuitry and the first input of the time domain converter circuitry, the second input of the comparator circuitry coupled to the output of the second voltage-to-delay circuitry; and trim circuitry having a first input, a second input, and an output, the first input of the trim circuitry coupled to the output of the time domain converter circuitry, the second input of the trim circuitry coupled to the output of the comparator circuitry, the output of the trim circuitry coupled to the trim input of the time domain converter circuitry.

For methods and apparatus to calibrate analog-to-digital converters, another example apparatus includes time domain converter circuitry having a first input, a second input, a trim input, and an output, wherein differences between timing of the first and second inputs of the time domain converter circuitry represent a first delay; first comparator circuitry having a first input, a second input, and an output, the first input of the first comparator circuitry coupled to the first input of the time domain converter circuitry; second comparator circuitry having a first input, a second input, and an output, the first input of the second comparator circuitry coupled to the second input of the time domain converter circuitry; third comparator circuitry having a first input, a second input, and an output, the first input of the third comparator circuitry coupled to the second input of the first comparator circuitry, the second input of the third comparator circuitry coupled to the second input of the second comparator circuitry, wherein differences between timing of the first and second inputs of the time domain converter circuitry represent a second delay; and trim circuitry having a first input, a second input, a third input, and an output, the first input of the trim circuitry coupled to the output of the first comparator circuitry, the second input of the trim circuitry coupled to the output of the second comparator circuitry, the third input of the trim circuitry coupled to the output of the third comparator circuitry, the output of the trim circuitry coupled to the trim input of the time domain converter circuitry.

For methods and apparatus to calibrate analog-to-digital converters, yet another example apparatus includes time domain converter circuitry configured to determine a digital value that represents a first delay, the first delay being a delay between a first signal and a second signal; comparator circuitry coupled to the time domain converter circuitry, the comparator circuitry configured to compare the first delay to a second delay; and trim circuitry coupled to the time domain converter circuitry and the comparator circuitry, the trim circuitry is configured to adjust the time domain converter circuitry responsive to the digital value and the comparison.

BRIEF DESCRIPTION OF THE DRAWINGS

FIGS. 10A and 10B illustrate example operations of the reference comparator circuitry of FIGS. 1 and 9 including example common mode errors between an example input delay and an example reference delay.

The same reference numbers or other reference designators are used in the drawings to designate the same or similar (functionally and/or structurally) features.

DETAILED DESCRIPTION

Figure 1:
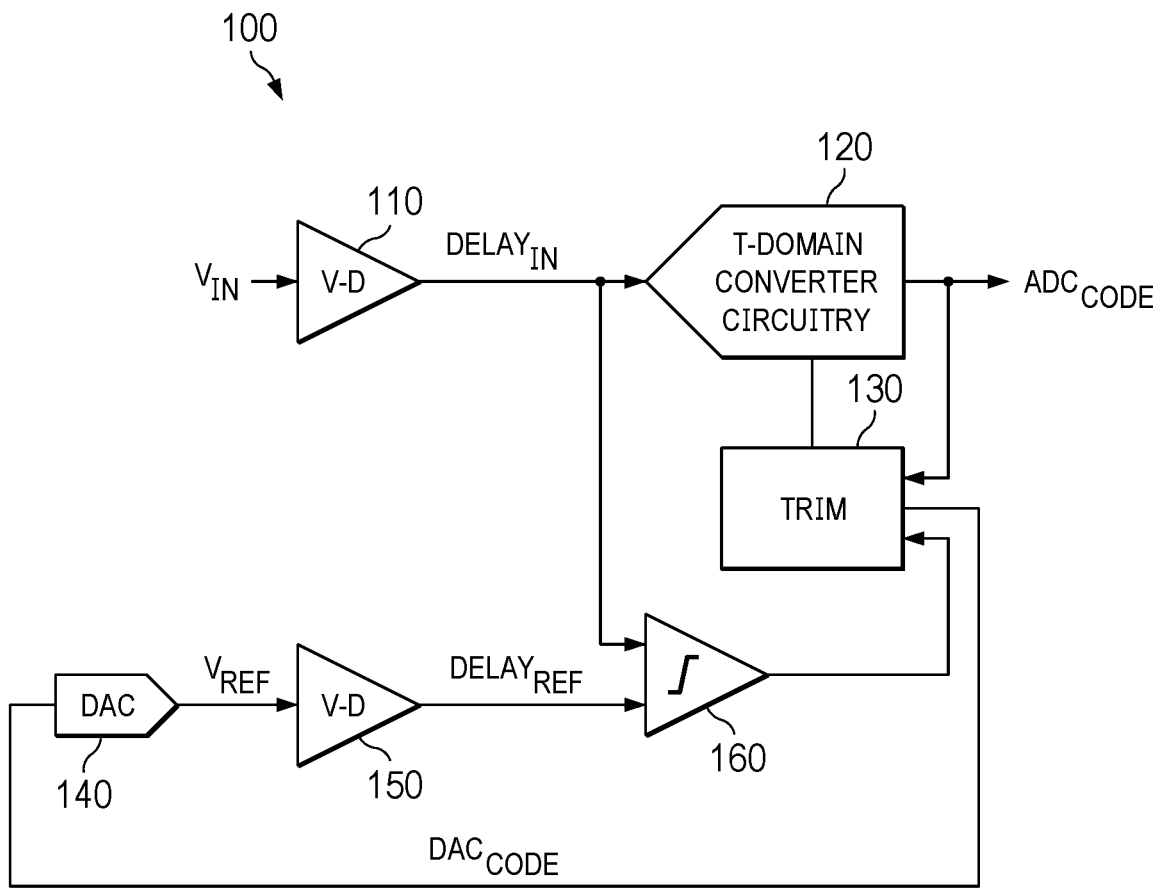
FIG. 1 is a schematic diagram of example analog-to-digital converter (ADC) circuitry including example time domain converter circuitry, example reference comparator circuitry, and example trim circuitry.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

With continuing advancements in electronic design, analog-to-digital converters (ADCs) have become capable of operating at increasing speed, precision, and power efficiency. Some ADCs include circuitry to calibrate components. Such circuitry increases the precision of outputs of the ADC. As conversion times continue to decrease ADCs have become capable of sampling signals at increasing speeds with increasing accuracy.

Some ADC circuitry utilizes a voltage domain to generate digital output values that represent analog input values. Such voltage domain ADC circuitry uses comparisons of reference voltages to an analog voltage to generate sign bits of the digital output. However, using the voltage domain for analog-to-digital conversions relies on circuitry capable of producing consistent reference voltages. Further, settling times of comparisons between the analog voltages and the reference voltages may limit the conversion time of the ADC circuitry. Voltage domain ADC circuitry is limited by the power efficiency of the circuitry responsible for generating the reference voltages and by the timing of the comparisons of the reference voltage to the analog voltage. For multi-bit analog-to-digital conversions, the power efficiency and timing of voltage domain ADC circuitry compound, which limits implementations.

Other ADC circuitry utilizes a time domain to generate digital output values that represent analog input values. Such time domain ADC circuitry generates an input delay duration responsive to an analog input. The delay duration is unique to the analog value of the analog input. Time domain converter circuitry includes time domain converter circuitry to generate sign bits of the digital output values by comparing the input delay duration to reference delay duration thresholds. In such examples, the time domain converter circuitry uses a plurality of stage circuitry to compare the input delay duration to the delay duration thresholds. By comparing the input delay duration to thresholds in the time domain, time domain converter circuitry reduces settling times needed for comparisons, which increases conversion speeds. However, to achieve the precision of time domain converter circuitry relies on an accuracy of the delay duration thresholds. In some implementations of the time domain converter circuitry, designers include trim circuitry to calibrate values of the time domain converter circuitry. Calibrating values of the time domain converter circuitry increases accuracy of the time domain converter circuitry.

Some example uses of trim circuitry to calibrate the time domain ADC circuitry utilize a second instance of the ADC circuitry. To calibrate time domain ADC circuitry using multiple instances of the ADC circuitry, relatively high-speed multiplexers sequence supplying ideal reference voltages to each instance of the ADC circuitry. The trim circuitry compares the digital output values from both instances of the ADC circuitry responsive to the ideal voltages. The trim circuitry uses a plurality of such comparisons to determine trim values of components of the time domain converter circuitry. The second instance of the ADC circuitry substantially increases the system-on-chip (SoC) size of the time domain converter circuitry.

Other example uses of trim circuitry to calibrate the time domain ADC circuitry utilize voltage domain comparator circuitry. The voltage domain comparator circuitry compares a voltage at the input of the time domain ADC circuitry to a reference voltage. In order for the output of the voltage domain comparator circuitry to be accurate, the ADC circuitry must sample the analog input at almost an exact time. When coupled to relatively high-speed analog signals, any differences between sampling by the time domain converter circuitry and the voltage domain comparator circuitry results in inaccuracies in calibration. Any bandwidth mismatches between the time domain converter circuitry and the voltage domain converter circuitry corrupt the calibration operations.

Examples described herein include methods and apparatus to calibrate ADC circuitry using a comparison between the input delay duration and a reference delay duration using reference comparator circuitry. In some described examples, the ADC circuitry includes first and second instances of voltage-to-delay circuitry, time domain converter circuitry, reference comparator circuitry, and trim circuitry. A first instance of the voltage-to-delay circuitry generates the input delay duration responsive to an analog input. The time domain converter circuitry generates a digital output value having a plurality of sign bits responsive to the input delay duration. The trim circuitry uses digital-to-analog converter circuitry to generate a reference voltage. A second instance of the voltage-to-delay circuitry generates a reference delay duration responsive to the reference voltage. The reference delay duration represents a target delay duration threshold of the time domain converter circuitry. The reference comparator circuitry compares the timing of the input delay duration to the reference delay duration.

The trim circuitry compares the sign bit of the digital output value that corresponds to the target delay duration to the output of the reference comparator responsive to determining that the time domain converter circuitry used the delay duration corresponding to the target delay duration. When calibrated, the sign bit of the digital output value of the time domain converter circuitry is equal to the comparison output of the reference comparator circuitry. The trim circuitry accumulates differences between the digital output and the comparison output. The trim circuitry determines to calibrate values the time domain converter circuitry responsive to accumulated differences between the digital output values and the comparison output being greater than a threshold. The trim circuitry uses the accumulated values of one or more delay duration thresholds to select a calibration operation. In some examples, the calibration operations include offset correction, shift correction, and mismatch correction. The trim circuitry calibrates each stage circuitry of the time domain converter circuitry using one or more of the calibration operations. Advantageously, the ADC circuitry described herein uses a time domain comparison to calibrate the time domain converter circuitry, which increases the accuracy of the ADC circuitry.

FIG. 1 is a schematic diagram of example analog-to-digital converter (ADC) circuitry 100. In the example of FIG. 1, the ADC circuitry 100 includes first example voltage-to-delay (V-D) circuitry 110, example time domain converter circuitry 120, example trim circuitry 130, example digital-to-analog converter (DAC) circuitry 140, second example voltage-to-delay circuitry 150, and example comparator circuitry 160. The ADC circuitry 100 converts an analog voltage of an input voltage (VIN) to a digital output value ($ADC_{CODE}$). In some examples, such as FIG. 1, the ADC circuitry 100 may be described and/or referred to as a time domain ADC. In such examples, the ADC circuitry 100 determines the digital output value responsive to a time domain signal, which represents the input voltage. Such examples are described in further detail below.

The V-D circuitry 110 has an input that may be coupled to external circuitry and an output coupled to the time domain converter circuitry 120 and the comparator circuitry 160. In some examples, such as FIG. 2, the V-D circuitry 110 has a first and second output coupled to the time domain converter circuitry 120 and the comparator circuitry 160. The V-D circuitry 110 receives an analog voltage from the external circuitry. In some examples, the analog input voltage is a sample of an analog input signal. The V-D circuitry 110 supplies a time domain signal to the time domain converter circuitry 120 and the comparator circuitry 160.

The V-D circuitry 110 generates an input delay duration that is proportional to the analog voltage of the analog input. For example, the V-D circuitry 110 generates a first delay duration responsive to the analog input being a first voltage and a second delay duration responsive to the analog input being a second voltage. The V-D circuitry 110 adjusts generation of an edge of the time domain signal by the determined delay duration. For example, the V-D circuitry 110 modifies a duty cycle of a pulse width modulation (PWM) signal to adjust timing of a rising edge of the time domain signal by the determined delay duration.

In some examples, the time domain signal is a pair of signals having an input delay duration ($DELAY_{IN}$). In such examples, the V-D circuitry 110 generates the input delay duration by adjusting timing of edges of signals forming the pair of signals. For example, the V-D circuitry 110 increases the duty cycle of a first signal and decreases the duty cycle of a second signal to generate the delay duration between the first and second signals. In such an example, the input delay duration is the difference between rising edges of the first and second signals. Advantageously, the input delay duration of the output of the V-D circuitry 110 represents the analog input of the V-D circuitry 110.

The time domain converter circuitry 120 has a first input coupled to the V-D circuitry 110 and the comparator circuitry 160 and a trim input coupled to the trim circuitry 130. The time domain converter circuitry 120 has an output coupled to the trim circuitry 130. In some examples, such as FIG. 2, the time domain converter circuitry 120 has a first and second input coupled to first and second outputs of the V-D circuitry 110. The time domain converter circuitry 120 receives the time domain signal having the input delay duration from the V-D circuitry 110 and trim codes from the trim circuitry 130. The time domain converter circuitry 120 supplies a digital output value to the trim circuitry 130 and may supply the digital output value to external circuitry.

The time domain converter circuitry 120 determines the digital output value by comparing delay duration thresholds to the input delay duration. The digital output value has a plurality of sign bits, which each represent an output of a comparison by the time domain converter circuitry 120. The time domain converter circuitry 120 determines the value of each sign bit by comparing delay durations to delay duration thresholds. In some examples, the delay duration thresholds represent bits of the digital output value. In such examples, the precision of the ADC circuitry 100 may be modified by increasing or decreasing the number of delay duration thresholds of the time domain converter circuitry 120. In example operations, when a delay duration is greater than a delay duration threshold, the time domain converter circuitry 120 sets a corresponding bit of the digital output value to a logical one (e.g., logic high). In such example operations, when the delay duration is less than the delay duration threshold, the time domain converter circuitry 120 sets the corresponding sign bit of the digital output value to a logical zero (e.g., logic low).

The trim circuitry 130 calibrates the delay duration thresholds by adjusting trim codes of components (illustrated in FIGS. 3 and 4) of the time domain converter circuitry 120. The trim codes adjust values of the components of the time domain converter circuitry 120, which adjusts timing of one or more delay duration thresholds. In example operations, the time domain converter circuitry 120 adjusts the delay duration thresholds responsive to trim codes from the trim circuitry. In some examples, adjusting the trim codes of the time domain converter circuitry 120 may be referred to as a trim operation or a calibration operation. Example trim operations are further described in connection with FIGS. 6A, 6B, 6C, 7, 8A, and 8B. Advantageously, adjusting the trim codes of the time domain converter circuitry 120 modifies timing of the delay duration thresholds.

The trim circuitry 130 has a first input coupled to the time domain converter circuitry 120 and a second input coupled to the reference comparator circuitry 160. The trim circuitry 130 has a first output coupled to the time domain converter circuitry 120 and a second output coupled to the DAC circuitry 140. In some examples, such as FIG. 11, the trim circuitry 130 has a plurality of outputs coupled to the time domain converter circuitry. The trim circuitry 130 receives the digital output code from the time domain converter circuitry 120 and a comparison output from the comparator circuitry 160. The trim circuitry 130 supplies trim codes to the time domain converter circuitry 120 and a digital input code ($DAC_{CODE}$) to the DAC circuitry 140.

The trim circuitry 130 calibrates the delay duration thresholds of the time domain converter circuitry 120 using trim codes to control component values. The trim circuitry 130 begins calibration operations by selecting one of the delay duration thresholds. The trim circuitry 130 sets the digital input code to a value corresponding to a target delay duration of the selected one of the delay duration thresholds. The trim circuitry 130 receives the comparator output responsive to setting the digital input code. In example operations, the comparator output represents a comparison of the target delay duration and the input delay duration. The trim circuitry 130 compares the comparator output to the corresponding digital output value from the time domain converter circuitry 120. The trim circuitry 130 determines whether the time domain converter circuitry 120 used the selected one of the delay duration thresholds to determine the digital output value. In some examples, the trim circuitry 130 uses bits of the digital output code, which surround the bit corresponding to the selected one of the delay duration thresholds to detect whether the time domain converter circuitry 120 used the selected one of the delay duration thresholds to determine the digital output value.

The trim circuitry 130 accumulates values responsive to the comparison of the digital output code to the comparison output. In some examples, the trim circuitry 130 increments a first value responsive to the digital output code being a logical one and does not increment a second value responsive to the comparator output being a logical zero. When the digital output code and the comparator output match, the trim circuitry 130 increments both accumulated values by the value of the sign bit. The trim circuitry 130 uses the accumulated values to determine differences between the target delay duration thresholds and the delay duration thresholds of the time domain converter circuitry 120.

The trim circuitry 130 compares the difference between accumulated values to a threshold value, which represents a minima error, to determine whether to adjust one or more trim codes of the time domain converter circuitry 120. When the determined difference is greater than the threshold value, the trim circuitry 130 adjusts the trim codes of components corresponding to the selected one of the delay duration thresholds. In some examples, the trim circuitry 130 determines accumulated values for a plurality of delay duration thresholds before determining whether to adjust trim values. For example, while calibrating the second most significant bit (MSB), the trim circuitry 130 may determine an error value for each threshold of the circuitry corresponding to the second MSB. In such examples, the trim circuitry 130 may select a trim operation to perform responsive to differences between each of the accumulated values. Such example operations are further described in connection with FIGS. 11, 12A, and 12B, below. An example of the trim circuitry 130 is illustrated and described in further detail in connection with FIG. 11, below. The trim circuitry 130 calibrates each of the delay duration thresholds by adjusting trim codes of the time domain converter circuitry 120. Advantageously, the trim circuitry 130 increases the accuracy of the ADC circuitry 100 by calibrating the thresholds of the time domain converter circuitry 120.

The DAC circuitry 140 has an input coupled to the trim circuitry 130 and an output coupled to the V-D circuitry 150. The DAC circuitry 140 receives the digital input code from the trim circuitry 130. The DAC circuitry 140 generates a reference voltage (VREF) responsive to the digital input code. The reference voltage is an analog voltage representation of the digital input code. The DAC circuitry 140 supplies the reference voltage to the V-D circuitry 150. In example operations, the trim circuitry 130 sets the digital input code to correspond to a target threshold of the time domain converter circuitry 120. In such example operations, the DAC 140 generates the reference voltage to represent a reference delay duration of the target delay duration threshold.

The V-D circuitry 150 has an input coupled to the DAC circuitry 140 and an output coupled to the comparator circuitry 160. The V-D circuitry 150 receives the threshold voltage from the DAC 140. The V-D circuitry 150 supplies a reference time domain signal to the comparator circuitry 160. In the example of FIG. 1, the V-D circuitry 150 generates the reference time domain signal similar to the V-D circuitry 110. In some example operations, when the reference voltage represents a threshold of the time domain converter circuitry 120, the delay duration of the reference time domain signal is approximately equal to the one of the delay duration thresholds.

The comparator circuitry 160 has a first input coupled to the V-D circuitry 110 and the time domain converter circuitry 120 and a second input coupled to the V-D circuitry 150. The comparator circuitry 160 has an output coupled to the trim circuitry 130. An example of the comparator circuitry 160 is illustrated and described in further detail in connection with FIG. 9, below. The comparator circuitry 160 receives the input time domain signal from the V-D circuitry 110 and the reference time domain signal from the V-D circuitry 150. The comparator circuitry 160 supplies a comparison output to the trim circuitry 130.

The comparator circuitry 160 compares the input delay duration to the reference delay duration. In some example operations, when the reference voltage represents a target threshold of the time domain converter circuitry 120, the comparator circuitry 160 compares the target delay duration thresholds to the input delay duration. When calibrated, the comparison output is equal to the sign bit of the time domain converter circuitry 120 corresponding to the target delay duration threshold. However, differences between the comparison output and the sign bit occur responsive to variations between the target delay duration threshold and the delay duration threshold of the time domain converter circuitry 120. Advantageously, the trim circuitry 130 may use the circuitry 140, 150, 160 to determine an accuracy of the delay duration thresholds of the time domain converter circuitry 120.

Figure 2:
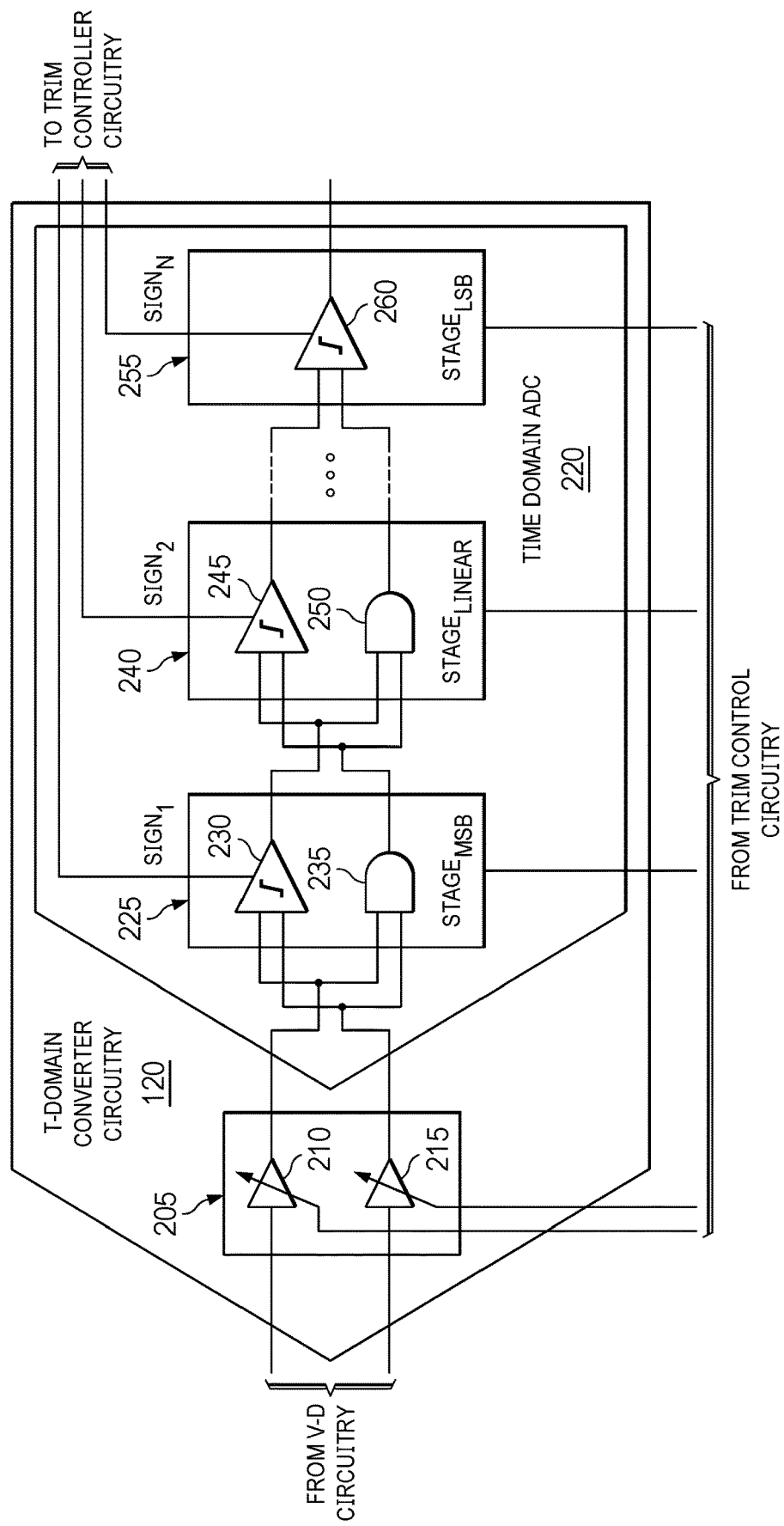
FIG. 2 is a schematic diagram of an example of the time domain converter circuitry of FIG. 1 including example stage circuitry, which further includes example comparator circuitry and an example logic device.

FIG. 2 is a schematic diagram of an example of the time domain converter circuitry 120 of FIG. 1. The time domain converter circuitry 120 has inputs coupled to the V-D circuitry 110 of FIG. 1 and the trim circuitry 130 of FIG. 1. The time domain converter circuitry 120 has outputs coupled to the trim circuitry 130 and that may be coupled to external circuitry. In the example of FIG. 2, the time domain converter circuitry 120 includes example variable delay circuitry 205, first example delay circuitry 210, second example delay circuitry 215, example time domain ADC circuitry 220, first example stage circuitry 225, first example comparator circuitry 230, a first example logic device 235, second example stage circuitry 240, second example comparator circuitry 245, a second example logic device 250, third example stage circuitry 255, and third example comparator circuitry 260. The time domain converter circuitry 120 generates the digital output value to represent the input delay duration, which represents an analog voltage.

The variable delay circuitry 205 has first inputs that may be coupled to the V-D circuitry 110 and second inputs that may be coupled to the trim circuitry 130. The variable delay circuitry 205 receives a plus and minus input signals from the V-D circuitry 110. The plus and minus input signals represent the input time domain signal. In the example of FIG. 2, the variable delay circuitry 205 includes the delay circuitry 210, 215. The variable delay circuitry 205 delays plus and minus input signals. The trim circuitry 130 controls the delays of the variable delay circuitry 205. The variable delay circuitry 205 supplies the delayed input signals to the time domain ADC circuitry 220.

The delay circuitry 210 has a first input that may be coupled to the V-D circuitry 110 and an output coupled to the time domain ADC circuitry 220. The delay circuitry 210 has a control input coupled that may be coupled to the trim circuitry 130. The delay circuitry 210 receives the plus input signal from the V-D circuitry 110. The delay circuitry 210 delays the plus input signal by a first delay duration. The trim circuitry 130 controls the first delay duration by the control input of the delay circuitry 210. In some examples, the trim circuitry 130 sets the first delay duration by setting a trim code of the delay circuitry 210. In such examples, the trim circuitry 130 may increase and/or decrease the first delay duration by adjusting the trim code. For example, the delay circuitry 210 delays rising edges of the plus input signal by a first duration responsive to a first trim code and a second duration responsive to a second trim code. Advantageously, the trim circuitry 130 may set the trim code of the delay circuitry 210 to delay the plus input signal.

The delay circuitry 215 has a first input that may be coupled to the V-D circuitry 110 and an output coupled to the time domain ADC circuitry 220. The delay circuitry 215 has a control input coupled that may be coupled to the trim circuitry 130. The delay circuitry 215 receives the minus input signal from the V-D circuitry 110. The delay circuitry 215 delays the minus input signal by a second delay duration. The trim circuitry 130 controls the second delay duration by the control input of the delay circuitry 215. In some examples, the trim circuitry 130 sets the second delay duration by setting a trim code of the delay circuitry 215. In such examples, the trim circuitry 130 may increase and/or decrease the second delay duration by adjusting the trim code. For example, the delay circuitry 215 delays rising edges of the plus input signal by a first duration responsive to a first trim code and a second duration responsive to a second trim code. Advantageously, the trim circuitry 130 may set the trim code of the delay circuitry 215 to delay the minus input signal.

The time domain ADC circuitry 220 has inputs coupled to the trim circuitry 130 and the delay circuitries 210, 215 and outputs coupled to the trim circuitry 130 and that may be coupled to external circuitry. The time domain ADC circuitry 220 receives the plus and minus input signals from the delay circuitries 210, 215. In some examples, the time domain ADC circuitry 220 may be directly coupled to the V-D circuitry 110. In such examples, the time domain ADC circuitry 220 may receive the plus and minus input signals from the V-D circuitry 110. In the example of FIG. 2, the time domain ADC circuitry 220 includes the stage circuitries 225, 240, 255, the comparator circuitry 230, 245, 260, and the logic devices 235, 250. The time domain ADC circuitry 220 generates sign bits that represent the input delay duration of the plus and minus input signals. The time domain ADC circuitry 220 uses delay duration thresholds of the stage circuitries 225, 240, 255 to generate the sign bits. The digital output value of the time domain ADC circuitry 220 is a plurality of the sign bits. Example operations of the time domain ADC circuitry 220 are further described below.

The stage circuitry 225 has a first and second input coupled to the variable delay circuitry 205 and calibration inputs that may be coupled to the trim circuitry 130. The stage circuitry 225 has a first and second output coupled to the stage circuitry 240 and a third output that may be coupled to the trim circuitry 130. The stage circuitry 225 receives the plus and minus input signals from the variable delay circuitry 205 and trim codes from the trim circuitry 130. In the example of FIG. 2, the stage circuitry 225 includes the comparator circuitry 230 and the logic device 235. The stage circuitry 225 generates a first sign bit ($SIGN_1$) by comparing the input delay duration of the plus and minus input signals to a first delay duration threshold. The stage circuitry 225 supplies the first sign bit to the trim circuitry 130.

The comparator circuitry 230 has a first input coupled to the delay circuitry 210 and the logic device 235, a second input coupled to the delay circuitry 215 and the logic device 235, and trim inputs that may be coupled to the trim circuitry 130. The comparator circuitry 230 has a first output coupled to the stage circuitry 240 and a second output that may be coupled to the trim circuitry 130. The comparator circuitry 230 receives the plus and minus input signals from the delay circuitries 210, 215 and trim codes from the trim circuitry 130. The comparator circuitry 230 compares a delay duration between the plus and minus input signals to the first delay duration threshold. The trim circuitry 130 may set the first delay duration threshold responsive to setting trim code values of the comparator circuitry 230. An example operation to set the first delay duration threshold is further described in connection with FIG. 3, below.

In example operations, when the delay duration of the plus and minus input signals is greater than the first delay duration threshold, the comparator circuitry 230 sets the first sign bit to a first state (e.g., value, logical level, etc.). When the delay duration of the plus and minus input signals is less than the first delay duration threshold, the comparator circuitry 230 sets the first sign bit to a second state. The comparator circuitry 230 supplies the first sign bit to the trim circuitry 130.

The comparator circuitry 230 generates a first comparison output signal responsive to comparing the plus and minus input signals. The comparator circuitry 230 supplies the first comparison output signal to the stage circuitry 240. In example operations, the comparator circuitry 230 may delay the first comparison output signal responsive to trim codes from the trim circuitry 130. Similar to the configurable delays of the delay circuitries 210, 215, circuitry of the comparator circuitry 230 may add a configurable delay duration to the first comparison output signal. In such examples, the trim circuitry 130 may set the delay duration threshold by adjusting trim code values of the comparator circuitry 230. Such a variable delay duration allows the comparator circuitry 230 to adjust the first delay duration threshold. Example operations of the trim circuitry 130 to configure trim codes of the comparator circuitry 230 are further described below.

The logic device 235 has a first input coupled to the delay circuitry 210 and the comparator circuitry 230, a second input coupled to the delay circuitry 215 and the comparator circuitry 230, and trim inputs that may be coupled to the trim circuitry 130. The logic device 235 has an output coupled to the stage circuitry 240. The logic device 235 receives the plus and minus input signals from the delay circuitries 210, 215 and trim codes from the trim circuitry 130. In the example of FIG. 2, the logic device 235 is an AND gate.

The logic device 235 logically combines the plus and minus input signals to generate a first logically combined signal. In some examples, the logic device 235 uses and an AND operation to logically combine the plus and minus input signals. In such examples, the first logically combined signal represents the shorter pulse of the plus and minus input signals. In example operations, the logic device 235 adds a variable delay duration to the first logically combined signal. In such examples, the trim circuitry 130 controls the variable delay duration by adjusting trim codes of the logic device 235. Such an example is illustrated and described in connection with FIG. 4, below. The trim code circuitry 130 may adjust the delay duration of the logic device 235 to perform trim operations, such as those illustrated by FIGS. 6A and/or 6B. The logic device 235 supplies the first logically combined signal to the stage circuitry 240.

The stage circuitry 240 has a first and second input coupled to stage circuitry 225 and calibration inputs that may be coupled to the trim circuitry 130. The stage circuitry 240 has a first and second output that may be coupled to one or more instances of stage circuitry, such as the stage circuitries 225, 240, and a third output that may be coupled to the trim circuitry 130. The stage circuitry 240 receives the first comparison output signal and the first logically combined signal from the stage circuitry 225 and trim codes from the trim circuitry 130. In the example of FIG. 2, the stage circuitry 240 includes the comparator circuitry 245 and the logic device 250. The stage circuitry 240 generates a second sign bit ($SIGN_2$) by comparing a delay duration between the first comparison output signal and the first logically combined signal to a second delay duration threshold. The stage circuitry 240 supplies the second sign bit to the trim circuitry 130.

The comparator circuitry 245 has a first input coupled to the comparator circuitry 230 and the logic device 250, a second input coupled to the logic devices 235 and 250, and trim inputs that may be coupled to the trim circuitry 130. The comparator circuitry 245 has a first output that may be coupled to the stage circuitry 255 by one or more additional instances of the stage circuitries 225, 240, and a second output that may be coupled to the trim circuitry 130. The comparator circuitry 245 receives the first comparison output signal and the first logically combined signal from the stage circuitry 225 and trim codes from the trim circuitry 130. The comparator circuitry 245 compares the delay duration between the first comparison output signal and the first logically combined signal to the second delay duration threshold. The trim circuitry 130 may set the second delay duration threshold responsive to setting trim code values of the comparator circuitry 245. An example operation to set the second delay duration threshold is further described in connection with FIGS. 3, below.

In example operations, when the delay duration between the first comparison output signal and the first logically combined signal is greater than the second delay duration threshold, the comparator circuitry 245 sets the second sign bit to a first state (e.g., value, logical level, etc.). When the delay duration between the first comparison output signal and the first logically combined signal is less than the second delay duration threshold, the comparator circuitry 245 sets the second sign bit to a second state. The comparator circuitry 245 supplies the second sign bit to the trim circuitry 130.

The comparator circuitry 245 generates a second comparison output signal responsive to comparing the first comparison output signal and the first logically combined signal. In some examples, the comparator circuitry 245 supplies the second comparison output signal to the stage circuitry 255. In other examples, the comparator circuitry 245 supplies the second comparison output signal to one or more additional instances of the stage circuitries 225, 240. In example operations, the comparator circuitry 245 may delay the second comparison output signal responsive to trim codes from the trim circuitry 130. Similar to the variable delays of the delay circuitries 210, 215, circuitry of the comparator circuitry 245 may add a variable delay duration to the second comparison output signal. In such examples, the trim circuitry 130 may set the variable delay duration by adjusting trim code values of the comparator circuitry 245. Such a configurable delay duration allows the comparator circuitry 245 to adjust the second delay duration threshold. Example operations of the trim circuitry 130 to configure trim codes of the comparator circuitry 245 are further described below.

The logic device 250 has a first input coupled to the comparator circuitries 230, 245, a second input coupled to the logic device 235 and the comparator circuitry 245, and trim inputs that may be coupled to the trim circuitry 130. The logic device 250 has an output that may be coupled to the stage circuitry 255 by one or more additional instances of the stage circuitry 225, 240. The logic device 250 receives the first comparison output signal and the first logically combined signal from the stage circuitry 225 and trim codes from the trim circuitry 130. In the example of FIG. 2, the logic device 250 is an AND gate.

The logic device 250 logically combines the first comparison output signal and the first logically combined signal to generate a second logically combined signal. In some examples, the logic device 250 uses and an AND operation to logically combine the first comparison output signal and the first logically combined signal. In such examples, the second logically combined signal represents the shorter pulse of the first comparison output signal and the first logically combined signal. In example operations, the logic device 250 adds a configurable delay duration to the second logically combined signal. In such examples, the trim circuitry 130 controls the configurable delay duration by adjusting trim codes of the logic device 250. Such an example is illustrated and described in connection with FIG. 4, below. The trim code circuitry 130 may adjust the delay duration of the logic device 250 to perform trim operations, such as those illustrated by FIGS. 6A and/or 6B. The logic device 250 supplies the second logically combined signal to the stage circuitry 255.

The stage circuitry 255 has a first and second input that may be coupled to the stage circuitry 240 or that may be coupled to another instance of the stage circuitry 225, 240, which is coupled between the stage circuitries 240,255. The stage circuitry 255 has calibration inputs that may be coupled to the trim circuitry 130. The stage circuitry 255 has an output that may be coupled to the trim circuitry 130. In some examples, the stage circuitry 255 receives the second comparison output signal and the second logically combined signal from the stage circuitry 240 and trim codes from the trim circuitry 130. In other examples, the stage circuitry 255 receives another comparison output signal and another logically combined signal from another instance of stage circuitry 225, 240. In the example of FIG. 2, the stage circuitry 255 includes the comparator circuitry 260. Unlike the stage circuitries 225, 240, the stage circuitry 255 is the final stage of the time domain ADC circuitry 220. Accordingly, the stage circuitry 255 generates a third sign bit ($SIGN_N$) by comparing a delay duration between a comparison output signal and a logically combined signal to a third delay duration threshold. The stage circuitry 255 supplies the third sign bit to the trim circuitry 130. Although in the example of FIG. 2, only the stage circuitries 225, 240, 255 are illustrated, the time domain ADC circuitry 220 may be modified to include any plurality of instances of the stage circuitries 225, 240.

The comparator circuitry 260 has a first input that may be coupled to the comparator circuitry 245 or that may be coupled to another instance of the comparator circuitries 230, 245 of another stage circuitry coupled between the stage circuitries 240, 255. The comparator circuitry 260 has a second input that may be coupled to the logic device 250 or that may be coupled to another instance of the logic devices 235, 250 of another stage circuitry coupled between the stage circuitries 240, 255. The comparator circuitry 260 has trim inputs that may be coupled to the trim circuitry 130. The comparator circuitry 260 has an output that may be coupled to the trim circuitry 130. In some examples, the comparator circuitry 260 receives the second comparison output signal and the second logically combined signal from the stage circuitry 240 and trim codes from the trim circuitry 130. The comparator circuitry 260 compares the delay duration between the second comparison output signal and the second logically combined signal to the third delay duration threshold. The trim circuitry 130 may set the third delay duration threshold responsive to setting trim code values of the comparator circuitry 260. An example operation to set the third delay duration threshold is further described in connection with FIG. 3, below.

Figure 3:
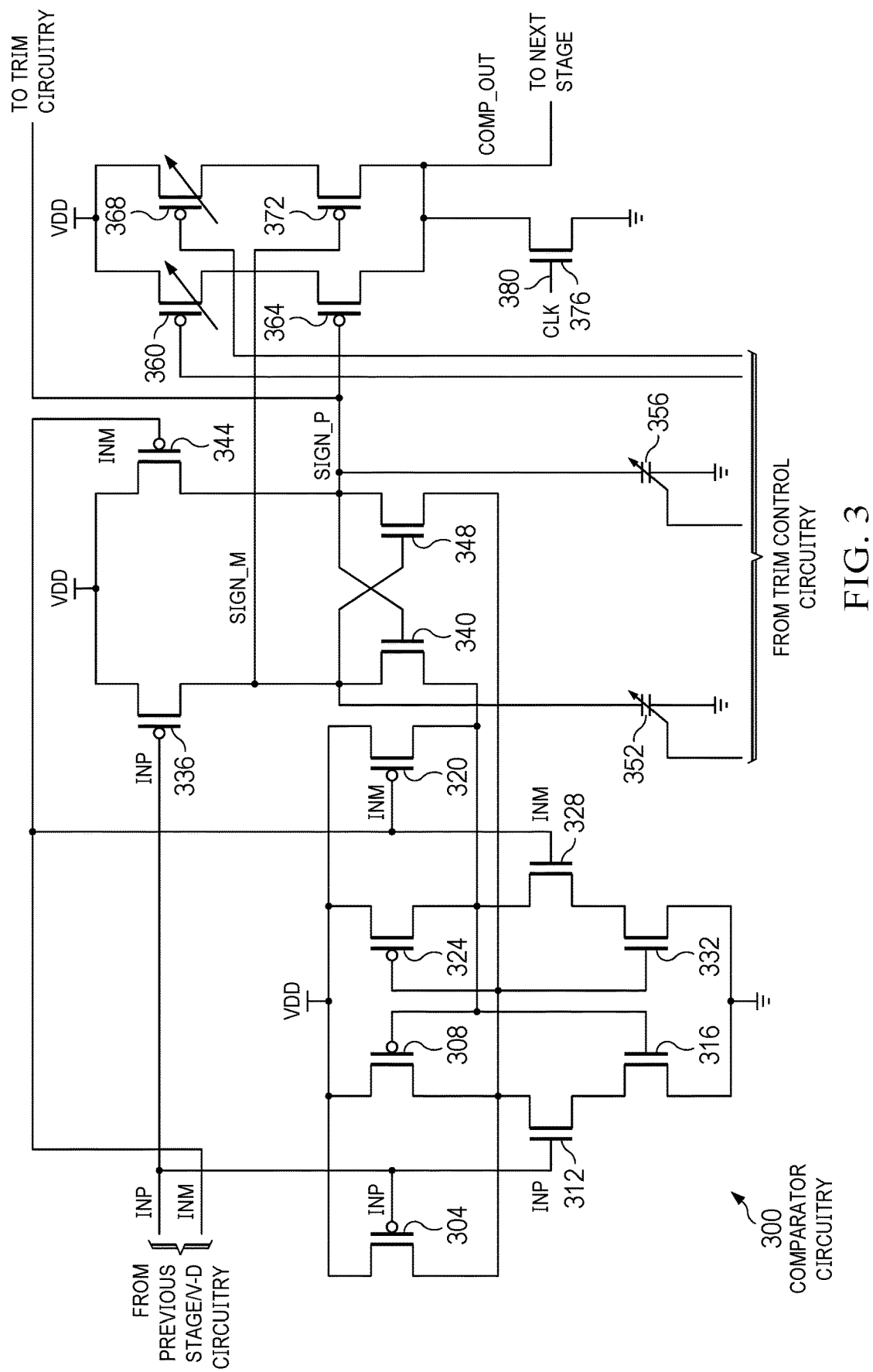
FIG. 3 is a schematic diagram of an example of the comparator circuitry of FIG. 2 including circuitry to trim timing of a threshold value of the comparator circuitry.

FIG. 3 is a schematic diagram of example comparator circuitry 300, which is an example of the comparator circuitry 230, 245, 260 of FIG. 2. The comparator circuitry 300 has a first input (INP) and a second input (INM) that may be coupled to one of the variable delay circuitry 205, such as the comparator circuitry 230, or previous stage circuitry, such as the comparator circuitry 245, 260. The comparator circuitry 300 has additional inputs that may be coupled to the trim circuitry 130 of FIG. 1. The comparator circuitry 300 has a first output that may be coupled to another one of the stage circuitries 225, 240 and a second output that may be coupled to the trim circuitry 130. In the example of FIG. 3, the comparator circuitry 300 includes a first example transistor 304, a second example transistor 308, a third example transistor 312, a fourth example transistor 316, a fifth example transistor 320, a sixth example transistor 324, a seventh example transistor 328, an eighth example transistor 332, a ninth example transistor 336, a tenth example transistor 340, an eleventh example transistor 344, a twelfth example transistor 348, a first example capacitor 352, a second example capacitor 356, a thirteenth transistor 360, a fourteenth example transistor 364, a fifteenth example transistor 368, a sixteenth example transistor 372, and a seventeenth example transistor 376.

The transistor 304 has a first terminal coupled to a supply terminal, which supplies a supply voltage (VDD), a second terminal coupled to the transistors 308, 312, 324, 332, 348, and a control terminal coupled to the first input of the comparator circuitry 300. The first input of the comparator circuitry 300 controls the transistor 304. When enabled (e.g., turned on, conducting), the transistor 304 supplies a current from the supply terminal to the transistor 312. When disabled (e.g., turned off, not conducting), the transistor 304 prevents the supply of current from the supply terminal to the transistor 312.

The transistor 308 has a first terminal coupled to the supply terminal, a second terminal coupled to the transistors 304, 312, 324, 332, 348, and a control terminal coupled to the transistors 316, 320, 324, 328, 340. The transistors 320, 324, 340 control the transistor 308. When enabled, the transistor 308 supplies current from the supply terminal. When disabled, the transistor 308 prevents the supply of current from the supply terminal.

The transistor 312 has a first terminal coupled to the transistors 304, 308, 324, 332, 348, a second terminal coupled to the transistor 316, and a control terminal coupled to the first input of the comparator circuitry 300. The first input of the comparator circuitry 300 controls the transistor 312. When enabled, the transistor 312 allows the transistors 304, 308, 348 to supply current to the transistor 316. When disabled, the transistor 312 prevents the transistor 316 from sourcing a current.

The transistor 316 has a first terminal coupled to the transistor 312, a second terminal coupled to a common terminal, which supplies a common potential (e.g., ground), and a control terminal coupled to the transistors 308, 320, 324, 328, 340. The transistors 320, 324, 340 control the transistor 316. When enabled, the transistor 316 supplies current to the common potential. When disabled, the transistor 316 prevents transistor 312 from supplying current to the common potential.

The transistor 320 has a first terminal coupled to the supply terminal, a second terminal coupled to the transistors 308, 316, 324, 328, 340, and a control terminal coupled to the second input of the comparator circuitry 300. The second input of the comparator circuitry 300 controls the transistor 320. When enabled, the transistor 320 supplies a current from the supply terminal. When disabled, the transistor 320 prevents the supply of current to the transistor 328.

The transistor 324 has a first terminal coupled to the supply terminal, a second terminal coupled to the transistors 308, 316, 320, 328, 340, and a control terminal coupled to the transistors 304, 308, 312, 332, 348. The transistors 304, 308, 348 control the transistor 324. When enabled, the transistor 324 supplies current from the supply terminal to the transistor 328. When disabled, the transistor 324 prevents the supply of current from the supply terminal to the transistor 328.

The transistor 328 has a first terminal coupled to the transistors 308, 316, 320, 324, 340, a second terminal coupled to the transistor 332 and a control terminal coupled to the second input of the comparator circuitry 300. The second input of the comparator circuitry 300 controls the transistor 328. When enabled, the transistor 328 allows the transistors 324, 320, 340 to supply current to the transistor 332. When disabled, the transistor 328 prevents the transistor 332 from sourcing a current.

The transistor 332 has a first terminal coupled to the transistor 328, a second terminal coupled to the common terminal, and a control terminal coupled to the transistors 304, 308, 312, 324, 348. The transistors 304, 308, 348 control the transistor 332. When enabled, the transistor 332 supplies current to the common potential. When disabled, the transistor 332 prevents transistor 328 from supplying current to the common potential.

The transistor 336 has a first terminal coupled to the supply terminal, a second terminal coupled to the transistors 340, 348, 372 and the capacitor 352, and a control terminal coupled to the first input of the comparator circuitry 300. The first input of the comparator circuitry 300 controls the transistor 336. When enabled, the transistor 336 supplies a current from the supply terminal to the transistor 340 and the capacitor 352. When disabled, the transistor 336 prevents the supply of current from the supply terminal to the transistor 340 and the capacitor 352.

The transistor 340 has a first terminal coupled to the transistors 336, 348, 372 and the capacitor 352, a second terminal coupled to the transistors 308, 316, 320, 324, 328, and a control terminal coupled to the transistors 344, 348, 364 and the capacitor 352. The transistor 344 and the capacitor 356 control the transistor 340. When enabled, the transistor 340 supplies current to the transistor 328. When disabled, the transistor 340 prevents the transistor 336 and the capacitor 352 from supplying current to the transistor 328.

The transistor 344 has a first terminal coupled to the supply terminal, a second terminal coupled to the transistors 340, 348, 364 and the capacitor 356, and a control terminal coupled to the second input of the comparator circuitry 300. The second input of the comparator circuitry 300 controls the transistor 344. When enabled, the transistor 344 supplies a current from the supply terminal to the transistor 348 and the capacitor 356. When disabled, the transistor 344 prevents the supply of current from the supply terminal to the transistor 348 and the capacitor 356.

The transistor 348 has a first terminal coupled to the transistors 340, 344, 364 and the capacitor 356, a second terminal coupled to the transistors 304, 308, 312, 324, 332, and a control terminal coupled to the transistors 336, 340 and the capacitor 352. The transistor 336 and the capacitor 356 control the transistor 348. When enabled, the transistor 348 supplies current to the transistor 312. When disabled, the transistor 348 prevents the transistor 344 and the capacitor 356 from supplying current to the transistor 312.

The capacitor 352 has a first terminal coupled to the transistors 336, 340, 348, 372, a second terminal coupled to the common potential, and a third input that may be coupled to the trim circuitry 130. The trim circuitry 130 controls the capacitance of the capacitor 352 using a trim code. Adjusting the trim code of the capacitor 352 adjusts the capacitance of the capacitor 352. In example operations, the transistor 336 charges the capacitor 352 using the supply terminal. In such example operations, the capacitor 352 uses stored charges to keep the transistors 348, 372 enabled. Such a delay between disabling the transistor 336 and the transistors 348, 372 being disabled is configurable by the capacitance of the capacitor 352. When adjusting the capacitance of the capacitor 352, the trim circuitry 130 adjusts the amount of charge stored, which modifies the delay. Advantageously, adjusting the capacitance of the capacitor 352 allows the trim circuitry 130 to increase or decrease a delay in controlling the transistor 372, which generates the edges of the comparison output signal.

The capacitor 356 has a first terminal coupled to the transistors 340, 344, 348, 364 and that may be coupled to the trim circuitry 130, a second terminal coupled to the common potential, and a third input that may be coupled to the trim circuitry 130. The trim circuitry 130 controls the capacitance of the capacitor 356 using a trim code. Adjusting the trim code of the capacitor 356 adjusts the capacitance of the capacitor 356. In example operations, the transistor 344 charges the capacitor 356 using the supply terminal. In such example operations, the capacitor 356 uses stored charges to keep the transistors 340, 364 enabled. Such a delay between disabling the transistor 344 and the transistors 340, 364 being disabled is configurable by the capacitance of the capacitor 356. When adjusting the capacitance of the capacitor 356, the trim circuitry 130 adjusts the amount of charge stored, which modifies the delay. Advantageously, adjusting the capacitance of the capacitor 356 allows the trim circuitry 130 to increase or decrease a delay in controlling the transistor 364, which generates the edges of the comparison output signal.

The transistor 360 has a first terminal coupled to the supply terminal, a second terminal coupled to the transistor 364, and a control terminal that may be coupled to the trim circuitry 130. The trim circuitry 130 controls the transconductance of the transistor 360 by adjusting the voltage at the control terminal. Adjusting the trim code of the transistor 360 adjusts the supply of current from the supply terminal to the transistor 364. In example operations, the trim circuitry 130 uses the trim code of the transistor 360 to control a rate at which the transistor 364 is capable of setting the comparison output signal. Such control may delay generation of edges on the comparison output signal. Advantageously, adjusting the transconductance of the transistor 360 allows the trim circuitry 130 to increase or decrease a delay at the comparison output.

The transistor 364 has a first terminal coupled to the thirteenth transistor 360, a second terminal coupled to the transistors 372, 376 and that may be coupled to another instance of one of the stage circuitries 225, 240, 255, and a control terminal coupled to the transistors 340, 344, 348 and the capacitor 356. The transistor 364 is controlled by the transistor 344 and the capacitor 356. When enabled, the transistor 364 may generate a rising edge on the comparison output signal. When disabled, the transistor 364 may generate a falling edge on the comparison output signal.

The transistor 368 has a first terminal coupled to the supply terminal, a second terminal coupled to the transistor 372, and a control terminal that may be coupled to the trim circuitry 130. The trim circuitry 130 controls the transconductance of the transistor 368 by adjusting the voltage at the control terminal. Adjusting the trim code of the transistor 368 adjusts the supply of current from the supply terminal to the transistor 364. In example operations, the trim circuitry 130 uses the trim code of the transistor 368 to control a rate at which the transistor 372 is capable of setting the comparison output signal. Such control may delay generation of edges on the comparison output signal. Advantageously, adjusting the transconductance of the transistor 368 allows the trim circuitry 130 to increase or decrease a delay at the comparison output.

The transistor 372 has a first terminal coupled to the transistor 368, a second terminal coupled to the transistors 364, 376 and that may be coupled to another instance of one of the stage circuitries 225, 240, 255, and a control terminal coupled to the transistors 336, 340, 348 and the capacitor 352. The transistor 372 is controlled by the transistor 336 and the capacitor 352. When enabled, the transistor 372 may generate a rising edge on the comparison output signal. When disabled, the transistor 372 may generate a falling edge on the comparison output signal.

The transistor 376 has a first terminal coupled to the transistors 364, 372 and that may be coupled to another instance of one of the stage circuitries 225, 240, 255, a second terminal coupled to the common terminal, and a control terminal coupled to an example reference clock 380. The reference clock 380 controls the transistor 376. The reference clock 380 is a clock signal that represents the rate at which the V-D circuitry 110 is sampling the analog input. In some examples, the reference clock 380 is coupled to one or more additional components of the ADC circuitry 100 of FIG. 1. When enabled, the transistor 376 supplies current to a common potential. When disabled, the transistor 376 prevents the transistors 364, 372 from supplying current to the common potential.

In the example of FIG. 3, the transistors 304, 308, 320, 324, 336, 344, 360, 364, 368, 372 are p-channel metal-oxide semiconductor field-effect transistors (MOSFETs). Alternatively, the transistors 304, 308, 320, 324, 336, 344, 360, 364, 368, 372 may be p-channel field-effect transistors (FETs), p-channel insulated-gate bipolar transistors (IGBTs), p-channel junction field effect transistors (JFETs), PNP bipolar junction transistors (BJTs) and/or, with slight modifications, n-type equivalent devices. In the example of FIG. 3, the transistors 312, 316, 328, 332, 340, 348, 376 are n-channel MOSFETs. Alternatively, the transistors 312, 316, 328, 332, 340, 348, 376 may be n-channel FETs, n-channel IGBTs, n-channel JFETs, NPN BJTs, and/or, with slight modifications, p-type equivalent devices. The transistors 304, 308, 312, 316, 320, 324, 328, 332, 336, 340, 344, 348, 360, 364, 368, 372, 376 may be depletion mode devices, drain-extended devices, enhancement mode devices, natural transistors or other type of device structure transistors.

Furthermore, the transistors 304, 308, 312, 316, 320, 324, 328, 332, 336, 340, 344, 348, 360, 364, 368, 372, 376 may be implemented in/over a silicon substrate (Si), a silicon carbide substrate (SiC), a gallium nitride substrate (GaN) or a gallium arsenide substrate (GaAs).

Figure 4:
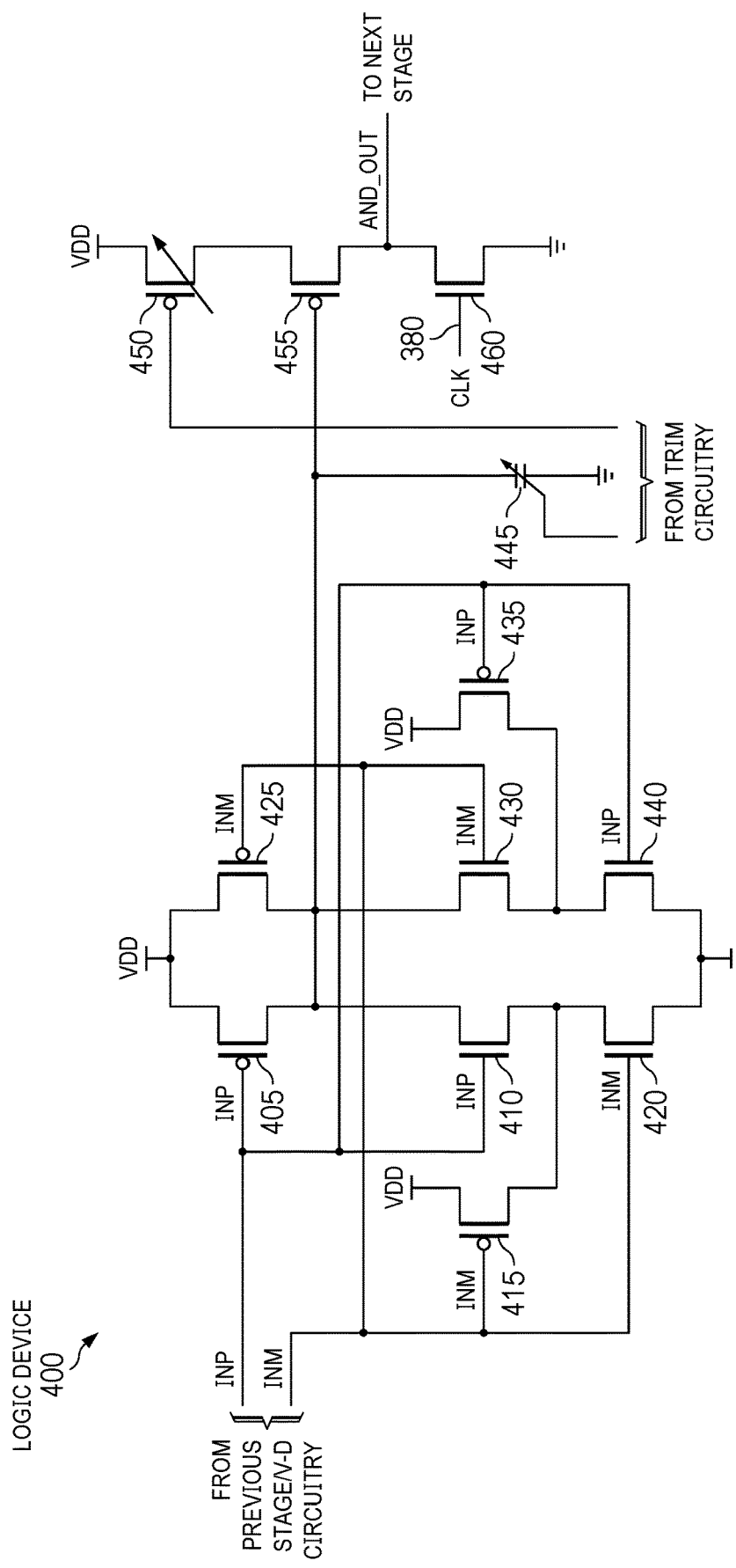
FIG. 4 is a schematic diagram of an example of the logic device of FIG. 2 including circuitry to trim timing of a threshold of the logic device.

FIG. 4 is a schematic diagram of an example logic device 400, which is an example of the logic devices 235, 250 of FIG. 2. The logic device 400 has a first input (INP) and a second input (INM) that may be coupled to one of the variable delay circuitry 205, such as the logic device 235, or previous stage circuitry, such as the logic device 250. The logic device 400 has additional trim inputs that may be coupled to the trim circuitry 130 of FIG. 1. The logic device 400 has an output that may be coupled to another one of the stage circuitries 225, 240. In the example of FIG. 4, the logic device 400 includes a first example transistor 405, a second example transistor 410, a third example transistor 415, a fourth example transistor 420, a fifth example transistor 425, a sixth example transistor 430, a seventh example transistor 435, an eighth example transistor 440, an example capacitor 445, a ninth example transistor 450, a tenth example transistor 455, and an eleventh example transistor 460.

The transistor 405 has a first terminal coupled to a supply terminal, which supplies a supply voltage (VDD), a second terminal coupled to the transistors 410, 425, 430, 455 and the capacitor 445, and a control terminal coupled to the first input of the logic device 400. The first input of the logic device 400 controls the transistor 405. When enabled, the transistor 405 supplies a current from the supply terminal to the transistors 410, 430 and the capacitor 445. When disabled, the transistor 405 prevents the supply of current from the supply terminal to the transistors 410, 430 and the capacitor 445.

The transistor 410 has a first terminal coupled to the transistors 405, 425, 430, 455 and the capacitor 445, a second terminal coupled to the transistors 415, 420, and a control terminal coupled to the first input of the logic device 400. The first input of the logic device 400 controls the transistor 410. When enabled, the transistor 410 supplies current to the transistor 420. When disabled, the transistor 410 prevents the transistors 405, 425 and the capacitor 445 from supplying current to the transistor 420.

The transistor 415 has a first terminal coupled to the supply terminal, a second terminal coupled to the transistors 410, 420, and a control terminal coupled to the second input of the logic device 400. The second input of the logic device 400 controls the transistor 415. When enabled, the transistor 415 supplies current from the supply terminal to the transistor 420. When disabled, the transistor 415 prevents the transistor 420 from sourcing current from the supply terminal.

The transistor 420 has a first terminal coupled to the transistors 410, 415, a second terminal coupled to a common terminal, which supplies a common potential (e.g., ground), and a control terminal coupled to the second input of the logic device 400. The second input of the logic device 400 controls the transistor 420. When enabled, the transistor 420 allows the transistors 410, 415 to supply current to the common potential. When disabled, the transistor 420 prevents the transistors 410, 415 from supplying current to the common potential.

The transistor 425 has a first terminal coupled to the supply terminal, a second terminal coupled to the transistors 405, 410, 430, 455 and the capacitor 445, and a control terminal coupled to the second input of the logic device 400. The second input of the logic device 400 controls the transistor 425. When enabled, the transistor 425 supplies a current from the supply terminal to the transistors 410, 430 and the capacitor 445. When disabled, the transistor 425 prevents the supply of current from the supply terminal to the transistors 410, 430 and the capacitor 445.

The transistor 430 has a first terminal coupled to the transistors 405, 410, 425, 455 and the capacitor 445, a second terminal coupled to the transistors 435, 440, and a control terminal coupled to the second input of the logic device 400. The second input of the logic device 400 controls the transistor 430. When enabled, the transistor 430 supplies current to the transistor 440. When disabled, the transistor 430 prevents the transistors 405, 425 and the capacitor 445 from supplying current to the transistor 440.

The transistor 435 has a first terminal coupled to the supply terminal, a second terminal coupled to the transistors 430, 440, and a control terminal coupled to the first input of the logic device 400. The first input of the logic device 400 controls the transistor 435. When enabled, the transistor 435 supplies current from the supply terminal to the transistor 440. When disabled, the transistor 435 prevents the transistor 440 from sourcing current from the supply terminal.

The transistor 440 has a first terminal coupled to transistors 430, 435, the second terminal coupled to the common potential, and a control terminal coupled to the first input of the logic device 400. The first input of the logic device 400 controls the transistor 440. When enabled, the transistor 440 allows the transistors 430, 435 to supply current to the common potential. When disabled, the transistor 440 prevents the transistors 430, 435 from supplying current to the common potential.

The capacitor 445 has a first terminal coupled to the transistors 405, 410, 425, 430, 455, a second terminal coupled to the common potential, and a third terminal that may be coupled to the trim circuitry 130. The trim circuitry 130 controls the capacitance of the capacitor 445 using a trim code. Adjusting the trim code of the capacitor 445 adjusts the capacitance of the capacitor 445. In example operations, the transistors 405, 410 charge the capacitor 445 using the supply terminal. In such example operations, the capacitor 445 uses the ability to store charge to delay control of the transistor 455. The delay in control of the transistor 455 is configurable by the capacitance of the capacitor 445. When adjusting the capacitance of the capacitor 445, the trim circuitry 130 adjusts the amount of charge being stored, which modifies the delay. Advantageously, adjusting the capacitance of the capacitor 445 allows the trim circuitry 130 to increase or decrease a delay in controlling the transistor 455, which generates the edges of the logically combined signal.

The transistor 450 has a first terminal coupled to the supply terminal, a second terminal coupled to the transistor 455, and a control terminal that may be coupled to the trim circuitry 130. The trim circuitry 130 controls the transconductance of the transistor 450 by adjusting the voltage at the control terminal. Adjusting the trim code of the transistor 450 adjusts the supply of current from the supply terminal to the transistor 455. In example operations, the trim circuitry 130 uses the trim code of the transistor 450 to control a rate at which the transistor 455 is capable of setting the logically combined output signal. Such control may delay generation of edges on the logically combined output signal. Advantageously, adjusting the transconductance of the transistor 450 allows the trim circuitry 130 to increase or decrease a delay at the logic output.

The transistor 455 has a first terminal coupled to the transistor 450, a second terminal coupled to the transistor 460 and that may be coupled to another instance of one of the stage circuitries 225, 240, 255, and a control terminal coupled to the transistors 405, 410, 425, 430 and the capacitor 445. The transistors 405, 425 and the capacitor 445 control the transistor 455. When enabled, the transistor 455 generates a rising edge on the logically combined output. When disabled, the transistor 455 generates a falling edge on the logically combined output.

The transistor 460 has a first terminal coupled to the transistor 455 and that may be coupled to another instance of one of the stage circuitries 225, 240, 255, a second terminal coupled to the common potential, and a control terminal coupled to the reference clock 380 of FIG. 3. The reference clock 380 controls the transistor 460. When enabled, the transistor 460 supplies current to a common potential. When disabled, the transistor 460 prevents the transistor 455 from supplying current to the common potential.

In the example of FIG. 4, the transistors 405, 415, 425, 435, 450, 455 are p-channel MOSFETs. Alternatively, the transistors 405, 415, 425, 435, 450, 455 may be p-channel FETs, p-channel IGBTs, p-channel JFETs, PNP BJTs and/or, with slight modifications, n-type equivalent devices. In the example of FIG. 4, the transistors 415, 420, 430, 440, 460 are n-channel MOSFETs. Alternatively, the transistors 415, 420, 430, 440, 460 may be n-channel FETs, n-channel IGBTs, n-channel JFETs, NPN BJTs, and/or, with slight modifications, p-type equivalent devices. The transistors 405, 410, 415, 420, 425, 430, 435, 440, 450, 455, 460 may be depletion mode devices, drain-extended devices, enhancement mode devices, natural transistors or other type of device structure transistors. Furthermore, the transistors 405, 410, 415, 420, 425, 430, 435, 440, 450, 455, 460 may be implemented in/over a silicon substrate (Si), a silicon carbide substrate (SiC), a gallium nitride substrate (GaN) or a gallium arsenide substrate (GaAs).

Figure 5A:
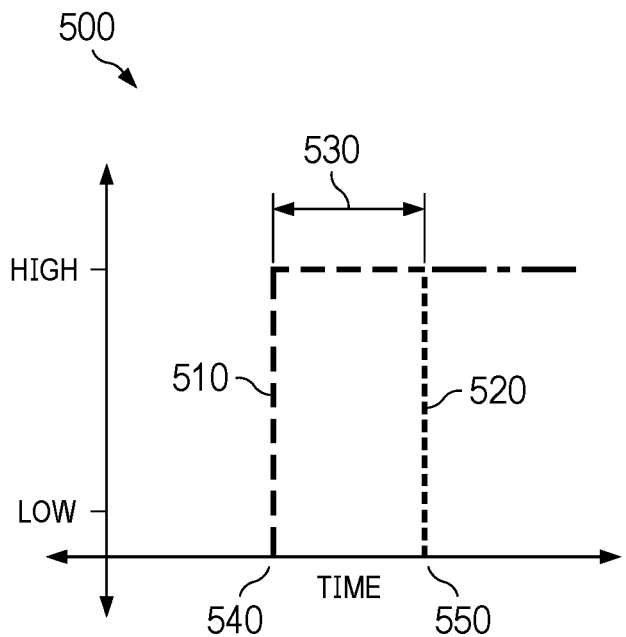
FIG. 5A is a plot of an example operation of the ADC circuitry of FIG. 1 to represent an analog voltage using a delay duration between signals.

FIG. 5A is a plot 500 of an example operation of the V-D circuitry 110, 150 of FIG. 1. In the example of FIG. 5A, the plot 500 illustrates an example plus delay signal 510, an example minus delay signal 520, and an example delay duration 530. The plus and minus delay signals 510, 520 are illustrative examples of the outputs of the V-D circuitry 110, 150 over time. The delay duration 530 illustrates an example delay between edges (e.g., rising edges) of the outputs of the V-D circuitry 110. In example operations, the V-D circuitry 110 generates the delay duration 530 responsive to an analog value of an input of the V-D circuitry 110. In such examples, the delay duration 530 corresponds to a specific analog value of the input of the V-D circuitry 110.

At a first time ($T_1$) 540, the V-D circuitry 110 generates an edge on the plus delay signal 510 by transitioning the logic level (e.g., LOW-to-HIGH, zero-to-one). At a second time ($T_2$) 550, the V-D circuitry 110 generates an edge on the minus delay signal 520 by transitioning the logic level. The difference in time between the times 540, 550 form the delay duration 530. In some other examples, the V-D circuitry 110 generates an edge on the minus delay signal 520 prior to generating an edge on the plus delay signal 510. Advantageously, the delay duration 530 between edges of the delay signals 510, 520 represents an analog value of a voltage at the input of the V-D circuitry 110.

Figure 5B:
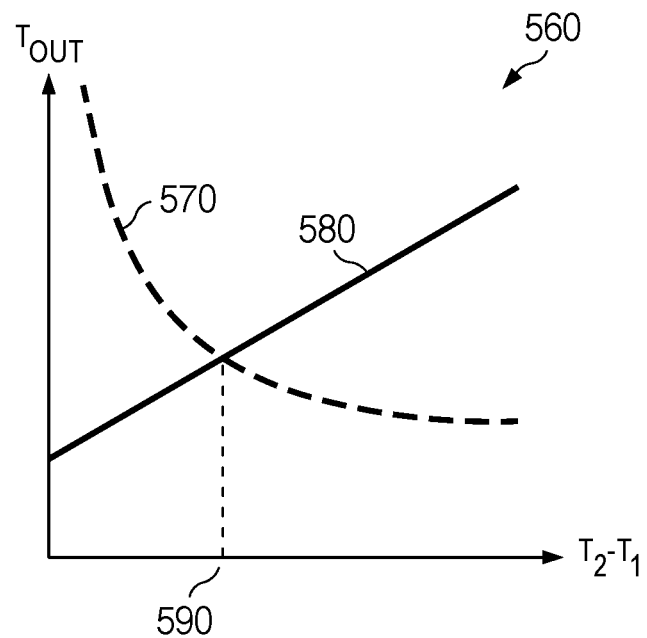
FIG. 5B is a plot of example operations of the stage circuitry of FIG. 2 responsive to a range of delay durations.

FIG. 5B is another plot 560 of example operations of stage circuitry 225, 240 of FIG. 2 and/or more generally the time domain ADC circuitry 220 of FIG. 2. In the example of FIG. 5B, the plot 560 illustrates an example comparison delay output signal 570 and an example logic delay output signal 580. The comparison delay output signal 570 illustrates example timing ($T_{OUT}$) of an edge on the output of the comparator circuitry 230, 245, 260 of FIG. 2 across a range of possible delay durations ($T_2$-$T_1$). The logic delay output signal 580 illustrates example timing ($T_{OUT}$) of an edge on the output of the logic devices 235, 250 of FIG. 2 across a range of possible delay durations ($T_2$-$T_1$). At an example equilibrium delay duration (TEQ) 590, the delay output signals 570, 580 have approximately the same timing of an edge.

In example operations of the stage circuitry 225, the comparator circuitry 230 generates an edge on the first comparison output signal responsive to a delay duration (e.g., the delay duration 530 of FIG. 5A) between the inputs of the comparator circuitry 230. In such example operations of the stage circuitry 225, the logic device 235 generates an edge on the first logically combined signal responsive to the delay duration (e.g., the delay duration 530 of FIG. 5A) between the inputs of the logic device 235. The stage circuitry 225 supplies the first comparison output signal and the first logically combined signal to the stage circuitry 240 as a pair of signals. Similar to the delay signals 510, 520 of FIG. 5A, differences between edges of the first comparison output signal and the first logically combined signal form another delay duration. At the equilibrium delay duration 590, the comparator circuitry 230 and the logic device 235 generate edges at approximately the same time. Advantageously, the equilibrium delay duration 590 represents a threshold between positive and negative delay durations of the first comparison output signal and the first logically combined signal.

Figure 6A:
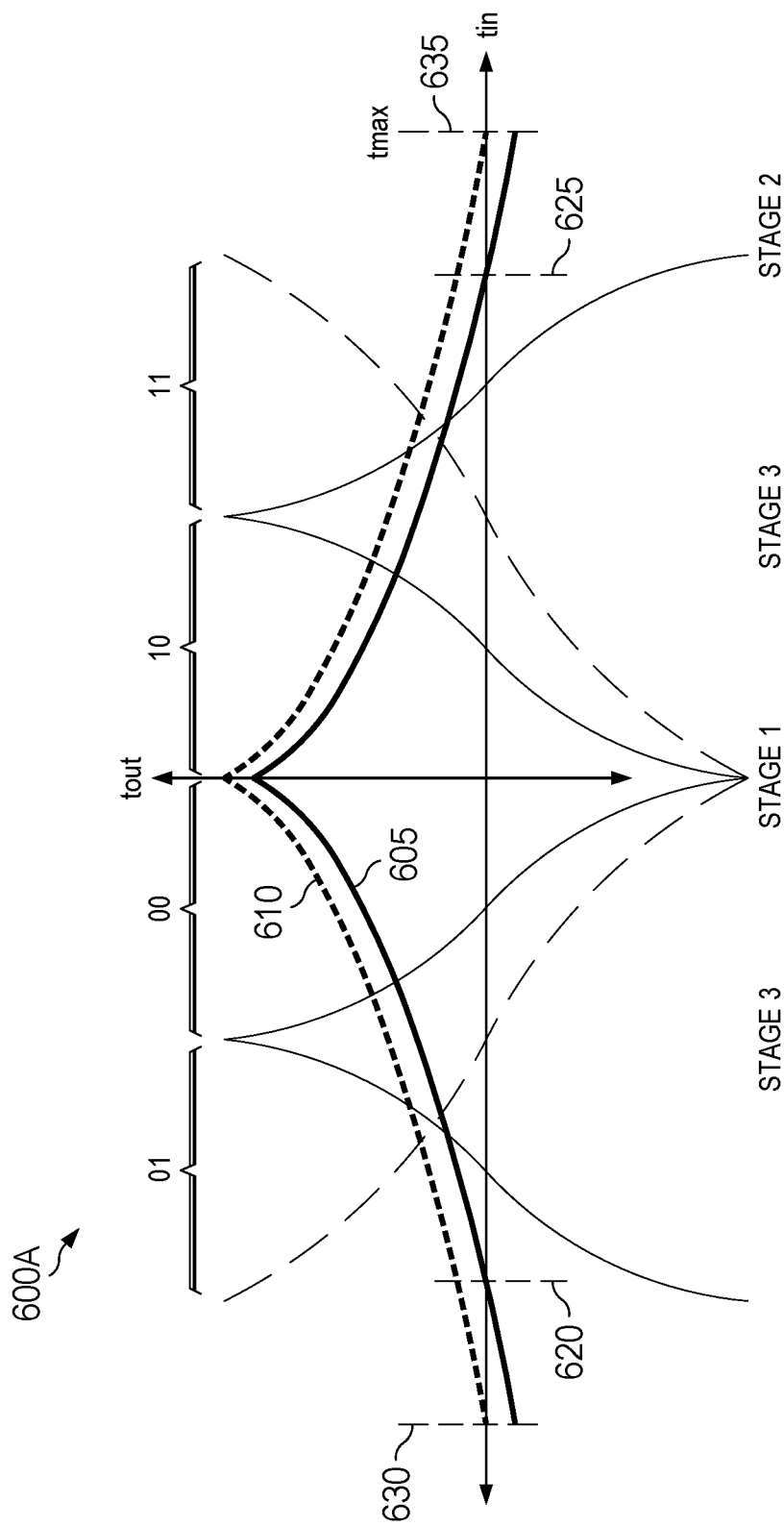
FIGS. 6A, 6B, and 6C are example plots of example trim operations of a first example instance of the stage circuitry of FIG. 2 in the time domain converter circuitry of FIGS. 1 and 2, the example trim operations including an example shift correction, an example mismatch correction, and an example offset correction.

FIG. 6A is a plot 600A of example operations of the stage circuitry 225 of FIG. 2. In the example of FIG. 6A, the plot 600A illustrates a first example delay profile 605 and an example target delay profile 610. The delay profiles 605, 610 represent example output timings ($T_{OUT}$) of delay durations between the first comparison output signal and the first logically combined signal across a range of possible delay durations ($T_2$-$T_1$) between the plus and minus delay signals 510, 520 of FIG. 5A.

The delay profile 605 represents first example operations of the comparator circuitry 230 of FIG. 2 and the logic device 235 of FIG. 2. The delay profile 605 has a first zero-crossing at approximately a first example delay duration 620 and a second zero-crossing at approximately a third example delay duration 625. In example operations, the stage circuitry 225 generates the MSB of the digital output of the time domain converter circuitry 120 of FIGS. 1 and 2. In such example operations, the delay durations between the zero-crossings at the delay durations 620, 625 form a range of the time domain converter circuitry 120.

In some examples, where the V-D circuitry 110 is capable of generating delay durations between a third example delay duration 630 and a fourth example delay duration 635, the delay profile 605 fails to include all possible delay durations of the V-D circuitry 110. In such examples, the time domain converter circuitry 120 inaccurately converts delay durations between the delay durations 620, 630 and between the delay durations 625, 635 to digital outputs.

The target delay profile 610 represents example target operations of the comparator circuitry 230 and the logic device 235. The delay profile 610 has a first zero-crossing at approximately the delay duration 630 and a second zero-crossing at approximately the delay duration 635. The delay durations between the zero-crossings at the delay durations 630, 635 form a range of the time domain converter circuitry 120. The target operations of the target delay profile 610 occur responsive to calibrating the time domain converter circuitry 120 to have a minimum delay duration ($-T_{MAX}$)

and a maximum delay duration ($T_{MAX}$). The minimum and maximum delay durations of the target delay profile 610 form a range of delay durations that is approximately equal to the range of the V-D circuitry 110. For example, the delay durations between zero-crossings of the target delay profile 610 include all possible delay durations that the V-D circuitry 110 is capable of producing.

In example operations, the trim circuitry 130 of FIG. 1 performs example trim operations, which are further described in connection with FIGS. 11, 12A, 12B, below, to detect the zero-crossing thresholds of the stage circuitry 225. In such example operations, the trim circuitry 130 modifies trim codes of the delay circuitry 210, 215, the comparator circuitry 230, and/or the logic device 235 to adjust the zero-crossing thresholds. For example, the trim circuitry 130 may increase the trim values of the capacitors 352, 356, 445 of FIGS. 3 and 4 to adjust delays of the comparator circuitry 230 and the logic device 235. In such an example, the trim circuitry 130 continues to adjust the delays of the comparator circuitry 230 and logic device 235 until one or both of the zero-crossing thresholds occur at the delay durations 630, 635. Advantageously, the trim circuitry 130 may adjust the zero-crossing thresholds of the stage circuitry 225 responsive to modifying the trim codes of the capacitors 352, 356, 445 of the comparator circuitry 230 and the logic device 235.

Figure 6B:
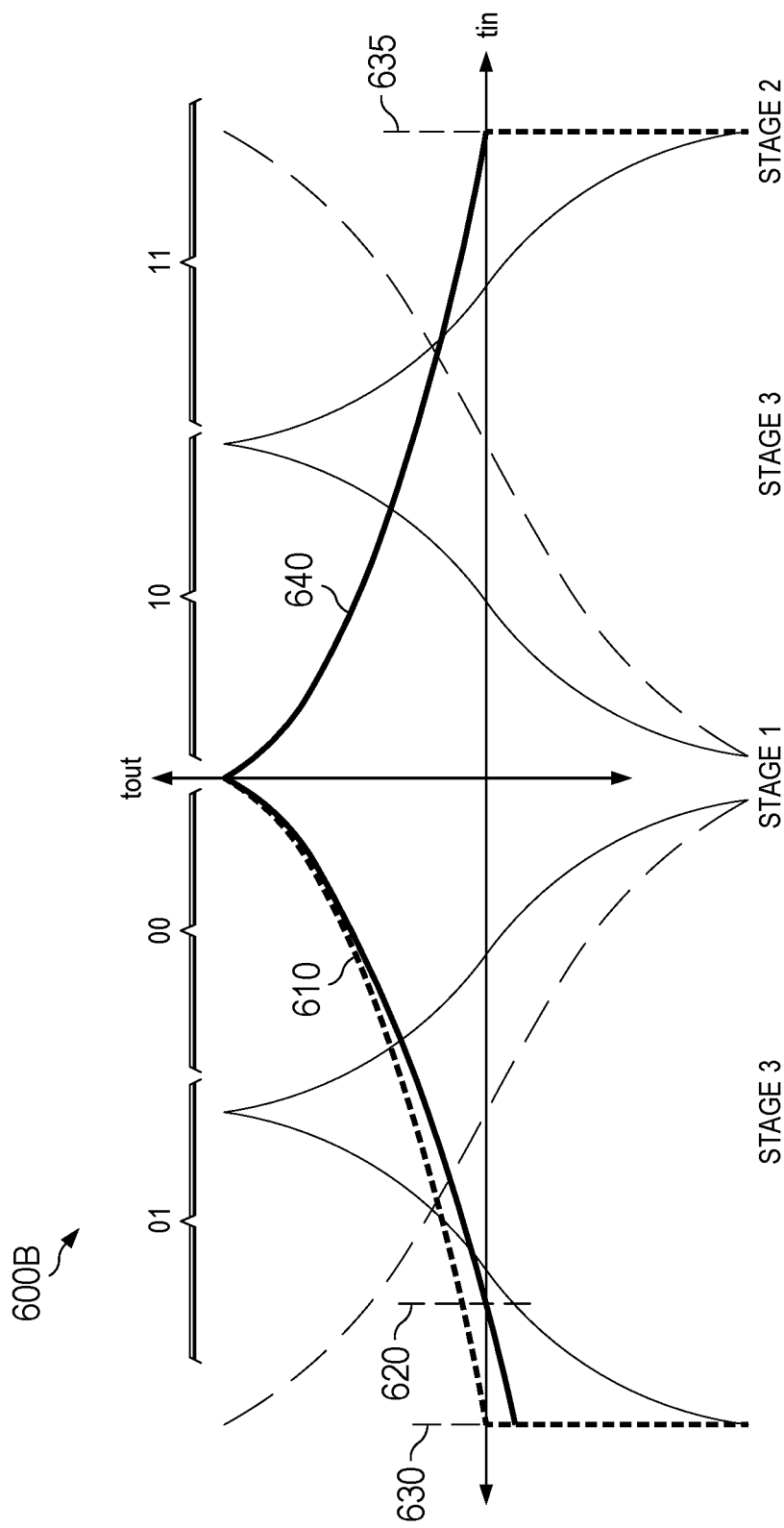

FIG. 6B is a plot 600B of example operations of the stage circuitry 225 of FIG. 2. In the example of FIG. 6B, the plot 600B illustrates the target delay profile 610 of FIG. 6A and a second example delay profile 640. The delay profiles 610, 640 represent example output timings of delay durations between the first comparison output signal and the first logically combined signal across a range of possible delay durations between the plus and minus delay signals 510, 520 of FIG. 5A.

The delay profile 640 represents second example operations of the comparator circuitry 230 of FIG. 2 and the logic device 235 of FIG. 2. The delay profile 640 has a first zero-crossing at approximately the delay duration 620 and a second zero-crossing at approximately the delay duration 635. The delay durations between the zero-crossings at the delay durations 620, 635 form a range of the time domain converter circuitry 120. Unlike the zero-crossing thresholds of the delay profile 605 of FIG. 6A, the second zero-crossing of the delay profile 640 accurately reflects the maximum delay duration of the time domain converter circuitry 120 of FIG. 1. However, the first zero-crossing threshold of the delay profile 640 fails to accurately reflect the minimum delay duration of the time domain converter circuitry 120.

In example operations, the trim circuitry 130 of FIG. 1 performs example trim operations, which are further described in connection with FIGS. 11, 12A, 12B, below, to detect the zero-crossing thresholds of the stage circuitry 225. The trim circuitry 130 may determine the first zero-crossing threshold inaccurately represents the minimum delay duration of the target range and the second zero-crossing threshold accurately represents the maximum delay duration of the target range. In such examples, the trim circuitry 130 modifies trim codes of the comparator circuitry 230 and/or the logic device 235 to adjust the first zero-crossing threshold. For example, the trim circuitry 130 may increase the trim values of the capacitors 352, 445 of FIGS. 3 and 4 and/or the transistor 360 to adjust delays of the comparator circuitry 230 and the logic device 235. In such an example, the trim circuitry 130 continues to adjust the delays of the comparator circuitry 230 and/or logic device 235 until both of the zero-crossing thresholds occur at the delay durations 630, 635. Advantageously, the trim circuitry 130 may adjust one of the zero-crossing thresholds of the stage circuitry 225 responsive to modifying the trim code of the capacitor 352 without modifying the trim code of the capacitor 356.

Figure 6C:
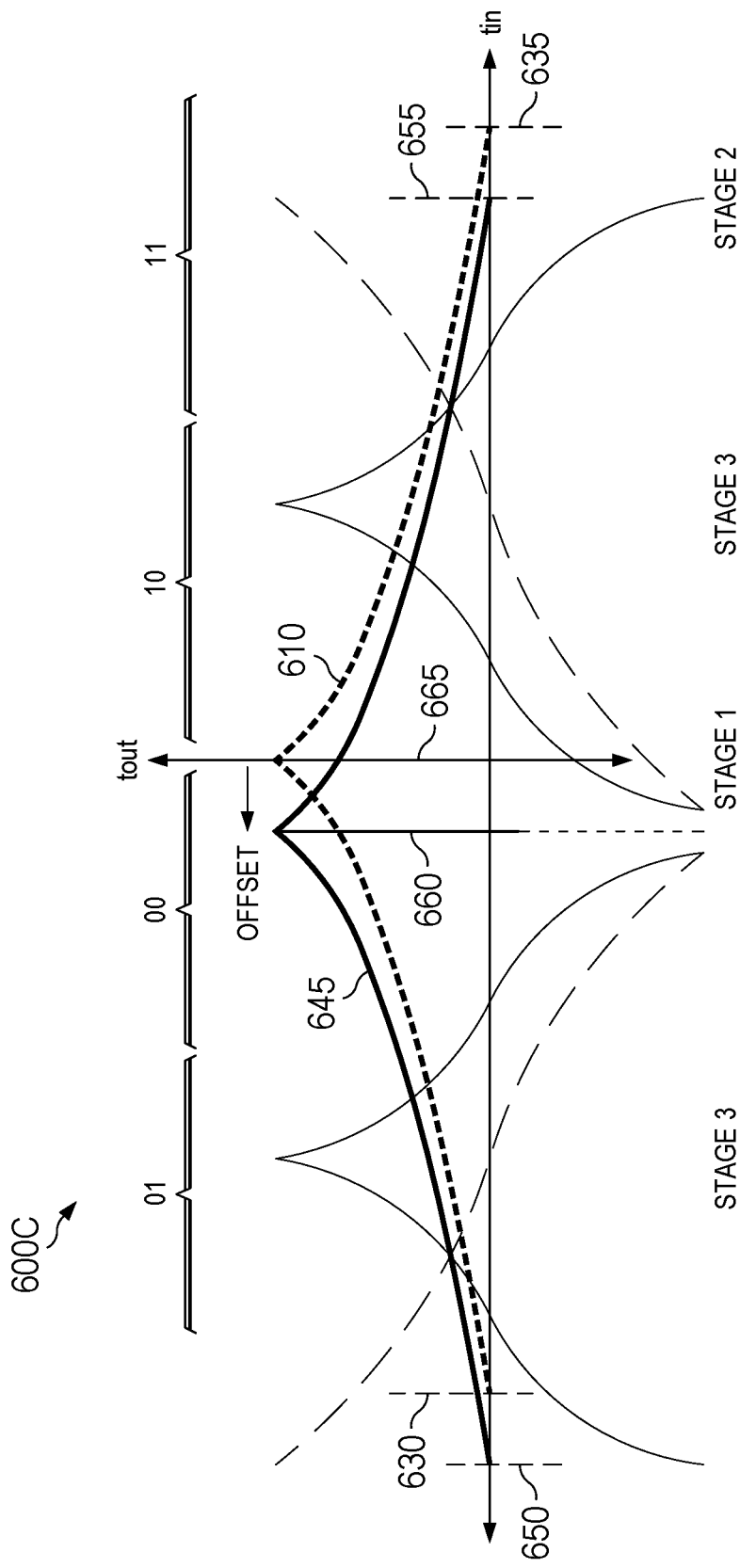

FIG. 6C is a plot 600C of example operations of the stage circuitry 225 of FIG. 2. In the example of FIG. 6C, the plot 600C illustrates the target delay profile 610 of FIGS. 6A and 6B and a third example delay profile 645. The delay profiles 610, 645 represent example output timings of delay durations between the first comparison output signal and the first logically combined signal across a range of possible delay durations between the plus and minus delay signals 510, 520 of FIG. 5A.

The delay profile 645 represents third example operations of the comparator circuitry 230 of FIG. 2 and the logic device 235 of FIG. 2. The delay profile 645 has a first zero-crossing at approximately a fifth example delay duration 650 and a second zero-crossing at approximately a sixth example delay duration 655. The delay durations between the zero-crossings at the delay durations 650, 655 form a range of the time domain converter circuitry 120. Unlike the zero-crossing thresholds of the delay profiles 605, 640 of FIGS. 6A and/or 6B, both of the zero-crossings of the delay profile 645 inaccurately reflect the maximum and minimum delay durations of the target range of the time domain converter circuitry 120 of FIG. 1. However, the range of the delay profile 645 spans a range of delay durations which is approximately equal to span of the target range of the time domain converter circuitry 120.

The delay profile 645 further has a delay duration threshold 660 which represents the edges of the delay signals 510, 520 occur at approximately the same time. For example, the delay duration threshold 660 corresponds to the equilibrium delay duration 590 of FIG. 5B for the inputs of the stage circuitry 225. In example operations, the comparator circuitry 230 sets the sign bit to a first value responsive to receiving a delay duration greater than the delay duration threshold 660. In such example operations, the comparator circuitry 230 sets the sign bit to a second value responsive to receiving a delay duration less than the delay duration threshold 660. The target delay profile 610 has an example target delay duration threshold 665, which is approximately halfway between the delay durations 630, 635.

In example operations, the trim circuitry 130 of FIG. 1 performs example trim operations, which are further described in connection with FIGS. 11, 12A, 12B, below, to detect the delay duration threshold of the stage circuitry 225. The trim circuitry 130 may determine the delay duration threshold 660 of the stage circuitry 225 inaccurately represents the target delay duration threshold 665 responsive to comparing the output of the reference comparator circuitry 160 of FIG. 1 to the MSB of the digital output value. In such examples, the trim circuitry 130 modifies trim codes of the delay circuitry 210, 215 of FIG. 2 to adjust the delay duration threshold 660. For example, the trim circuitry 130 may increase the trim values of the delay circuitry 210, 215 to adjust delays of the delay circuitry 210, 215. In such an example, the trim circuitry 130 continues to adjust the delays of the delay circuitry 210, 215 until the delay duration threshold 660 is approximately equal to the target delay duration threshold 665. Advantageously, the trim circuitry 130 may offset the delay profile 645 by adjusting the delays of the delay circuitry 210, 215.

Figure 7:
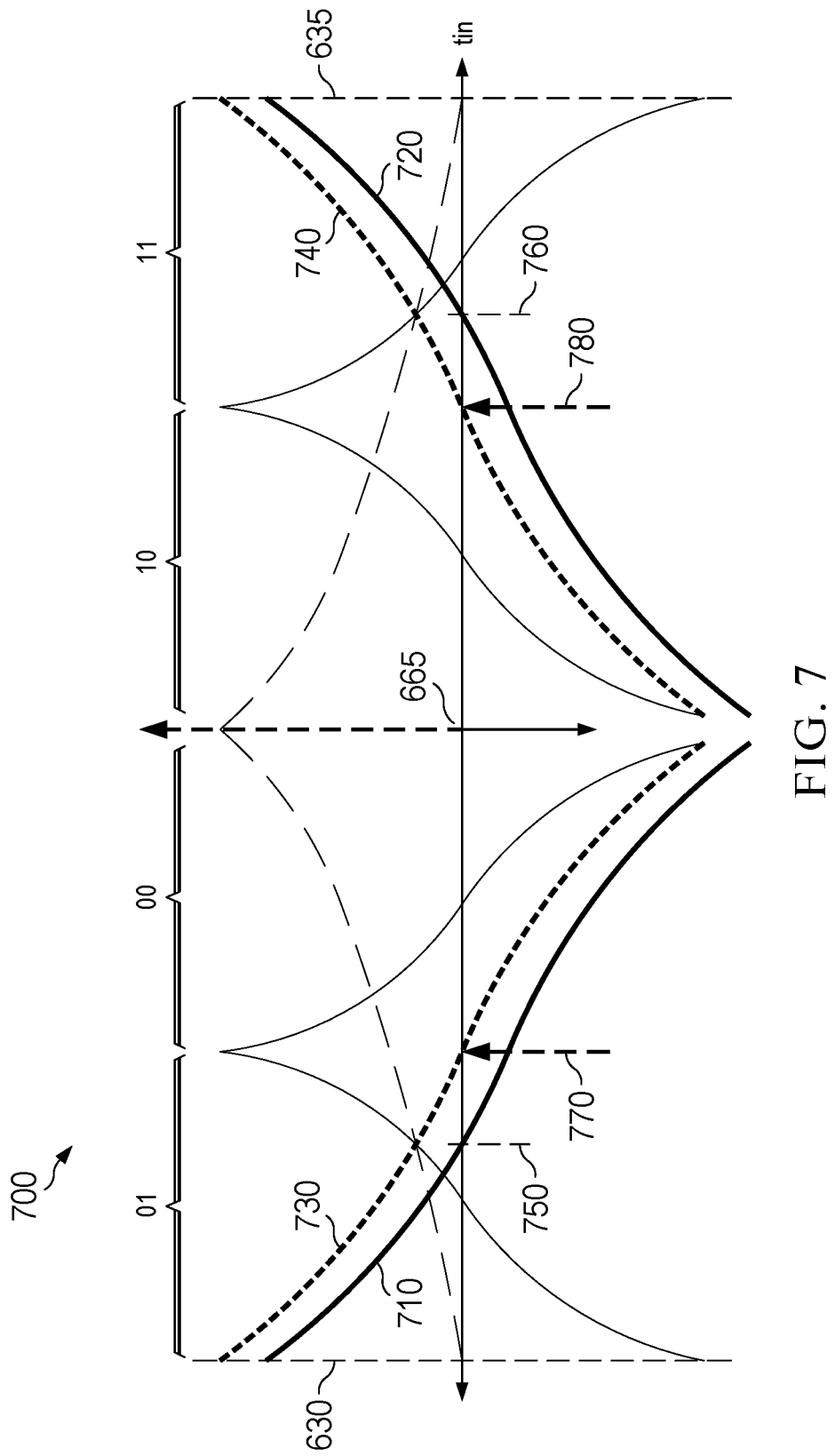
FIG. 7 is an example plot of an example trim operation of a second example instance of the stage circuitry of FIG. 2 in the time domain converter circuitry of FIGS. 1 and 2, the example trim operation being an example shift correction.

FIG. 7 is a plot 700 of example operations of the stage circuitry 240 of FIG. 2. In the example of FIG. 7, the plot 700 illustrates a first example delay profile 710, a second example delay profile 720, a first example target delay profile 730, and a second example target delay profile 740. The delay profiles 710, 720, 730, 740 represent example output timings ($T_{OUT}$) of delay durations between the second comparison output signal and the second logically combined signal across a range of possible delay durations ($T_2$-$T_1$) between the first comparison output signal and the first logically combined signal from the stage circuitry 225 of FIG. 2.

The delay profiles 710, 720 represent example operations of the comparator circuitry 245 of FIG. 2 and the logic device 250 of FIG. 2. The delay profile 710 has a zero-crossing at approximately a first example delay duration 750 and the delay profile 720 has a zero-crossing at approximately a second example delay duration 760. Unlike the delay profiles 605, 610, 640, 645 of FIGS. 6A, 6B, and/or 6C, the delay profiles 710, 720 each only have a single zero-crossing threshold and span approximately half of the range of the time domain converter circuitry 120. For example, the delay profile 710 has a range from the minimum delay duration (e.g., the delay duration 630 of FIGS. 6A, 6B, and 6C) to a delay duration of approximately zero (e.g., the equilibrium delay duration 590 of FIG. 5B or the target delay duration threshold 665 of FIG. 6C). In such examples, the delay profile 720 has a range from the delay duration of approximately zero to the maximum delay duration (e.g., the delay duration 635 of FIGS. 6A, 6B, 6C).

The target delay profiles 730, 740 represent example target operations of the comparator circuitry 245 and the logic device 250. The delay profile 730 has a zero-crossing at approximately a third example delay duration 770 and the delay profile 740 has a zero-crossing at approximately a fourth example delay duration 780. The target operations of the target delay profiles 730, 740 occur responsive to calibrating the time domain converter circuitry 120. When calibrated, the delay duration 770 is approximately equal to the minimum $$\left(\frac{-T_{MAX}}{2}\right)$$

and the delay duration 780 is approximately equal to the maximum delay duration divided by two $$\left(\frac{T_{MAX}}{2}\right).$$

In example operations, the trim circuitry 130 of FIG. 1 performs example trim operations, which are further described in connection with FIGS. 11, 12A, 12B, below, to detect the zero-crossing thresholds of the stage circuitry 240. The trim circuitry 130 may determine the accuracy of the zero-crossing thresholds of the stage circuitry 240 by comparing the output of the reference comparator circuitry 160 of FIG. 1 to the second sign bit output of the stage circuitry 240. Similar to correcting the offset between the delay duration threshold 660 and the target delay duration threshold 665, the trim circuitry 130 adjusts delays of the input signals. In the example of FIG. 6C, the trim circuitry 130 adjusts the delays of the delay circuitry 210, 215 to decrease the offset between the delay duration thresholds 660, 665. However, when prior stage circuitry, such as the stage circuitry 225, is available, the trim circuitry 130 may modify the delays of the prior stage circuitry to decrease offset. For example, when correcting the difference between the delay durations 750, 770, the trim circuitry 130 adjusts the trim values of circuitry of the stage circuitry 225, which supplies the first comparison output signal and the first logically combined signal to the stage circuitry 240. Advantageously, the trim circuitry 130 may account for offset errors by adjusting delays of prior stage circuitry. For example, adjusting the delays of the stage circuitry 225 to account for the offset between the delay profiles 710, 720 and the target delay profiles 730, 740.

Figure 8A:
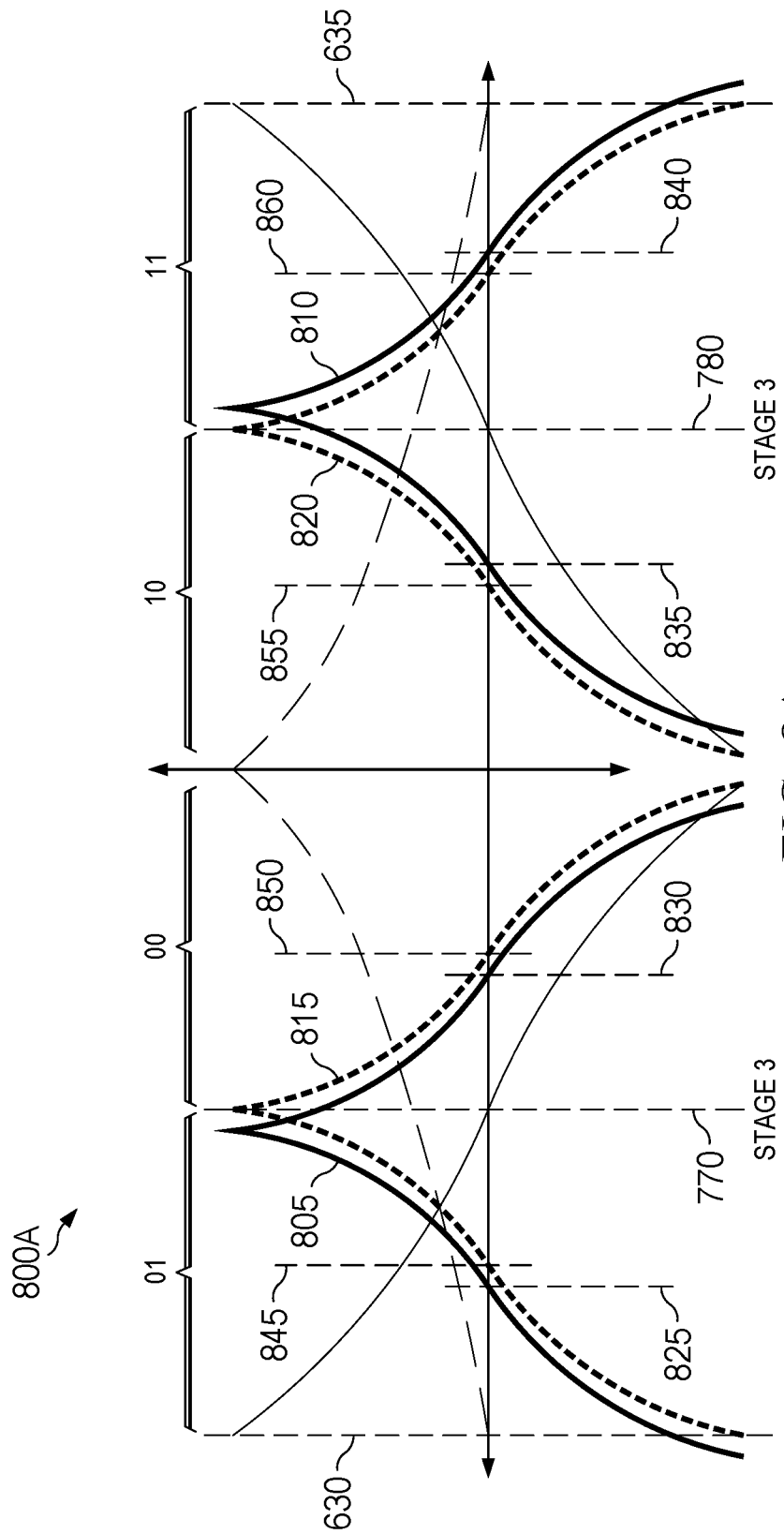
FIGS. 8A and 8B are example plots of example trim operations of a third example instance of the stage circuitry of FIG. 2 in the time domain converter circuitry of FIGS. 1 and 2, the trim operations including an example mismatch correction and an example shift correction.

FIG. 8A is a plot 800A of example operations of another instance of one of the stage circuitry 225, 240 of FIG. 2 coupled in series with the stage circuitry 240. Such another instance of the circuitry 225, 240 receives the second comparison output signal and the second logically combined signal from the stage circuitry 240 and generates a third comparison output signal and a third logically combined signal. In the example of FIG. 8A, the plot 800A illustrates a first example delay profile 805, a second example delay profile 810, a first example target delay profile 815, and a second example target delay profile 820. The delay profiles 805, 810, 815, 820 represent example output timings ($T_{OUT}$) of delay durations between the third comparison output signal and the third logically combined signal across a range of possible delay durations ($T_2$-$T_1$) between the second comparison output signal and the second logically combined signal from the stage circuitry 240.

The delay profiles 805, 810 represent example operations of the another instance of one of the stage circuitry 225, 240. Similar to the span of the delay profiles 710, 720 of FIG. 7, the delay profiles 805, 810 span approximately half of the range of the time domain converter circuitry 120. For example, the delay profile 805 has a range from the minimum delay duration (e.g., the delay duration 630 of FIGS. 6A, 6B, and 6C) to a delay duration of approximately zero (e.g., the equilibrium delay duration 590 of FIG. 5B or the target delay duration threshold 665 of FIG. 6C). In such examples, the delay profile 810 has a range from the delay duration of approximately zero to the maximum delay duration (e.g., the delay duration 635 of FIGS. 6A, 6B, 6C).

Unlike the delay profiles 710, 720, the delay profiles 805, 810 each have two zero-crossing thresholds. The delay profile 805 has a first zero-crossing at approximately a first example delay duration 825 and a second zero-crossing at approximately a second example delay duration 830. The delay profile 810 has a first zero-crossing at approximately a third example delay duration 835 and a second zero-crossing at approximately a fourth example delay duration 840. The zero-crossing thresholds at the delay durations 825, 840 correspond to minus side components of comparator circuitry. For example, the capacitance of the capacitor 352 of FIG. 3 and the transconductance of the transistor 368 of FIG. 3 determine the timing of the delay durations 825, 840. Also, the zero-crossing thresholds at the delay durations 830, 835 correspond to plus side components of comparator circuitry. For example, the capacitance of the capacitor 356 of FIG. 3 and the transconductance of the transistor 360 of FIG. 3 determine the timing of the delay durations 830, 835.

The target delay profiles 815, 820 represent example target operations of another instance of one of the stage circuitry 225, 240. The delay profile 815 has a first zero-crossing at approximately a fifth example delay duration 845 and a second zero-crossing at approximately a sixth example delay duration 850. The delay profile 820 has a first zero-crossing at approximately a seventh example delay duration 855 and a second zero-crossing at approximately a fourth example delay duration 860. The target operations of the target delay profiles 815, 820 occur responsive to calibrating the time domain converter circuitry 120. When calibrated, the delay duration 845 is approximately equal to three fourths of the minimum delay duration $$\left(\frac{-3T_{MAX}}{4}\right)$$

and the delay duration 850 is approximately equal to the minimum delay duration divided by four $$\left(\frac{-T_{MAX}}{4}\right).$$

When calibrated, the delay duration 855 is approximately equal to the minimum delay duration divided by four $$\left(\frac{T_{MAX}}{4}\right)$$

and the delay duration 860 is approximately equal to three fourths of the minimum delay duration $$\left(\frac{3T_{MAX}}{4}\right).$$

In example operations, the trim circuitry 130 of FIG. 1 performs example trim operations, which are further described in connection with FIGS. 11, 12A, 12B, below, to detect the zero-crossing thresholds of the another instance of one of the stage circuitry 225, 240. The trim circuitry 130 may determine the accuracy of the zero-crossing thresholds at the delay durations 825, 830, 835, 840 by comparing the output of the reference comparator circuitry 160 of FIG. 1 to a sign bit output of the another instance of one of the stage circuitry 225, 240. Similar to correcting the offset between the delay duration threshold 660 and the target delay duration threshold 665, the trim circuitry 130 adjusts delays of the input signals. In the example of FIG. 8A, the trim circuitry 130 adjusts the delays of the stage circuitry 240 to decrease the offset between the delay profiles 805, 810 and the target delay profiles 815, 820. For example, when correcting the difference between the delay durations 830, 850, the trim circuitry 130 adjusts the trim values of circuitry of the stage circuitry 240, which supplies the second comparison output signal and the second logically combined signal. Advantageously, the trim circuitry 130 may account for offset errors by adjusting delays of prior stage circuitry. For example, adjusting the delays of the stage circuitry 240 to account for the offset between the delay profiles 805, 810 and the target delay profiles 815, 820.

Figure 8B:
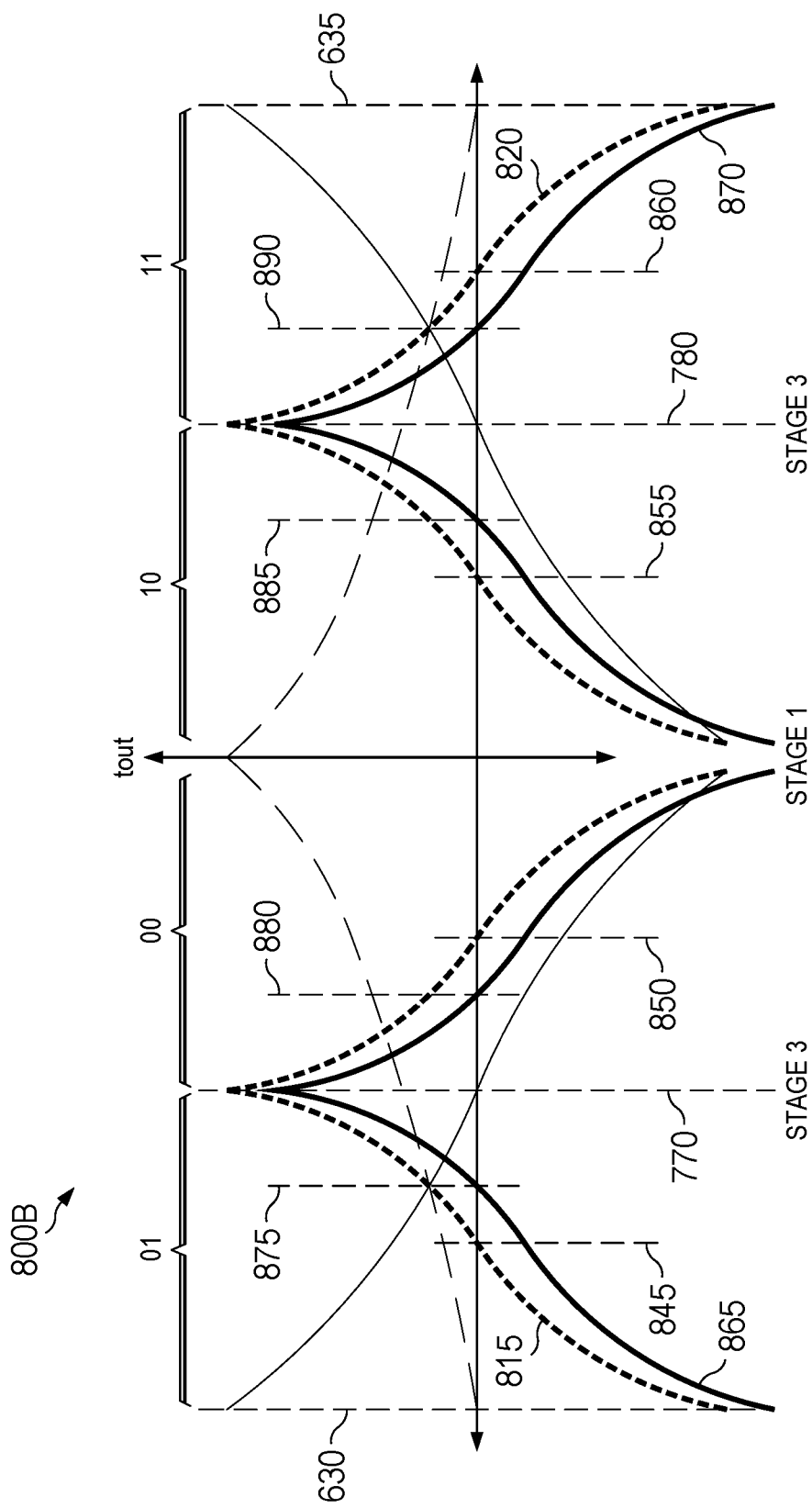

FIG. 8B is a plot 800B of example operations of another instance of one of the stage circuitry 225, 240 of FIG. 2 coupled in series with the stage circuitry 240. Such another instance of the circuitry 225, 240 receives the second comparison output signal and the second logically combined signal from the stage circuitry 240 and generates a third comparison output signal and a third logically combined signal. In the example of FIG. 8B, the plot 800B illustrates the target delay profiles 815, 820 of FIG. 8A, a third example delay profile 865 and a fourth example delay profile 870. The delay profiles 815, 820, 865, 870 represent example output timings ($T_{OUT}$) of delay durations between the third comparison output signal and the third logically combined signal across a range of possible delay durations ($T_2$-$T_1$) between the second comparison output signal and the second logically combined signal from the stage circuitry 240.

The delay profiles 865, 870 represent example operations of the another instance of one of the stage circuitry 225, 240. Similar to the span of the delay profiles 710, 720 of FIG. 7, the delay profiles 865, 870 span approximately half of the range of the time domain converter circuitry 120. For example, the delay profile 865 has a range from the minimum delay duration (e.g., the delay duration 630 of FIGS. 6A, 6B, and 6C) to a delay duration of approximately zero (e.g., the equilibrium delay duration 590 of FIG. 5B or the target delay duration threshold 665 of FIG. 6C). In such examples, the delay profile 870 has a range from the delay duration of approximately zero to the maximum delay duration (e.g., the delay duration 635 of FIGS. 6A, 6B, 6C).

Similar to the delay profiles 805, 810 of FIG. 8A, the delay profiles 865, 870 each have two zero-crossing thresholds. The delay profile 865 has a first zero-crossing at approximately a first example delay duration 875 and a second zero-crossing at approximately a second example delay duration 880. The delay profile 870 has a first zero-crossing at approximately a third example delay duration 885 and a second zero-crossing at approximately a fourth example delay duration 890. The zero-crossing thresholds at the delay durations 875, 890 correspond to minus side components of comparator circuitry. For example, the capacitance of the capacitor 352 of FIG. 3 and the transconductance of the transistor 368 of FIG. 3 determine the timing of the delay durations 875, 890. Also, the zero-crossing thresholds at the delay durations 880, 885 correspond to plus side components of comparator circuitry. For example, the capacitance of the capacitor 356 of FIG. 3 and the transconductance of the transistor 360 of FIG. 3 determine the timing of the delay durations 880, 885.

In example operations, the trim circuitry 130 of FIG. 1 performs example trim operations, which are further described in connection with FIGS. 11, 12A, 12B, below, to detect the zero-crossing thresholds of the another instance of one of the stage circuitry 225, 240. The trim circuitry 130 may determine the accuracy of the zero-crossing thresholds at the delay durations 875, 880, 885, 890 by comparing the output of the reference comparator circuitry 160 of FIG. 1 to a sign bit output of the another instance of one of the stage circuitry 225, 240. In FIG. 8B, the trim circuitry 130 determines a shift in delay profiles is needed responsive to the mismatches between the target zero-crossing thresholds at the delay durations 845, 850, 855, 860 and the zero-crossing thresholds at the delay durations 875, 880, 885, 890. Such a shift between the delay profiles 865, 870 and the target delay profiles 815, 820 results from mismatches between comparator circuitry and logic device of the another instance of one of the stage circuitry 225, 240.

The trim circuitry 130 adjusts delays of the comparator circuitry and/or the logic device in reference to each other. For example, when the comparator circuitry 300 of FIG. 3 and the logic device 400 of FIG. 4 form another instance of one of the stage circuitry 225, 240, the trim circuitry 130 adjusts the capacitance of the capacitors 352, 356 of FIG. 3 in reference to the capacitance of the capacitor 445 of FIG. 4. Advantageously, the trim circuitry 130 may shift the delay profiles 865, 870 to be approximately equal to the target delay profiles 815, 820.

Figure 9:
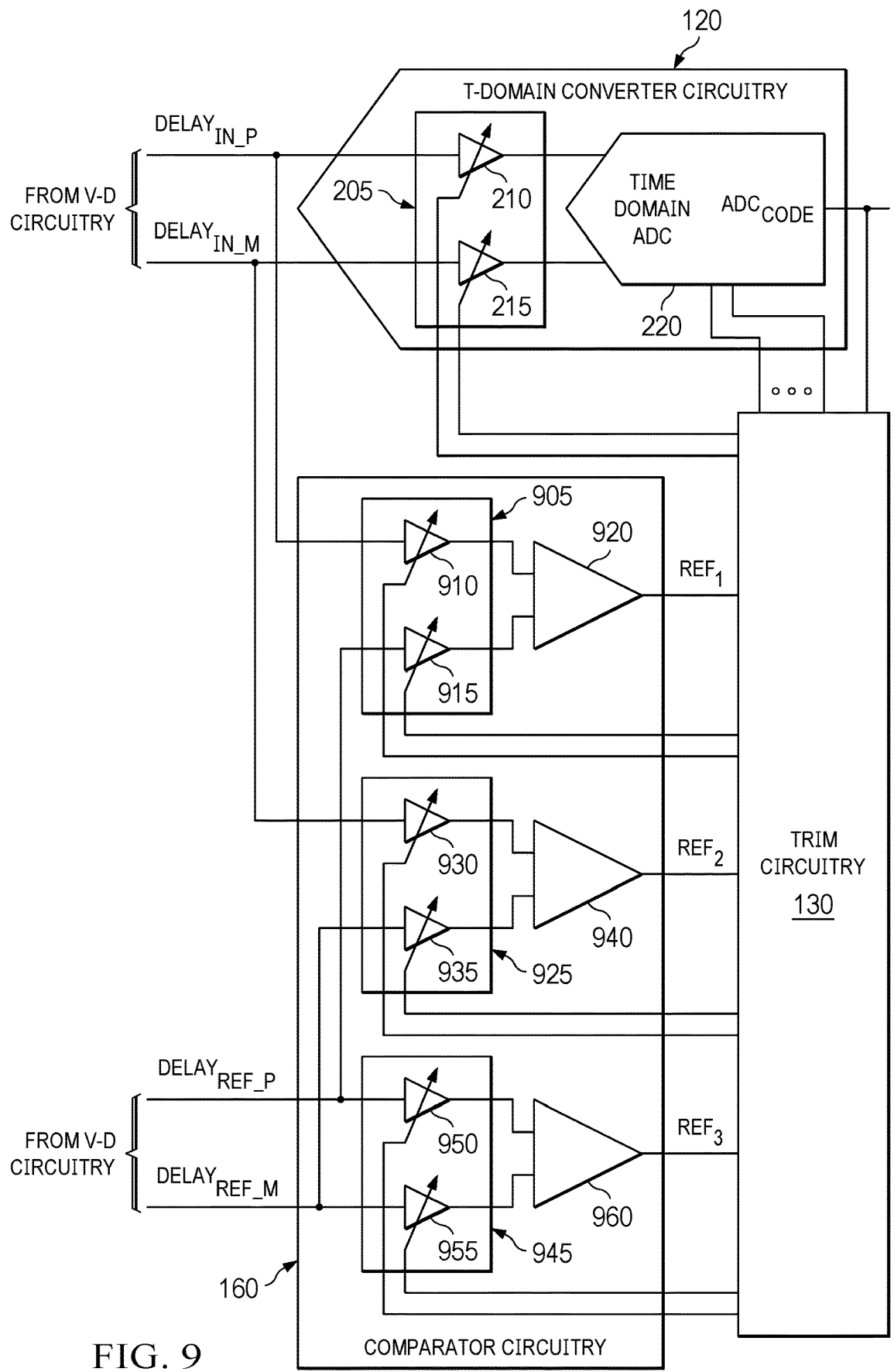
FIG. 9 is a schematic diagram of an example of the reference comparator circuitry of FIG. 1 including multiple instances of example comparator circuitry to detect common mode error between delay durations of the ADC circuitry of FIG. 1.

FIG. 9 is a schematic diagram of an example of the reference comparator circuitry 160 of FIG. 1 that compares the plus and minus input signals from the V-D circuitry 110 of FIG. 1 to example plus and minus reference signals (DELAY$_{REF\_P}$, DELAY$_{REF\_M}$) from the V-D circuitry 150 of FIG. 1. In the example of FIG. 9, the reference comparator circuitry 160 includes first example variable delay circuitry 905, first example delay circuitry 910, second example delay circuitry 915, first example comparator circuitry 920, second example variable delay circuitry 925, third example delay circuitry 930, fourth example delay circuitry 935, second example comparator circuitry 940, third example variable delay circuitry 945, fifth example delay circuitry 950, sixth example delay circuitry 955, and third example comparator circuitry 960.

The variable delay circuitry 905 has a first input that may be coupled to the V-D circuitry 110 of FIG. 1, a second input that may be coupled to the V-D circuitry 150 of FIG. 1, and third inputs coupled to the trim circuitry 130 of FIG. 1. The variable delay circuitry 905 has outputs coupled to the comparator circuitry 920. The variable delay circuitry 905 receives the plus input signal from the V-D circuitry 110 and the plus reference signal from the V-D circuitry 150. In the example of FIG. 9, the variable delay circuitry 905 includes the delay circuitry 910, 915. The variable delay circuitry 905 delays the plus input signal by a first delay duration and the plus reference signal by a second delay duration. For example, the variable delay circuitry 905 delays edges of the plus input signal by five pico-Seconds (pS) responsive to the first delay duration being approximately five pico-Seconds. The variable delay circuitry 905 supplies the delayed signals to the comparator circuitry 920.

The delay circuitry 910 has a first input coupled to the time domain converter circuitry 120 and that may be coupled to the V-D circuitry 110 and a second input coupled to the trim circuitry 130. The delay circuitry 910 has an output coupled to the comparator circuitry 920. The delay circuitry 910 receives the plus input signal from the V-D circuitry 110. The delay circuitry 910 delays edges of the plus input signal by the first delay duration. The trim circuitry 130 controls the first delay duration of the delay circuitry 910. The delay circuitry 910 supplies the delayed plus input signal to the comparator circuitry 920.

The delay circuitry 915 has a first input coupled to the variable delay circuitry 945 and that may be coupled to the V-D circuitry 150 and a second input coupled to the trim circuitry 130. The delay circuitry 915 has an output coupled to the comparator circuitry 920. The delay circuitry 915 receives the plus reference signal from the V-D circuitry 150. The delay circuitry 915 delays edges of the plus reference signal by the second delay duration. The trim circuitry 130 controls the second delay duration of the delay circuitry 915. The delay circuitry 915 supplies the delayed plus reference signal to the comparator circuitry 920.

The comparator circuitry 920 has a first input coupled to the delay circuitry 910, a second input coupled to the delay circuitry 915, and an output coupled to the trim circuitry 130. The comparator circuitry 920 receives the delayed plus input signal from the delay circuitry 910 and the delayed plus reference signal from the delay circuitry 915. The comparator circuitry 920 compares the delayed plus input signal to the delayed plus reference signal. The comparator circuitry 920 generates a first comparison output (REF$_1$) responsive to the comparison. The comparator circuitry 920 supplies the first comparison output to the trim circuitry 130. In example operations, the comparator circuitry 920 compares the plus side signals of the input delay from the V-D circuitry 110 and the reference delay from the V-D circuitry 150. In such example operations, the trim circuitry 130 uses the first comparison output to detect common mode errors between the input delay and the reference delay. Advantageously, the comparator circuitry 920 allows the reference comparator circuitry 160 to detect common mode errors.

The variable delay circuitry 925 has a first input that may be coupled to the V-D circuitry 110, a second input that may be coupled to the V-D circuitry 150, and third inputs coupled to the trim circuitry 130. The variable delay circuitry 925 has outputs coupled to the comparator circuitry 940. The variable delay circuitry 925 receives the minus input signal from the V-D circuitry 110 and the minus reference signal from the V-D circuitry 150. In the example of FIG. 9, the variable delay circuitry 925 includes the delay circuitry 930, 935. The variable delay circuitry 925 delays the minus input signal by a third delay duration and the minus reference signal by a fourth delay duration. The variable delay circuitry 925 supplies the delayed signals to the comparator circuitry 940.

The delay circuitry 930 has a first input coupled to the time domain converter circuitry 120 and that may be coupled to the V-D circuitry 110 and a second input coupled to the trim circuitry 130. The delay circuitry 930 has an output coupled to the comparator circuitry 940. The delay circuitry 930 receives the minus input signal from the V-D circuitry 110. The delay circuitry 930 delays edges of the minus input signal by the third delay duration. The trim circuitry 130 controls the third delay duration of the delay circuitry 930. The delay circuitry 930 supplies the delayed minus input signal to the comparator circuitry 940.

The delay circuitry 935 has a first input coupled to the variable delay circuitry 945 and that may be coupled to the V-D circuitry 150 and a second input coupled to the trim circuitry 130. The delay circuitry 935 has an output coupled to the comparator circuitry 940. The delay circuitry 935 receives the minus reference signal from the V-D circuitry 150. The delay circuitry 935 delays edges of the minus reference signal by the fourth delay duration. The trim circuitry 130 controls the fourth delay duration of the delay circuitry 935. The delay circuitry 935 supplies the delayed minus reference signal to the comparator circuitry 940.

The comparator circuitry 940 has a first input coupled to the delay circuitry 930, a second input coupled to the delay circuitry 935, and an output coupled to the trim circuitry 130. The comparator circuitry 940 receives the delayed minus input signal from the delay circuitry 930 and the delayed minus reference signal from the delay circuitry 935. The comparator circuitry 940 compares the delayed minus input signal to the delayed minus reference signal. The comparator circuitry 940 generates a second comparison output (REF$_2$) responsive to the comparison. The comparator circuitry 940 supplies the second comparison output to the trim circuitry 130. In example operations, the comparator circuitry 940 compares the minus side signals of the input delay from the V-D circuitry 110 and the reference delay from the V-D circuitry 150. In such example operations, the trim circuitry 130 uses both the first and second comparison outputs to detect common mode errors between the input delay and the reference delay. Advantageously, the comparator circuitry 940 allows the reference comparator circuitry 160 to detect common mode errors.

The variable delay circuitry 945 has a first input coupled to the variable delay circuitry 905 and that may be coupled to the V-D circuitry 150, a second input coupled to the variable delay circuitry 925 and that may be coupled to the V-D circuitry 150, and third inputs coupled to the trim circuitry 130. The variable delay circuitry 945 has outputs coupled to the comparator circuitry 960. The variable delay circuitry 945 receives the plus and minus reference signals from the V-D circuitry 150. In the example of FIG. 9, the variable delay circuitry 945 includes the delay circuitry 950, 955. The variable delay circuitry 945 delays the plus reference signal by a fifth delay duration and the minus reference signal by a sixth delay duration. The variable delay circuitry 945 supplies the delayed signals to the comparator circuitry 960.

The delay circuitry 950 has a first input coupled to the variable delay circuitry 905 and that may be coupled to the V-D circuitry 150 and a second input coupled to the trim circuitry 130. The delay circuitry 950 has an output coupled to the comparator circuitry 960. The delay circuitry 950 receives the plus reference signal from the V-D circuitry 150. The delay circuitry 950 delays edges of the plus reference signal by the fifth delay duration. The trim circuitry 130 controls the fifth delay duration of the delay circuitry 950. The delay circuitry 950 supplies the delayed plus reference signal to the comparator circuitry 960.

The delay circuitry 955 has a first input coupled to the variable delay circuitry 925 and that may be coupled to the V-D circuitry 150 and a second input coupled to the trim circuitry 130. The delay circuitry 955 has an output coupled to the comparator circuitry 960. The delay circuitry 955 receives the minus reference signal from the V-D circuitry 150. The delay circuitry 955 delays edges of the minus reference signal by the sixth delay duration. The trim circuitry 130 controls the fifth delay duration of the delay circuitry 955. The delay circuitry 955 supplies the delayed minus reference signal to the comparator circuitry 960.

The comparator circuitry 960 has a first input coupled to the delay circuitry 950, a second input coupled to the delay circuitry 955, and an output coupled to the trim circuitry 130. The comparator circuitry 960 receives the delayed plus reference signal from the delay circuitry 950 and the delayed minus reference signal from the delay circuitry 955. The comparator circuitry 960 compares the delayed plus reference signal to the delayed minus reference signal. The comparator circuitry 960 generates a third comparison output (REF$_3$) responsive to the comparison. The comparator circuitry 960 supplies the third comparison output to the trim circuitry 130. In example operations, the comparator circuitry 960 compares the reference signals from the V-D circuitry 150. In such example operations, the trim circuitry 130 uses the third comparison output to calibrate the V-D circuitry 150. Advantageously, the comparator circuitry 960 allows the reference comparator circuitry 160 to calibrate offsets of the V-D circuitry 150. Example operations to calibrate the delay durations of the delay circuitry 910, 915, 930, 935, 950, 955 are described in connection with FIG. 11, below.

Figure 10B:
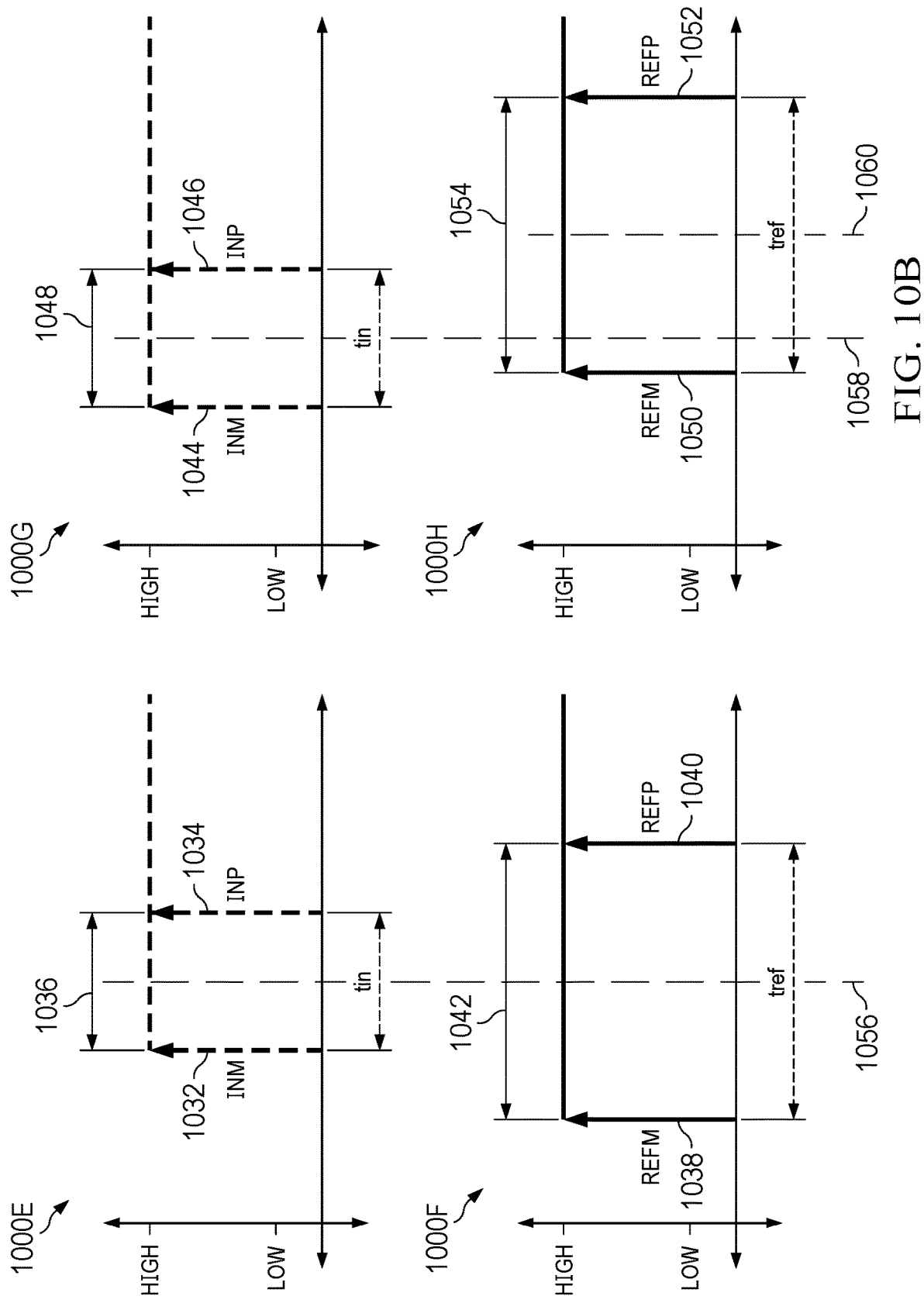

FIGS. 10A and 10B illustrate example operations of the reference comparator circuitry 160 of FIGS. 1 and 9 to detect example common mode errors between the outputs of the V-D circuitry 110 of FIG. 1 and the reference outputs of the V-D circuitry 150 of FIG. 1.

FIG. 10A illustrates a first example plot 1000A, a second example plot 1000B, a third example plot 1000C, and a fourth example plot 1000D. The plot 1000A illustrates an example operation of the V-D circuitry 110. In the example of FIG. 10A, the plot 1000A illustrates a first example minus delay signal 1002, a first example plus delay signal 1004, and a first example delay duration 1006. The plus and minus delay signals 1002, 1004 are illustrative examples of the outputs of the V-D circuitry 110 over time. The delay duration 1006 illustrates an example delay between edges (e.g., rising edges) of the outputs of the V-D circuitry 110. In example operations, the V-D circuitry 110 generates the delay duration 1006 responsive to an analog value of an input of the V-D circuitry 110. In such examples, the delay duration 1006 corresponds to a specific analog value of the input of the V-D circuitry 110.

The plot 1000B illustrates an example operation of the V-D circuitry 150. In the example of FIG. 10A, the plot 1000B illustrates a second example minus delay signal 1008, a second example plus delay signal 1010, and a second example delay duration 1012. The plus and minus delay signals 1008, 1010 are illustrative examples of the outputs of the V-D circuitry 150 over time. The delay duration 1012 illustrates an example reference delay between edges (e.g., rising edges) of the outputs of the V-D circuitry 150. In example operations, the V-D circuitry 150 generates the delay duration 1012 responsive to an analog value of an input of the V-D circuitry 150. In some examples, the DAC 140 of FIG. 1 generates the analog value at the input of the V-D circuitry 150 responsive to a digital input value from the trim circuitry 130. In such examples, the delay duration 1012 corresponds to a specific analog value of the input of the V-D circuitry 150.

The plot 1000C illustrates an example operation of the V-D circuitry 110. In the example of FIG. 10A, the plot 1000C illustrates a third example minus delay signal 1014, a third example plus delay signal 1016, and a third example delay duration 1018. The plus and minus delay signals 1014, 1016 are illustrative examples of the outputs of the V-D circuitry 110 over time. The delay duration 1018 illustrates an example delay between edges (e.g., rising edges) of the outputs of the V-D circuitry 110. In example operations, the V-D circuitry 110 generates the delay duration 1018 responsive to an analog value of an input of the V-D circuitry 110. In such examples, the delay duration 1018 corresponds to a specific analog value of the input of the V-D circuitry 110.

The plot 1000D illustrates an example operation of the V-D circuitry 150. In the example of FIG. 10A, the plot 1000D illustrates a fourth example minus delay signal 1020, a fourth example plus delay signal 1022, and a fourth example delay duration 1024. The plus and minus delay signals 1020, 1022 are illustrative examples of the outputs of the V-D circuitry 150 over time. The delay duration 1024 illustrates an example reference delay between edges (e.g., rising edges) of the outputs of the V-D circuitry 150. In example operations, the V-D circuitry 150 generates the delay duration 1024 responsive to an analog value of an input of the V-D circuitry 150. In some examples, the DAC 140 generates the analog value at the input of the V-D circuitry 150 responsive to a digital input value from the trim circuitry 130. In such examples, the delay duration 1024 corresponds to a specific analog value of the input of the V-D circuitry 150.

In the example of plots 1000A, 1000B, at a first time 1026, the delay durations 1006, 1012 have a common mode delay. The common mode delay of the delay durations 1006, 1012 is approximately the mid-point between rising edges of the delay signals 1002, 1004 or 1008, 1010. In example operations, the V-D circuitry 110, 150 generate the delay durations 1006, 1012 by modifying the timing of the rising edges of the delay signals 1002, 1004 or 1008, 1010 from being at approximately the first time 1026. For example, the V-D circuitry 110 generates the delay duration 1006 by increasing the duty cycle of the minus delay signal 1002 and decreasing the duty cycle of the plus delay signal 1004. For the comparator circuitry 160 to accurately compare the delay durations 1006, 1012, the common mode delay of the V-D circuitry 110, 150 need to be approximately equal.

In the example of plot 1000C, the common mode delay of the delay duration 1018 occurs at a second time 1028. In the example of plot 1000D, the common mode delay of the delay duration 1024 occurs at a third time 1030. Such a difference between the common mode delays at the times 1028, 1030 is referred to as a common mode delay error. The plots 1000C, 1000D illustrate example operations where the common mode delays of the V-D circuitry 110, 150 need to be calibrated. In the example operations, where the plots 1000C, 1000D represent outputs of the V-D circuitry 110, 150, the comparator circuitry 160 inaccurately compares the delay durations 1018, 1024. However, the trim circuitry 130 may detect such inaccuracies using the outputs of the comparator circuitry 920, 940, 960 of FIG. 9. For example, when the outputs of the comparator circuitry 920, 940 are approximately equal at either of the times 1028, 1030. In such examples, the trim circuitry 130 detects common mode errors when the difference between the times 1028, 1030 are greater than the difference between the delay durations 1018, 1024 divided by two. Advantageously, the comparator circuitry 920, 940, 960 allow the trim circuitry 130 to detect common mode delay errors between the delays of the V-D circuitry 110, 150.

FIG. 10B illustrates a first example plot 1000E, a second example plot 1000F, a third example plot 1000G, and a fourth example plot 1000H. The plot 1000E illustrates an example operation of the V-D circuitry 110. In the example of FIG. 10B, the plot 1000E illustrates a first example minus delay signal 1032, a first example plus delay signal 1034, and a first example delay duration 1036. The plus and minus delay signals 1032, 1034 are illustrative examples of the outputs of the V-D circuitry 110 over time. The delay duration 1036 illustrates an example delay between edges (e.g., rising edges) of the outputs of the V-D circuitry 110. In example operations, the V-D circuitry 110 generates the delay duration 1036 responsive to an analog value of an input of the V-D circuitry 110. In such examples, the delay duration 1036 corresponds to a specific analog value of the input of the V-D circuitry 110.

The plot 1000F illustrates an example operation of the V-D circuitry 150. In the example of FIG. 10B, the plot 1000F illustrates a second example minus delay signal 1038, a second example plus delay signal 1040, and a second example delay duration 1042. The plus and minus delay signals 1038, 1040 are illustrative examples of the outputs of the V-D circuitry 150 over time. The delay duration 1042 illustrates an example reference delay between edges (e.g., rising edges) of the outputs of the V-D circuitry 150. In example operations, the V-D circuitry 150 generates the delay duration 1042 responsive to an analog value of an input of the V-D circuitry 150. In some examples, the DAC 140 of FIG. 1 generates the analog value at the input of the V-D circuitry 150 responsive to a digital input value from the trim circuitry 130. In such examples, the delay duration 1042 corresponds to a specific analog value of the input of the V-D circuitry 150.

The plot 1000G illustrates an example operation of the V-D circuitry 110. In the example of FIG. 10B, the plot 1000G illustrates a third example minus delay signal 1044, a third example plus delay signal 1046, and a third example delay duration 1048. The plus and minus delay signals 1044, 1046 are illustrative examples of the outputs of the V-D circuitry 110 over time. The delay duration 1048 illustrates an example delay between edges (e.g., rising edges) of the outputs of the V-D circuitry 110. In example operations, the V-D circuitry 110 generates the delay duration 1048 responsive to an analog value of an input of the V-D circuitry 110. In such examples, the delay duration 1048 corresponds to a specific analog value of the input of the V-D circuitry 110.

The plot 1000H illustrates an example operation of the V-D circuitry 150. In the example of FIG. 10B, the plot 1000H illustrates a fourth example minus delay signal 1050, a fourth example plus delay signal 1052, and a fourth example delay duration 1054. The plus and minus delay signals 1050, 1052 are illustrative examples of the outputs of the V-D circuitry 150 over time. The delay duration 1054 illustrates an example reference delay between edges (e.g., rising edges) of the outputs of the V-D circuitry 150. In example operations, the V-D circuitry 150 generates the delay duration 1054 responsive to an analog value of an input of the V-D circuitry 150. In some examples, the DAC 140 generates the analog value at the input of the V-D circuitry 150 responsive to a digital input value from the trim circuitry 130. In such examples, the delay duration 1054 corresponds to a specific analog value of the input of the V-D circuitry 150.

In the example of plots 1000E, 1000F, at a first time 1056, the delay durations 1036, 1042 have a common mode delay. The common mode delay of the delay durations 1036, 1042 is approximately the mid-point between rising edges of the delay signals 1032, 1034 or 1038, 1040. In example operations, the V-D circuitry 110, 150 generate the delay durations 1036, 1042 by modifying the timing of the rising edges of the delay signals 1032, 1034 or 1038, 1040 from being at approximately the first time 1056. For example, the V-D circuitry 110 generates the delay duration 1036 by increasing the duty cycle of the minus delay signal 1032 and decreasing the duty cycle of the plus delay signal 1034. For the comparator circuitry 160 to accurately compare the delay durations 1036, 1042, the common mode delay of the V-D circuitry 110, 150 need to be approximately equal.

In the example of plot 1000G, the common mode delay of the delay duration 1048 occurs at a second time 1058. In the example of plot 1000G, the common mode delay of the delay duration 1054 occurs at a third time 1060. Such a difference between the common mode delays at the times 1058, 1060 is referred to as a common mode delay error. The plots 1000G, 1000H illustrate example operations where the common mode delays of the V-D circuitry 110, 150 need to be calibrated. In the example operations, where the plots 1000G, 1000H represent outputs of the V-D circuitry 110, 150, the comparator circuitry 160 inaccurately compares the delay durations 1048, 1054. However, the trim circuitry 130 may detect such inaccuracies using the outputs of the comparator circuitry 920, 940, 960 of FIG. 9. For example, when the outputs of the comparator circuitry 920, 940 are approximately equal at either of the times 1058, 1060. In such examples, the trim circuitry 130 detects common mode errors when the difference between the times 1058, 1060 are greater than the difference between the delay durations 1048, 1054 divided by two. Advantageously, the comparator circuitry 920, 940, 960 allow the trim circuitry 130 to detect common mode delay errors between the delays of the V-D circuitry 110, 150.

Figure 11:
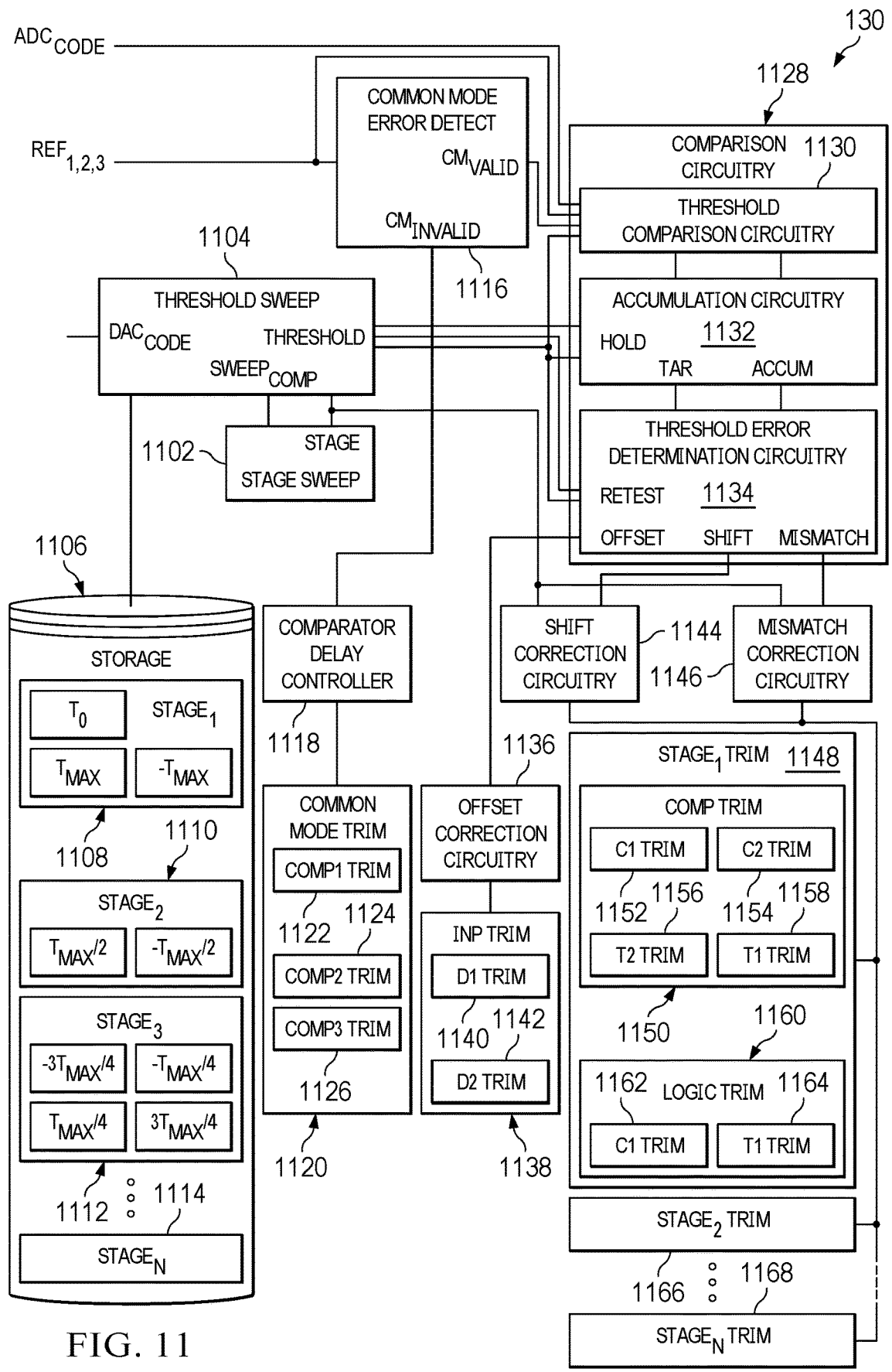
FIG. 11 is a block diagram of an example of the trim circuitry of FIG. 1, which calibrates the time domain converter circuitry of FIGS. 1 and 2 and the reference comparator circuitry of FIGS. 1 and 9 using the example trim operations of FIGS. 6A, 6B, 6C, 7, 8A, and 8B.

FIG. 11 is a block diagram of an example of the trim circuitry 130 of FIGS. 1 and 9 to calibrate the stage circuitry 225, 240, 255 of FIG. 2 and the variable delay circuitry 205, 905, 925, 945 of FIGS. 2 and/or 9. In the example of FIG. 11, the trim circuitry 130 includes example stage sweep circuitry 1102, example threshold sweep circuitry 1104, an example storage 1106, first example stage thresholds 1108, second example stage thresholds 1110, third example stage thresholds 1112, fourth example stage thresholds 1114, example common mode error detection circuitry 1116, example comparator delay controller circuitry 1118, example common mode trim circuitry 1120, first example comparator trim circuitry 1122, second example comparator trim circuitry 1124, third example comparator trim circuitry 1126, example comparison circuitry 1128, example threshold comparison circuitry 1130, example accumulation circuitry 1132, example threshold error determination circuitry 1134, example offset correction circuitry 1136, example input delay trim circuitry 1138, first example delay trim circuitry 1140, second example delay trim circuitry 1142, example shift correction circuitry 1144, example mismatch correction circuitry 1146, first example stage trim circuitry 1148, example comparator trim circuitry 1150, first example capacitor trim circuitry 1152, second example capacitor trim circuitry 1154, first example transistor trim circuitry 1156, second example trim circuitry 1158, example logic device trim circuitry 1160, third example capacitor trim circuitry 1162, third example transistor trim circuitry 1164, second example stage trim circuitry 1166, and third example stage trim circuitry 1168.

FIG. 11 is a block diagram of an example implementation of the trim circuitry 130 to calibrate the threshold values of the time domain converter circuitry 120. The trim circuitry 130 may be instantiated (e.g., creating an instance of, bring into being for any length of time, materialize, implement, etc.) by programmable circuitry such as a Central Processor Unit (CPU) executing first instructions. Also or alternatively, the trim circuitry 130 may be instantiated (e.g., creating an instance of, bring into being for any length of time, materialize, implement, etc.) by (i) an Application Specific Integrated Circuit (ASIC) and/or (ii) a Field Programmable Gate Array (FPGA) structured and/or configured in response to execution of second instructions to perform operations corresponding to the first instructions. Some or all of the circuitry of FIG. 11 may, thus, be instantiated at the same or different times. Some or all of the circuitry of FIG. 11 may be instantiated, for example, in one or more threads executing concurrently on hardware and/or in series on hardware. Moreover, in some examples, some or all of the circuitry of FIG. 11 may be implemented by microprocessor circuitry executing instructions and/or FPGA circuitry performing operations to implement one or more virtual machines and/or containers.

The stage sweep circuitry 1102 has an input and an output coupled to the threshold sweep circuitry 1104. The stage sweep circuitry 1102 receives a sweep complete indication (COMP) from the threshold sweep circuitry 1104. The sweep complete indication indicates whether all thresholds of a stage of the time domain ADC circuitry 220 of FIGS. 2 and 9 have been calibrated. The stage sweep circuitry 1102 generates a stage indication (STAGE) to calibrate each stage of the time domain ADC circuitry 220. The stage indication represents one of the stage circuitry 225, 240, 255. The stage sweep circuitry 1102 adjusts the stage indication to calibrate each of the stage circuitry 225, 240, 255. In some examples, the stage sweep circuitry 1102 begins at the stage circuitry 225. In such examples, the stage sweep circuitry 1102 adjusts the stage indication to represent the stage circuitry 240 responsive to the sweep complete indication. The stage sweep circuitry 1102 supplies the stage indication to the threshold sweep circuitry 1104. In some examples, the stage sweep circuitry 1102 is instantiated by programmable circuitry executing stage sweep instructions and/or perform operations such as those represented by the flowchart of FIGS. 12A and 12B.

The threshold sweep circuitry 1104 has a first input coupled to the stage sweep circuitry 1102, a second input coupled to the storage 1106, a third input coupled to the accumulation circuitry 1132, and a fourth input coupled to the threshold error determination circuitry 1134. The threshold sweep circuitry 1104 has a first output that may be coupled to the DAC 140 of FIG. 1, a second output coupled to the stage sweep circuitry 1102, a third output coupled to the threshold error determination circuitry 1134, shift correction circuitry 1144, and mismatch correction circuitry 1146. The threshold sweep circuitry 1104 receives the stage indication from the stage sweep circuitry 1102, threshold values from the storage 1106, a hold indication (HOLD) from the accumulation circuitry 1132, and a retest indication (RETEST) from the threshold error determination circuitry 1134.

The threshold sweep circuitry 1104 determines threshold values to calibrate responsive to the stage indication. The threshold sweep circuitry 1104 access the storage 1106 to determine threshold values that correspond to the stage indication. For example, when the stage indication corresponds to the stage circuitry 225, the threshold sweep circuitry 1104 accesses the stage thresholds 1108. The threshold sweep circuitry 1104 generates a digital input code ($DAC_{CODE}$) responsive to the threshold values from the storage 1106. The threshold sweep circuitry 1104 generates a digital input code to represent the threshold values from the storage 1106. The DAC 140 generates a voltage having an analog value that corresponds to the digital input code. The analog value of the voltage corresponding to the digital input code represents a threshold to be calibrated. The V-D circuitry 150 of FIG. 1 generates a reference delay duration responsive to the analog value of the voltage from the DAC 140. For example, the V-D circuitry 150 generates the target delay duration threshold 665 of FIG. 6C responsive to the threshold sweep circuitry 1104 supplying a digital input code corresponding to the target threshold duration 665 to the DAC 140.

In some examples, the stage indication corresponds to a plurality of threshold values. In such examples, the threshold sweep circuitry 1104 sequences supplying the digital input code to the DAC 140. In example operations, the threshold sweep circuitry 1104 supplies a digital input code corresponding to a first one of the plurality of threshold values to the DAC 140. The threshold sweep circuitry 1104 adjusts the digital input code to represent a second one of the plurality of threshold values responsive to the hold indication. The hold indication prevents the threshold sweep circuitry 1104 from adjusting the digital input code. In some examples, the accumulation circuitry 1132 sets the hold indication to prevent the threshold sweep circuitry 1104 from adjusting the digital input code during calibration operations. The threshold sweep circuitry 1104 adjusts the digital input code responsive to the accumulation circuitry 1132 clearing the hold indication. The threshold sweep circuitry 1104 adjusts the digital input code until all thresholds of the stage indication have been supplied to the DAC 140.

The threshold sweep circuitry 1104 generates a threshold value indication (THRESHOLD) that represents the threshold of the digital input code and the stage of the stage indication. In example operations, the threshold sweep circuitry 1104 adjusts the threshold indication responsive to the accumulation circuitry 1132 clearing the hold indication.

The threshold sweep circuitry 1104 generates a sweep complete indication responsive to all threshold values of the stage indication being calibrated. However, the threshold sweep circuitry 1104 may delay generation of the sweep complete indication responsive to a retest indication from the threshold error determination circuitry 1134. In example operations, the threshold sweep circuitry 1104 needs to resupply each threshold value of the stage indication responsive to the threshold error determination circuitry 1134 modifying the calibration of the time domain converter circuitry 120. The threshold sweep circuitry 1104 supplies the sweep complete indication to the stage sweep circuitry 1102 responsive to the threshold error determination circuitry 1134 successfully calibrating the stage circuitry corresponding to the stage indication. In some examples, the threshold sweep circuitry 1104 is instantiated by programmable circuitry executing threshold sweep instructions and/or perform operations such as those represented by the flowchart of FIGS. 12A and 12B.

The storage 1106 is coupled to the threshold sweep circuitry 1104. In the example of FIG. 11, the storage 1106 includes the stage thresholds 1108, 1110, 1112, 1114, which further include threshold values of the stage circuitry 225, 240, 255. For example, the stage thresholds 1108 includes values that correspond to the target delay durations 630, 635, 665 of FIGS. 6A, 6B, and/or 6C. In some examples, the values of the stage thresholds 1108, 1110, 1112, 1114 are digital input codes that correspond to target delay durations. In such examples, the threshold sweep circuitry 1104 directly supplies the digital input codes to the DAC 140. In other examples, the values of the stage thresholds 1108, 1110, 1112, 1114 are the target delay durations. In such examples, the threshold sweep circuitry 1104 generates digital input codes that represent the target delay durations. In yet another example, the values of the stage thresholds 1108, 1110, 1112, 1114 represent voltages that, when supplied to, the V-D circuitry 150 uses to generate the target delay duration. In such examples, the threshold sweep circuitry 1104 converts the voltage into digital input values that represent the voltages.

In example operations, each of the stage thresholds 1108, 1110, 1112, 1114 correspond to one instance of the stage circuitry 225, 240, 255. In such example operations, with the exclusion of the stage thresholds 1108, each of the stage thresholds 1110, 1112, 1114 has a number of threshold values corresponding to the number of the corresponding stage circuitry. For example, the number of thresholds for each of the stage thresholds 1108, 1110, 1112, 1114 is approximately equal to the number of the stage to the power of two. For example, the stage circuitry 225 has one threshold value responsive to corresponding to the zero stage of the time domain converter circuitry 120. In such an example, the stage circuitry 225 may include additional threshold values that define the maximum and minimum delay durations ($-T_{MAX}$, $T_{MAX}$). In another example, the stage circuitry 240 has two threshold values ($-T_{MAX}/2$, $T_{MAX}/2$) responsive to corresponding to the one stage of the time domain converter circuitry 120. The storage 1106 supplies the threshold values of the stage thresholds 1108, 1110, 1112, 1114 to the threshold sweep circuitry 1104.

The common mode error detection circuitry 1116 has inputs that may be coupled to the comparator circuitry 920, 940, 960 of FIG. 9. The common mode error detection circuitry 1116 has a first output coupled to the comparator delay controller circuitry 1118 and a second output coupled to the threshold comparison circuitry 1130. The common mode error detection circuitry 1116 receives the comparison outputs ($REF_{1,2,3}$) from the comparator circuitry 920, 940, 960. The common mode error detection circuitry 1116 detects common mode errors between the delay durations from the V-D circuitry 110, 150. An example common mode error is illustrated and described in connection with FIGS. 10A and 10B, above.

The common mode error detection circuitry 1116 generates a common mode valid indication ($CM_{VALID}$) responsive to determining no common mode error. For example, the common mode error detection circuitry 1116 determines there is no common mode error responsive to the outputs of the comparison outputs of the comparator circuitry 920, 940 being different at the common mode time of either of the V-D circuitry 110, 150. The common mode error detection circuitry 1116 supplies the common mode valid indication to the threshold comparison circuitry 1130.

The common mode error detection circuitry 1116 generates a common mode invalid indication ($CM_{INVALID}$) responsive to detecting a common mode error. For example, the common mode error detection circuitry 1116 determines there is a common mode error responsive to the outputs of the comparison outputs of the comparator circuitry 920, 940 being the same at the common mode time of either of the V-D circuitry 110, 150. The common mode error detection circuitry 1116 supplies the common mode invalid indication to comparator delay controller circuitry 1118. In some examples, the common mode error detection circuitry 1116 supplies the comparison outputs and the common mode invalid indication to the comparator delay controller circuitry 1118. In some examples, the common mode error detection circuitry 1116 is instantiated by programmable circuitry executing common mode error detection instructions and/or perform operations such as those represented by the flowchart of FIGS. 12A and 12B.

The comparator delay controller circuitry 1118 has an input coupled to the common mode error detection circuitry 1116. The comparator delay controller circuitry 1118 has outputs coupled to the comparator trim circuitry 1122, 1124, 1126. The comparator delay controller circuitry 1118 receives the common mode invalid indication from the common mode error detection circuitry 1116. The comparator delay controller circuitry 1118 controls the variable delays of the delay circuitries 910, 915, 930, 935, 950, 955 of FIG. 9 responsive to setting trim code values of the common mode trim circuitry 1120. The comparator delay controller circuitry 1118 adjusts the delays of the delay circuitries 910, 915, 930, 935, 950, 955 responsive to the common mode invalid indication. In some examples, the comparator delay controller circuitry 1118 is instantiated by programmable circuitry executing comparator delay controller instructions and/or perform operations such as those represented by the flowchart of FIGS. 12A and 12B.

The common mode trim circuitry 1120 has inputs coupled to the comparator delay controller circuitry 1118. In the example of FIG. 11, the common mode trim circuitry 1120 includes the comparator trim circuitry 1122, 1124, 1126. The comparator trim circuitry 1122 is to be coupled to the variable delay circuitry 905 of FIG. 9. The comparator trim circuitry 1124 is to be coupled to the variable delay circuitry 925 of FIG. 9. The comparator trim circuitry 1126 is to be coupled to the variable delay circuitry 945 of FIG. 9. The comparator trim circuitry 1122, 1124, 1126 set the delays of the delay circuitry 910, 915, 930, 935, 950, 955 responsive to trim code values from the comparator delay controller circuitry 1118. In some examples, the comparator delay controller circuitry 1118 adjusts the delays of one or more delays of the delay circuitry 910, 915, 930, 935, 950, 955 responsive to the common mode error detection circuitry 1116 detecting a common mode error. In such examples, the comparator delay controller circuitry 1120 reduces the likelihood of the common mode errors between delays from the V-D circuitry 110, 150. Advantageously, the common mode trim circuitry 1120 allows the trim circuitry 130 to reduce likelihood of common mode errors affecting calibration operations.

The comparison circuitry 1128 has inputs coupled to the threshold sweep circuitry 1104, the common mode error detection circuitry 1116, and that may be coupled to the time domain converter circuitry 120 and the comparator circuitry 160. The comparison circuitry 1128 has outputs coupled to threshold sweep circuitry 1104, the offset correction circuitry 1136, the shift correction circuitry 1144, and the mismatch correction circuitry 1146. In the example of FIG. 11, the comparison circuitry 1128 includes the threshold comparison circuitry 1130, the accumulation circuitry 1132, and the threshold error determination circuitry 1134. The comparison circuitry 1128 compares the comparison outputs from the comparator circuitry 160 to bits of the digital output value to determine accuracies of thresholds of the time domain converter circuitry 120. The comparison circuitry 1128 compares the determined inaccuracies to determine a calibration operation to improve accuracy of the time domain converter circuitry 120. The comparison circuitry 1128 generates one or more of an offset correction indication, a shift correction indication, and/or a mismatch correction indication responsive to determining a calibration operation.

The threshold comparison circuitry 1130 has a first input coupled to the common mode error detection circuitry 1116, a second input coupled to the threshold sweep circuitry 1104, a third input that may be coupled to the time domain converter circuitry 120, and a fourth input that may be coupled to the comparator circuitry 160 of FIGS. 1 and 9. The threshold comparison circuitry 1130 has an output coupled to the accumulation circuitry 1132. The threshold comparison circuitry 1130 receives the digital output code from the time domain converter circuitry 120, the comparison outputs from the comparator circuitry 160, the threshold value indication from the threshold sweep circuitry 1104, and the common mode valid indication from the common mode error detection circuitry 1116.

The threshold comparison circuitry 1130 determines whether or not to compare the comparison outputs to the digital output code responsive to the common mode valid indication. When the common mode valid indication indicates that the common mode error detection circuitry 1116 is detecting a common mode error, the threshold comparison circuitry 1130 delays comparing the comparison outputs to the digital output code. When the common mode valid indication indicates that the common mode error detection circuitry 1116 is not detecting a common mode error, the threshold comparison circuitry 1130 compares the comparison outputs to the digital output code. Advantageously, the threshold comparison circuitry 1130 delays calibration operations until the common mode error detection circuitry 1116 no longer detects common mode errors.

The threshold comparison circuitry 1130 determines to compare the sign bits of the time domain converter circuitry 120 to the comparison outputs responsive to determining that the threshold being supplied by the threshold sweep circuitry 1104 was used to determine the sign bits. The threshold comparison circuitry 1130 determines which threshold is being tested responsive to the threshold value indication from the threshold sweep circuitry 1104. The threshold comparison circuitry 1130 determines whether the threshold being tested was used to generate the digital output value using related sign bits. The related bits of the digital output code correspond to bits that indicate whether the threshold being tested by the comparator circuitry 160 was tested. In some examples, the threshold comparison circuitry 1130 determines which bit of the digital output code corresponds to the stage being tested to select the related bits of the digital output code. In such examples, the threshold comparison circuitry 1130 uses bits surrounding the determined bit of the digital output code to determine whether the threshold being tested was used to determine the digital output code. For example, when testing the target threshold at the delay duration 770 of FIG. 7, the threshold comparison circuitry 1130 selects the first, second, and third sign bits from the time domain converter circuitry 120 as the related bits.

The threshold comparison circuitry 1130 determines the time domain converter circuitry 120 used the threshold being calibrated in determining the digital output value responsive to the related bits. In some examples, the threshold comparison circuitry 1130 determines values of the related bits that are needed for the time domain converter circuitry 120 to test the threshold of the threshold value indication. For example, when calibrating a target threshold at the delay duration 850 of FIGS. 8A and 8B, the threshold comparison circuitry 1130 selects the and second sign bits from the stage circuitry 225, 240 as related bits. In such an example, the time domain converter circuitry 120 uses the threshold at the delay duration 850 of FIG. 8A when the sign bit of the stage circuitry 225 is a logical zero and the sign bit of the stage circuitry 240 is a logical zero. In such example operations, the threshold comparison circuitry 1130 determines the comparison of the comparison outputs and the digital output value is relevant to calibration operations, when both the first and second sign bits from the time domain converter circuitry 120 are a logical zero.

In another example, when calibrating the stage circuitry 240 and the threshold value indication specifies the target threshold at the delay duration 780 of FIG. 7, the threshold comparison circuitry 1130 determines the sign bits of the stage circuitry 225, 255 are relevant bits. In such an example, the threshold comparison circuitry 1130 determines to use a comparison between the comparison outputs and the digital value responsive to the sign bit from the stage circuitry 225 being a logical one and the sign bit from the stage circuitry 255. In such example operations, the threshold comparison circuitry 1130 compares the sign bit of the stage circuitry 255 to determine the accuracy of the target threshold value of the stage circuitry 240.

The threshold comparison circuitry 1130 supplies a related sign value to the accumulation circuitry 1132 responsive to determining the comparison outputs are comparable to the digital output value. The related sign value is the value of the sign bit corresponding to the threshold being tested by the threshold sweep circuitry 1104. For example, when testing the target threshold at the delay duration 780, the threshold comparison circuitry 1130 supplies the sign bit of the stage circuitry 255 as the related sign value. In another example, when the target threshold at the target delay duration threshold 665 of FIG. 6C is being tested, the threshold comparison circuitry 1130 supplies the value of the sign bit of the stage circuitry 225 as the related sign value.

The threshold comparison circuitry 1130 supplies a comparator sign value to the accumulation circuitry 1132 responsive to determining the comparison outputs are comparable to the digital output value. The comparator sign value is the value of the reference comparison represented by the comparison outputs. In some examples, the threshold comparison circuitry 1130 supplies the comparison output from the comparator circuitry 920 as the comparator sign value. For example, when testing the target threshold corresponds to the delay duration 1012 of FIG. 10A and the V-D circuitry 110 generates the delay duration 1006 of FIG. 10A, the threshold comparison circuitry 1130 supplies a logical one as the comparator sign value. In such an example, the comparator sign value being a logical one represents the delay duration from the V-D circuitry 110 being greater than the delay duration from the V-D circuitry 150. In another example, when testing the target threshold corresponds to the delay duration 1042 of FIG. 10B and the V-D circuitry 110 generates the delay duration 1036 of FIG. 10B, the threshold comparison circuitry 1130 supplies a logical zero as the comparator sign value. In such an example, the comparator sign value being a logical zero represents the delay duration from the V-D circuitry 110 being less than the delay duration from the V-D circuitry 150. In some examples, the threshold comparison circuitry 1130 is instantiated by programmable circuitry executing threshold comparison instructions and/or perform operations such as those represented by the flowchart of FIGS. 12A and 12B.

The accumulation circuitry 1132 has a first and second input coupled to the threshold comparison circuitry 1130 and a third input coupled to the threshold sweep circuitry 1104. The accumulation circuitry 1132 has a first output coupled to the threshold sweep circuitry 1104 and a second output coupled to the threshold error determination circuitry 1134. The accumulation circuitry 1132 receives the threshold value indication from the threshold sweep circuitry 1104 and the related and comparator sign values from the threshold comparison circuitry 1130.

The accumulation circuitry 1132 generates a target value (TAR) and an accumulated value (ACCUM) responsive to a plurality of related and comparator sign values. The accumulation circuitry 1132 increments the target value responsive to the comparator sign value being a logical one. The accumulation circuitry 1132 increments the accumulated value responsive to the comparator sign value being a logical one. When calibrated, the target value and the accumulated value are approximately equal. However, variations between the target value and the accumulated value represent mismatches between the target threshold and the actual threshold of the time domain converter circuitry 120. The accumulation circuitry 1132 supplies the target value and the accumulated value to the threshold error determination circuitry 1134 after an N number of related and comparator sign values have been received.

The accumulation circuitry 1132 resets the target value and the accumulated value responsive to the threshold sweep circuitry 1104 adjusting the threshold value indication. Such example operations represent the threshold sweep circuitry 1104 adjusting the threshold being tested. The accumulation circuitry 1132 generates the hold indication to prevent the threshold sweep circuitry 1104 from adjusting the threshold being tested. The accumulation circuitry 1132 clears the hold indication responsive to supplying the target and accumulated values to the threshold error determination circuitry 1134. In some examples, such as retesting threshold values, the accumulation circuitry 1132 may reset the target and accumulated values responsive to supplying the target and accumulated values to the threshold error determination circuitry 1134. In some examples, the accumulation circuitry 1132 is instantiated by programmable circuitry executing accumulation instructions and/or perform operations such as those represented by the flowchart of FIGS. 12A and 12B.

The threshold error determination circuitry 1134 has a first input coupled to the threshold sweep circuitry 1104 and a second and third input coupled to the accumulation circuitry 1132. The threshold error determination circuitry 1134 has a first output coupled to the threshold sweep circuitry 1104, a second output coupled to the offset correction circuitry 1136, a third output coupled to the shift correction circuitry 1144, and a fourth output coupled to the mismatch correction circuitry 1146. The threshold error determination circuitry 1134 receives the threshold value indication from the threshold sweep circuitry 1104 and the target and accumulated values from the accumulation circuitry 1132.

The threshold error determination circuitry 1134 determines whether calibration operations are needed to calibrate the time domain converter circuitry 120 responsive to comparing the target and accumulated values for one or more threshold values. The threshold error determination circuitry 1134 determines to perform calibration operations responsive to differences between the target and accumulated values. In some examples, the threshold error determination circuitry 1134 may determine to perform calibration operations when the differences between the target and accumulated values are greater than a threshold value. In such examples, the threshold value prevents the threshold error determination circuitry 1134 from attempting to calibrate differences less than the threshold value.

When the threshold error determination circuitry 1134 receives target and accumulated values, the threshold error determination circuitry 1134 determines whether target and accumulated values have been determined for all threshold value of the stage being tested. For example, the threshold error determination circuitry 1134 stores target and accumulated values for each threshold of one of the stage thresholds 1108, 1110, 1112, 1114. The threshold error determination circuitry 1134 determines a difference between each instance of the target and accumulated values responsive to determining that all thresholds of a stage have been tested. For example, the threshold error determination circuitry 1134 compares target and accumulated values for each of the thresholds of the stage circuitry 240, 255.

The threshold error determination circuitry 1134 may generate one or more of an offset correction value, a shift correction value, and/or a mismatch correction value responsive to comparing the target and accumulated values for thresholds of the stage circuitry 225, 240, 255. Unlike the stage circuitry 240, 255, the threshold error determination circuitry 1134 calibrates the stage circuitry 225 to correct offset using the delay circuitry 210, 215 and differences between target and actual thresholds to match the maximum and minimum delays of the V-D circuitry 110.

When calibrating the stage circuitry 225, the threshold error determination circuitry 1134 compares the target and accumulated values that correspond to the threshold value at the target delay duration threshold 665. The threshold error determination circuitry 1134 generates the offset correction value responsive to determining a difference between the target and accumulated values greater than a threshold value. The threshold error determination circuitry 1134 sets the offset correction value to a first value when the target value is greater than the accumulated value and a second value when the target value is less than the accumulated value. For example, the first value represents the threshold error determination circuitry 1134 determining the stage circuitry 225 has a threshold at a delay duration greater than the target delay duration threshold 665. In such an example, the second value represents the threshold error determination circuitry 1134 determining the stage circuitry has a threshold at a delay duration less than the target delay duration threshold 665, such as in FIG. 6C. The threshold error determination circuitry 1134 supplies the offset correction value to the offset correction circuitry 1136. Advantageously, the threshold error determination circuitry 1134 determines an offset error of the stage circuitry 225, which may be reduced by calibrating delays of the delay circuitry 210, 215.

When calibrating the stage circuitry 225, the threshold error determination circuitry 1134 compares the target and accumulated values that correspond to the target threshold values at the delay durations 630, 635 of FIGS. 6A, 6B, and 6C. The threshold error determination circuitry 1134 generates the shift correction value responsive to determining differences between both sets of the target and accumulated values that are greater than the threshold value. Such example operations occur responsive to the operations illustrated in FIG. 6A. The threshold error determination circuitry 1134 sets the shift correction value to a first value responsive to both sets of the target and accumulated values having differences greater than the threshold value. For example, the first value represents the threshold error determination circuitry 1134 determining the stage circuitry 225 has the delay profile 605 of FIG. 6A. The threshold error determination circuitry 1134 supplies the shift correction value to the shift correction circuitry 1144.

When calibrating the stage circuitry 225, the threshold error determination circuitry 1134 compares the target and accumulated values that correspond to the target threshold values at the delay durations 630, 635 of FIGS. 6A, 6B, and 6C. The threshold error determination circuitry 1134 generates the mismatch correction value responsive to determining differences between one set of the target and accumulated values is greater than the threshold value. Such example operations occur responsive to the operations illustrated in FIG. 6B. In such an example, the threshold error determination circuitry 1134 determines a difference between the target and accumulated values corresponding to the minimum threshold of the stage circuitry 225. The threshold error determination circuitry 1134 sets the mismatch correction value to a first value responsive to the threshold error determination circuitry 1134 determining the mismatch correction is an m-side mismatch. For example, the mismatch between the delay profiles 610, 640 of FIG. 6B. In such examples, adjusting the m-side components of the stage circuitry 225 reduces the differences between the target and accumulated values. The threshold error determination circuitry 1134 sets the mismatch correction value to a second value responsive to the threshold error determination circuitry 1134 determining the mismatch correction is a p-side mismatch. For example, the difference between values is for the one of the sets of target and accumulated values corresponding to the maximum threshold of the stage circuitry 225. The threshold error determination circuitry 1134 supplies the mismatch correction value to the mismatch correction circuitry 1146.

After calibrating the stage circuitry 225, the threshold error determination circuitry 1134 uses the shift and mismatch correction values to calibrate the remaining instances of the stage circuitry 240, 255. When calibrating the instances of the stage circuitry 240, 255, the threshold error determination circuitry 1134 compares the target and accumulated values that correspond to the target threshold values of one of the stage thresholds 1110, 1112, 1114.

For the stage circuitry 240, the threshold error determination circuitry 1134 determines the target and accumulated values for each of the target thresholds at the delay durations 770, 780 of FIG. 7. In such example operations, when the stage circuitry 240 has one of the delay profiles 710, 720, the threshold error determination circuitry 1134 generates a shift correction value to calibrate the stage circuitry 240. For example, the threshold error determination circuitry 1134 sets the shift correction value to a value that represents a shift operation is needed.

For the stage circuitry 255, the threshold error determination circuitry 1134 determines the target and accumulated values for each of the target thresholds at the delay durations 845, 850, 855, 860 of FIGS. 8A and 8B. In example operations, when the stage circuitry 255 has the delay profiles 805, 810 of FIG. 8A, the threshold error determination circuitry 1134 generates a mismatch correction value to calibrate the stage circuitry 255. For example, the threshold error determination circuitry 1134 sets the mismatch correction value to a value that represents a mismatch between the p-side and m-side components. In such examples, a first value represents p-side mismatch and a second value represents m-side mismatch. In another example operations, when the stage circuitry 255 has delay profiles 865, 870 of FIG. 8B, the threshold error determination circuitry 1134 generates a shift correction value to calibrate the stage circuitry 255.

In some examples, the threshold error determination circuitry 1134 generates a retest indication (RETEST) responsive to generating one of the offset correction value, the shift correction value, or the mismatch correction value. The threshold sweep circuitry 1104 resupplies the threshold values for the stage circuitry responsive to the retest indication. The threshold error determination circuitry 1134 may continue to set the retest indication until the target and accumulated values for each threshold value are calibrated. Advantageously, the threshold error determination circuitry 1134 may reduce error by iteratively testing the threshold values. In some examples, the threshold error determination circuitry 1134 is instantiated by programmable circuitry executing threshold error determination instructions and/or perform operations such as those represented by the flowchart of FIGS. 12A and 12B.

The offset correction circuitry 1136 has an input coupled to the threshold error determination circuitry 1134 and an output coupled to the delay trim circuitry 1138, 1140, 1142. The offset correction circuitry 1136 receives the offset correction value from the threshold error determination circuitry 1134. The offset correction circuitry 1136 controls delays of the variable delay circuitry 205 of FIGS. 2 and 9 by setting trim values of the input delay trim circuitry 1138. The offset correction circuitry 1136 adjusts the delay trim circuitry 1140, 1142 responsive to the offset correction value. The offset correction circuitry 1136 adjusts the delay of the delay circuitry 210 using the delay trim circuitry 1140 and the delay of the delay circuitry 215 using the delay trim circuitry 1140. In some examples, the delay trim circuitry 1140, 1142 store and/or implement trim code values to set the delays of the delay circuitry 210, 215.

In example operations, the offset correction circuitry 1136 adjusts the delay trim circuitry 1140, 1142 to increase or decrease the delays of the delay circuitry 210, 215. In some examples, the offset correction circuitry 1136 increases the delays of the delay circuitry 210, 215 when the offset correction value is a first value and decreases the delays of the delay circuitry 210, 215 when the correction value is a second value. In such examples, the first value of the offset correction value right shifts the threshold value of the stage circuitry 225 and the second value of the offset correction value left shifts the threshold value of the stage circuitry 225. Advantageously, the offset correction circuitry 1136 decreases offset error of the stage circuitry 225 by adjusting the delay trim circuitry 1140, 1142. In some examples, the offset correction circuitry 1136 is instantiated by programmable circuitry executing offset correction instructions and/or perform operations such as those represented by the flowchart of FIGS. 12A and 12B.

The shift correction circuitry 1144 has a first input coupled to the stage sweep circuitry 1102, a second input coupled to the threshold error determination circuitry 1134, and an output coupled to the stage trim circuitry 1148, 1166, 1168. The shift correction circuitry 1144 receives the stage indication from the stage sweep circuitry 1102 and the shift correction value from the threshold error determination circuitry 1134. The shift correction circuitry 1144 adjusts trim code values of one or more of the stage trim circuitry 1148, 1166, 1168 responsive to the shift correction value. In example operations, shift errors between target thresholds and actual thresholds result from mismatches between circuitry of the stage circuitry 225, 240, 255. For example, the shift error between the delay profiles 605, 610 results from mismatches between delays of the comparator circuitry 230 of FIG. 2 and the logic device 235 of FIG. 2. The shift correction circuitry 1144 may shift the delay profile of the stage circuitry 225 from the delay profile 605 to the target delay profile 610 by adjusting trim values of the stage trim circuitry 1148 to correct for mismatch.

The shift correction circuitry 1144 selects one of the stage trim circuitry 1148, 1166, 1168 to modify responsive to the stage indication. For example, the shift correction circuitry 1144 determines to adjust the stage trim circuitry 1148 responsive to the stage indication corresponding to the stage circuitry 225. In such an example, the shift correction circuitry 1144 shifts the delay profile of the stage circuitry 225, such as in FIG. 6A.

In example operations, the shift correction circuitry 1144 reduces the shift errors by increasing and/or decreasing delays of the comparator circuitry 230 or the logic device 235 using the comparator trim circuitry 1150 and/or the logic device trim circuitry 1160. In such example operations, the shift correction circuitry 1144 adjusts trim code values of the trim circuitry 1152, 1154, 1156, 1158 to increase or decrease the delay of the comparator circuitry 230 and/or adjusts the trim code values of the trim circuitry 1162, 1164 to increase or decrease the delay of the logic device 235. In some examples, the shift correction circuitry 1144 determines whether to increase or decrease the delays of the comparator circuitry 230 or the logic device 235 responsive to the value of the shift correction value. For example, the shift correction circuitry 1144 increases the delay of the comparator circuitry 230 and decreases the delay of the logic device 235 responsive to the shift correction value being a first value. In such an example, the shift correction circuitry 1144 decreases the delay of the comparator circuitry 230 and increases the delay of the logic device 235 responsive to the shift correction value being a second value. Further, the shift correction circuitry 1144 increases the delay of the comparator circuitry 230 responsive to the shift correction value being a third value and decreases the delay of the comparator circuitry 230 responsive to the shift correction value being a fourth value. Alternatively, the shift correction circuitry 1144 may perform any combination of adjusting the trim values of the trim circuitry 1152, 1154, 1156, 1158, 1162, 1164 to shift the delay profile of the stage circuitry 225. In the example of FIG. 11, example operations of the shift correction circuitry 1144 are described in connection with the stage trim circuitry 1148. However, the operations of the shift correction circuitry 1144 may reduce shift error in any of the stage trim circuitry 1148, 1166, 1168. In some examples, the shift correction circuitry 1144 is instantiated by programmable circuitry executing shift correction instructions and/or perform operations such as those represented by the flowchart of FIGS. 12A and 12B.

The mismatch correction circuitry 1146 has a first input coupled to the stage sweep circuitry 1102, a second input coupled to the threshold error determination circuitry 1134, and an output coupled to the stage trim circuitry 1148, 1166, 1168. The mismatch correction circuitry 1146 receives the stage indication from the stage sweep circuitry 1102 and the mismatch correction value from the threshold error determination circuitry 1134. The mismatch correction circuitry 1146 adjusts trim code values of one or more of the stage trim circuitry 1148, 1166, 1168 responsive to the mismatch correction value. In example operations, mismatch errors between target thresholds and actual thresholds result from p and m side mismatches between the comparator circuitry 230, 245, 260 of the stage circuitry 225, 240, 255. For example, the m-side mismatch error between the delay profiles 640, 610 result from mismatches between delays of the capacitors 352, 356 of FIG. 3 and/or the transistors 360, 368 of FIG. 3. The mismatch correction circuitry 1146 may adjust either the p-side or m-side circuitry of the comparator circuitry 300 of FIG. 3 to adjust the stage circuitry 225. In some examples, the p-side circuitry includes the capacitor 356 and the transistor 360 and the m-side circuitry includes the capacitor 352 and the transistor 368. The mismatch correction circuitry 1146 may adjust the delay profile 640 to the target delay profile 610 by adjusting trim values of the stage trim circuitry 1148 to correct for mismatch delays of the p-side circuitry and delays of the m-side circuitry.

The mismatch correction circuitry 1146 selects one of the stage trim circuitry 1148, 1166, 1168 to modify responsive to the stage indication. For example, the mismatch correction circuitry 1146 determines to adjust the stage trim circuitry 1148 responsive to the stage indication corresponding to the stage circuitry 225. In such an example, the mismatch correction circuitry 1146 shifts the delay profile of the stage circuitry 225, such as in FIG. 6B.

In example operations, the mismatch correction circuitry 1146 reduces the mismatch errors by increasing and/or decreasing delays of the comparator circuitry 230 using the comparator trim circuitry 1150. In such example operations, the mismatch correction circuitry 1146 adjusts trim code values of the trim circuitry 1152, 1156, to increase or decrease the delay of the m-side circuitry and/or adjusts the trim code values of the trim circuitry 1154, 1158 to increase or decrease the delay of the p-side circuitry. In some examples, the mismatch correction circuitry 1146 determines whether to increase or decrease the delays of the p-side or m-side circuitry responsive to the value of the mismatch correction value. For example, the mismatch correction circuitry 1146 increases the delay of the p-side circuitry and decreases the delay of the m-side circuitry responsive to the mismatch correction value being a first value. In such an example, the mismatch correction circuitry 1146 decreases the delay of the p-side circuitry and increases the delay of the m-side circuitry responsive to the mismatch correction value being a second value. Further, the mismatch correction circuitry 1146 increases the delay of the p-side circuitry responsive to the mismatch correction value being a third value and decreases the delay of the p-side circuitry responsive to the mismatch correction value being a fourth value. Alternatively, the mismatch correction circuitry 1146 may perform any combination of adjusting the trim values of the trim circuitry 1152, 1154, 1156, 1158, 1162, 1164 to adjust the delay profile of the stage circuitry 225 for mismatch. In the example of FIG. 11, example operations of the mismatch correction circuitry 1146 are described in connection with the stage trim circuitry 1148. However, the operations of the mismatch correction circuitry 1146 may reduce mismatch error in any of the stage trim circuitry 1148, 1166, 1168. In some examples, the mismatch correction circuitry 1146 is instantiated by programmable circuitry executing mismatch correction instructions and/or perform operations such as those represented by the flowchart of FIGS. 12A and 12B.

Figure 12A:
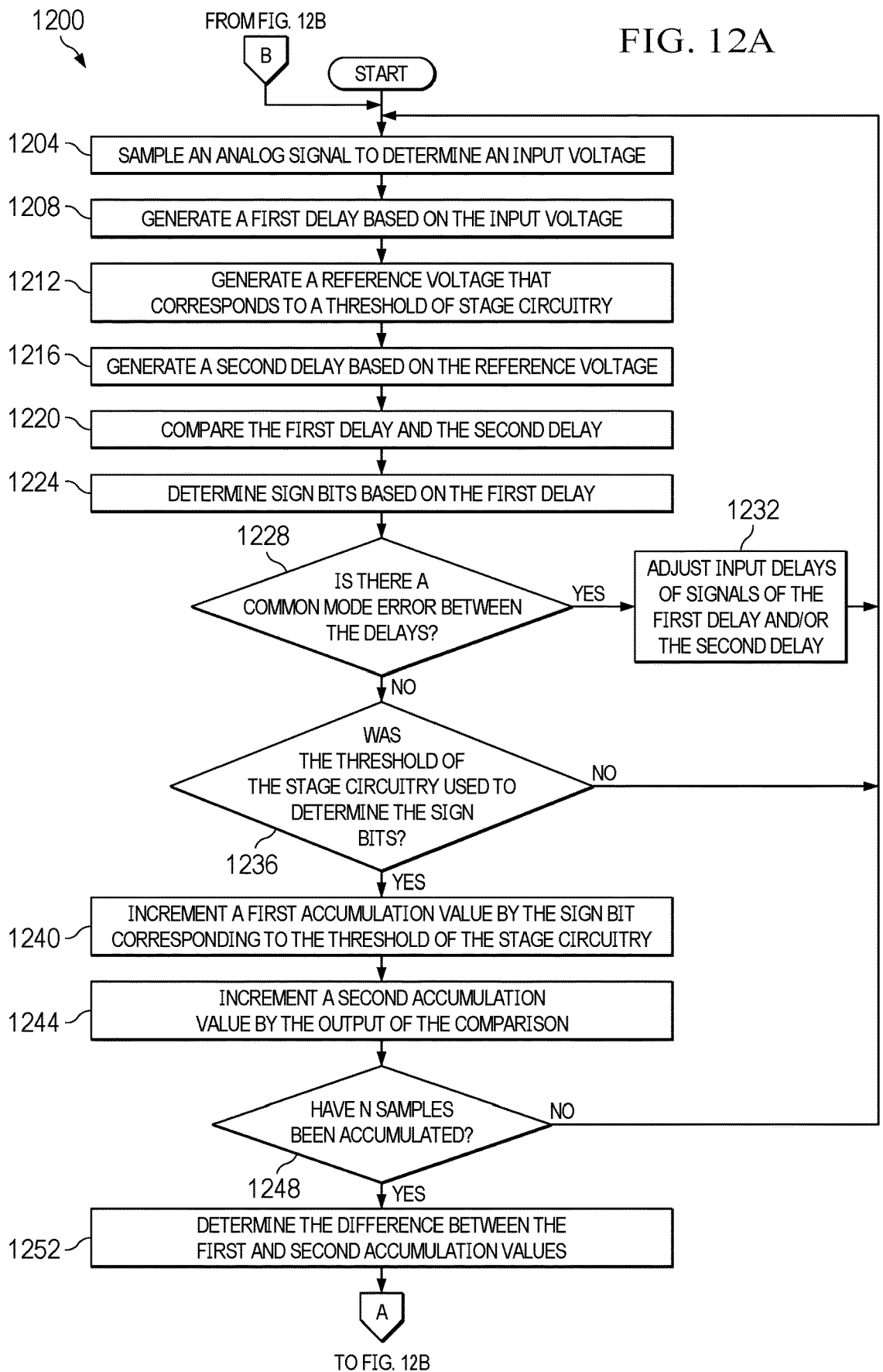
FIGS. 12A and 12B form a flowchart representative of example machine-readable instructions and/or example operations that implement the trim circuitry of FIGS. 1 and 11 and/or more generally to calibrate the ADC circuitry of FIG. 1.
Figure 12B:
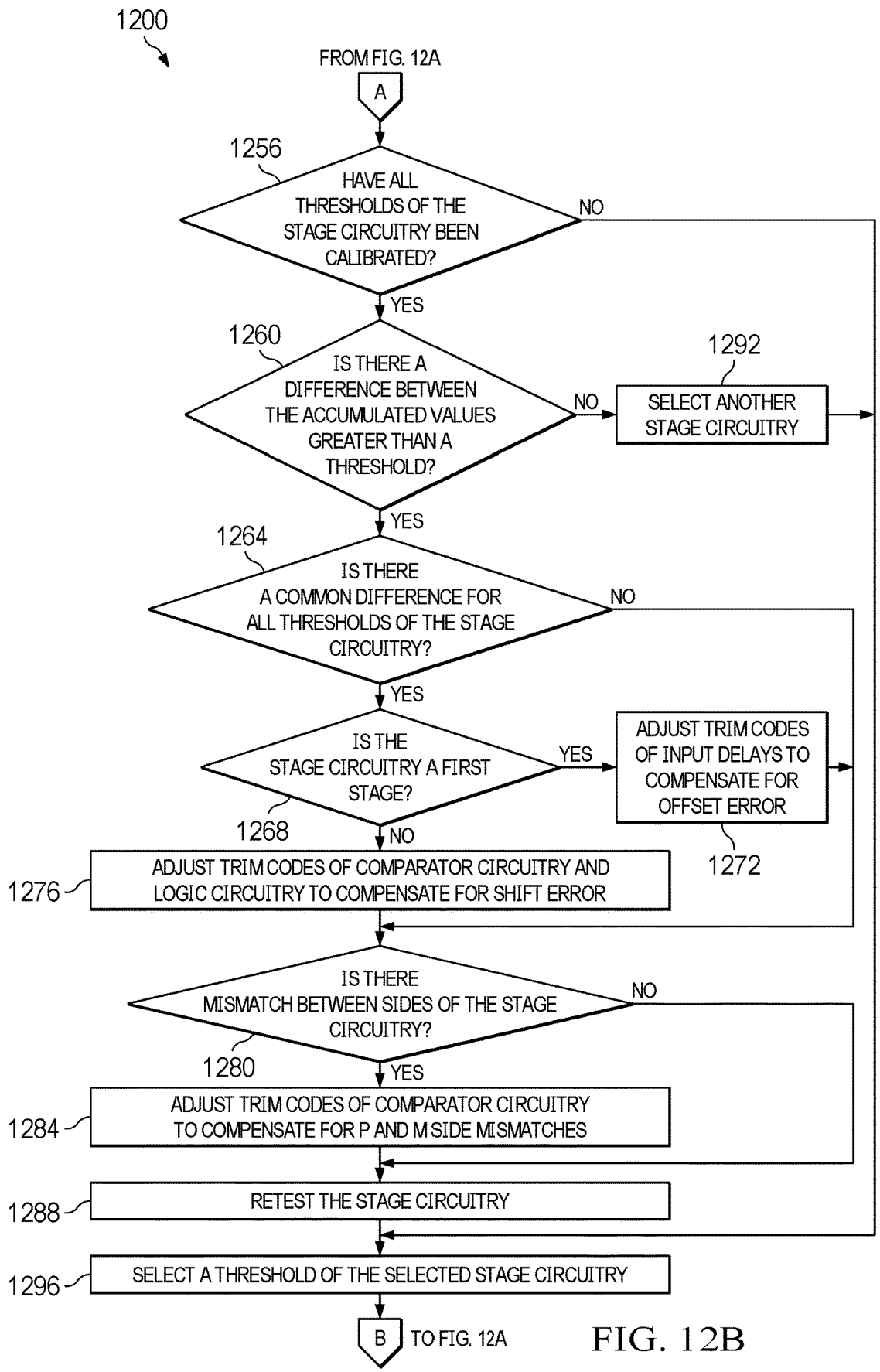

FIGS. 12A and 12B are a flowchart representative of example machine-readable instructions and/or example operations 1200 that may be executed, instantiated, and/or performed using an example programmable circuitry implementation of the trim circuitry 130 of FIGS. 1, 9, and 11 and/or more generally to calibrate the ADC circuitry 100 of FIG. 1. The operations 1200 begin at Block 1204, at which, the V-D circuitry 110 of FIG. 1 samples an analog input signal to determine an input voltage. (Block 1204). In some examples, the V-D circuitry 110 periodically samples the analog input signal to generate an input delay duration, which the time domain converter circuitry 120 converts to a digital output value. In some such examples, the sampling frequency of the V-D circuitry 110 represents the conversion speed of the ADC circuitry 100.

The V-D circuitry 110 generates a first delay based on the input voltage. (Block 1208). In some examples, the V-D circuitry 110 generates an input delay duration by adjusting the duty cycle of first and second signals responsive to the analog value of the sampled input voltage. For example, the V-D circuitry 110 generates the delay duration 530 of FIG. 5A by increasing the duty cycle of the plus delay signal 510 of FIG. 5A and decreasing the duty cycle of the minus delay signal 520 of FIG. 5A.

The DAC 140 of FIG. 1 generates a reference voltage that corresponds to a threshold of stage circuitry. (Block 1212). In some examples, the threshold sweep circuitry 1104 supplies a digital input code to the DAC 140. In such examples, the threshold sweep circuitry 1104 selects the digital input code based on the target delay duration thresholds of the storage 1106 of FIG. 11.

The V-D circuitry 150 of FIG. 1 generates a second delay based on the reference voltage. (Block 1216). In some examples, the DAC 140 supplies the reference voltage to the V-D circuitry 150 to generate a reference delay duration that corresponds to the target delay duration threshold selected by the threshold sweep circuitry 1104. In such examples, the reference delay duration represents a target delay duration of the time domain converter circuitry 120.

The comparator circuitry 160 of FIGS. 1 and 9 compares the first delay and the second delay. (Block 1220). In some examples, the comparator circuitry 160 uses a plurality of comparators, such as the comparator circuitry 920, 940, 960 of FIG. 9, to compare signals that form both the input delay duration and the reference delay duration. In such examples, the comparison outputs of the comparison outputs of the comparator circuitry 920, 940, 960 represent a target sign bit of the digital output value from the time domain converter circuitry 120.

The time domain converter circuitry 120 of FIGS. 1, 2, and 9 determines sign bits based on the first delay. (Block 1224). In some examples, the V-D circuitry 110 supplies the input delay duration to the time domain converter circuitry 120 to generate a digital output value that represents the analog input. In such examples, the time domain converter circuitry 120 uses the stage circuitry 225, 240, 255 of FIG. 2 to compare the input delay duration to delay duration thresholds. The sign bits represent the outputs of the comparison by each of the stage circuitry 225, 240, 255.

The common mode error detection circuitry 1116 of FIG. 11 determines if there is a common mode error between the delays. (Block 1228). In some examples, the common mode error detection circuitry 1116 determines a common mode error when the comparison outputs from the comparator circuitry 920, 940 are equal at a common mode time of the reference delay duration (e.g., at the times 1026, 1028, 1030, 1056, 1058, 1060 of FIGS. 10A and/or 10B). In such an example, the common mode error detection circuitry 1116 prevents the comparison circuitry 1128 of FIG. 11 from using the comparison outputs for calibration operations.

When the common mode error detection circuitry 1116 determines there is a common mode error (e.g., Block 1228 returns a result of YES), the comparator delay controller circuitry 1118 of FIG. 11 adjusts input delays of signals of the first delay and/or the second delay. (Block 1232). Control proceeds to return to Block 1204. In some examples, the comparator delay controller circuitry 1118 adjusts one or more of the trim codes of the delay circuitry 910, 915, 930, 935, 950, 955 of FIG. 9 to modify the delays at the inputs of the comparator circuitry 160. In such examples, the comparator delay controller circuitry 1118 uses the comparison outputs from the comparator circuitry 920, 940, 960 to determine a value to adjust the trim codes.

When the common mode error detection circuitry 1116 determines there is not a common mode error (e.g., Block 1228 returns a result of NO), the threshold comparison circuitry 1130 of FIG. 11 determines if the threshold of the stage circuitry was used to determine the sign bits. (Block 1236). In some examples, the threshold comparison circuitry 1130 determines the sign bit that corresponds to the target delay duration threshold. In such examples, the threshold comparison circuitry 1130 determines any additional bits needed to determine whether the time domain converter circuitry 120 used the delay duration threshold corresponding to the target delay duration threshold being tested. If the threshold comparison circuitry 1130 determines that the threshold of the stage circuitry was not used to determine the sign bits (e.g., Block 1236 returns a result of NO), control proceeds to return to Block 1204.

If the threshold comparison circuitry 1130 determines that the threshold of the stage circuitry was used to determine the sign bits (e.g., Block 1236 returns a result of YES), the accumulation circuitry 1132 of FIG. 11 increments a first accumulation value by the sign bit corresponding to the threshold of the stage circuitry. (Block 1240). In some examples, the accumulation circuitry 1132 generates the accumulated value by incrementing the previous value of the accumulated value by the value of the sign bit corresponding to the delay duration threshold being tested. In such examples, the accumulated value represents the values determined by the time domain converter circuitry 120.

The accumulation circuitry 1132 increments a second accumulation value by the output of the comparison. (Block 1244). In some examples, the accumulation circuitry 1132 generates the target value by incrementing the previous value of the target value by the value of the comparison output from the comparator circuitry 160. In such examples, the target value represents the values determined by the comparator circuitry 160.

The accumulation circuitry 1132 determines if an N number of samples have been accumulated. (Block 1248). In some examples, the accumulation circuitry 1132 continues to modify the accumulated value and the target value until a plurality of samples have been tested for the delay duration threshold being tested. If the accumulation circuitry 1132 determines the N number of sample have not been accumulated (e.g., Block 1248 returns a result of NO), control proceeds to return to Block 1204.

If the accumulation circuitry 1132 determines the N number of sample have been accumulated (e.g., Block 1248 returns a result of YES), the threshold error determination circuitry 1134 of FIG. 11 determines the difference between the first and second accumulation values. (Block 1252). In some examples, the threshold error determination circuitry 1134 determines the accuracy of the time domain converter circuitry 120 as the difference between the accumulated value and the target value.

Turning now to FIG. 12B, the threshold error determination circuitry 1134 determines if all thresholds of the stage circuitry have been calibrated. (Block 1256). In some examples, the threshold error determination circuitry 1134 needs differences between accumulated values and target values for all thresholds of a given one of the stage circuitry 225, 240, 255 to determine a calibration operation. In such examples, the threshold error determination circuitry 1134 stores differences between accumulated values at each delay duration threshold of a given one of the stage circuitry 225, 240, 255.

If the threshold error determination circuitry 1134 determines that all thresholds of the stage circuitry have been tested (e.g., Block 1256 returns a result of YES), the threshold error determination circuitry 1134 determines if the differences between the accumulated values are greater than a threshold. (Block 1260). In some examples, the threshold error determination circuitry 1134 determines that the delay duration threshold of the time domain converter circuitry 120 is close enough to the target delay duration threshold and does not need to be calibrated. Such example operations prevent the threshold error determination circuitry 1134 from needlessly attempting to calibrate any one of the delay duration thresholds.

If the threshold error determination circuitry 1134 determines the differences between the accumulated values are greater than the threshold (e.g., Block 1260 returns a result of YES), the threshold error determination circuitry 1134 determines if there is a common difference for the thresholds of the stage circuitry. (Block 1264). In some examples, the threshold error determination circuitry 1134 compares differences between each threshold of one of the stage circuitry 225, 240, 255 to determine if there is any common difference. For example, the differences between the delay duration thresholds 660, 665 of FIG. 6C, the delay durations 750, 760, 770, 780 of FIG. 7, or the delay durations 845, 850, 855, 860, 875, 880, 885, 890 of FIG. 8B.

If the threshold error determination circuitry 1134 determines that there are common differences between the thresholds of the stage circuitry (e.g., Block 1264 returns a result of YES), the threshold error determination circuitry 1134 determines if the stage circuitry is a first stage. (Block 1268). In some examples, the threshold error determination circuitry 1134 determines if the determined shared common difference needs to be corrected prior to any of the stage circuitry 225, 240, 255. In such examples, the common differences need to be corrected using the delay circuitry 210, 215 of FIGS. 2 and 9.

If the threshold error determination circuitry 1134 determines that the stage circuitry is first stage circuitry (e.g., Block 1268 returns a result of YES), the offset correction circuitry 1136 of FIG. 11 adjusts trim codes of input delays. (Block 1272). In some examples, the offset correction circuitry 1136 adjusts the delays of the delay circuitry 210, 215 responsive to the sign of the differences. For example, the offset correction circuitry 1136 increases the delays of the delay circuitry 210, 215 responsive to a positive difference between accumulated and target values. Control proceeds to Block 1280.

If the threshold error determination circuitry 1134 determines that the stage circuitry is not first stage circuitry (e.g., Block 1268 returns a result of NO), the shift correction circuitry 1144 of FIG. 11 adjusts trim codes of comparator circuitry and logic circuitry to compensate for shift error. (Block 1276). In some examples, the shift correction circuitry 1144 adjusts the trim values of the comparator circuitry and/or logic circuitry in relation to trim values of the other. In such examples, the shift correction circuitry 1144 adjusts the trim values to reduce differences in delays between the comparator circuitry and the logic device of any given one of the stage circuitry 225, 240, 255.

Control proceeds to Block 1280.

If the threshold error determination circuitry 1134 determines that there are no common differences between the thresholds of the stage circuitry (e.g., Block 1264 returns a result of NO), the threshold error determination circuitry 1134 determines if there is mismatch between sides of the stage circuitry. (Block 1280). In some examples, the threshold error determination circuitry 1134 determines if the differences between the accumulated and target values represent the conditions of FIG. 6A or 8A. In such examples, delay mismatches between p-side and m-side components of the comparator circuitry 300 of FIG. 3 result in mismatch errors.

If the threshold error determination circuitry 1134 determines that there is mismatch between sides of the stage circuitry (e.g., Block 1280 returns a result of YES), the mismatch correction circuitry 1146 of FIG. 11 adjusts the trim codes of comparator circuitry to compensate for P and M side mismatches. (Block 1284). In some examples, the mismatch correction circuitry 1146 adjusts trim codes of the P or M side components of the comparator circuitry 300 to correct for mismatch errors. Control proceeds to Block 1288.

If the threshold error determination circuitry 1134 determines that there is no mismatch between sides of the stage circuitry (e.g., Block 1280 returns a result of NO) or control proceeds from Block 1284, the threshold sweep circuitry 1104 retests thresholds of the stage circuitry. (Block 1288). In some examples, the delay duration thresholds of previous stage circuitry impacts the delay duration thresholds of following stage circuitry. In such examples, the threshold error determination circuitry 1134 retests the delay duration thresholds of the time domain converter circuitry 120 to ensure further calibration operations are not needed. Control proceeds to Block 1296.

If the threshold error determination circuitry 1134 determines the differences between the accumulated values are less than the threshold (e.g., Block 1260 returns a result of NO), the stage sweep circuitry 1102 of FIG. 11 selects another stage circuitry. (Block 1292). In some examples, the stage sweep circuitry 1102 adjusts the stage indication to test thresholds of all stage circuitry of the time domain converter circuitry 120.

If the threshold error determination circuitry 1134 determines that not all thresholds of the stage circuitry have been tested (e.g., Block 1256 returns a result of NO) or control proceeds from one of Blocks 1288, 1292, the threshold sweep circuitry 1104 selects another threshold of the stage circuitry. (Block 1296). In some examples, the threshold sweep circuitry 1104 adjusts the threshold value indication to test all delay duration thresholds of the time domain converter circuitry 120. Control proceeds to return to Block 1204.

Although example methods are described with reference to the flowchart illustrated in FIGS. 12A and 12B, many other methods of implementing the trim circuitry 130 may alternatively be used in this description. For example, the order of execution of the blocks may be changed, and/or some of the blocks described may be changed, eliminated, or combined. Similarly, additional operations may be included in the manufacturing process before, in between, or after the blocks shown in the illustrated examples.

While an example manner of implementing the trim circuitry 130 of FIG. 11 is illustrated in FIG. 11, one or more of the elements, processes, and/or devices illustrated in FIG. 11 may be combined, divided, re-arranged, omitted, eliminated, and/or implemented in any other way. Further, the circuitry 1102, 1104, 1116, 1118, 1128, 1130, 1132, 1134, 1136, 1144, 1146, and/or, more generally, the example trim circuitry 130 of FIG. 11, may be implemented by hardware alone or by hardware in combination with software and/or firmware. Thus, for example, any of the circuitry 1102, 1104, 1116, 1118, 1128, 1130, 1132, 1134, 1136, 1144, 1146, and/or, more generally, the example trim circuitry 130 of FIG. 11, could be implemented by programmable circuitry in combination with machine-readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), and/or field programmable logic device(s) (FPLD(s)) such as FPGAs. Further still, the example trim circuitry 130 of FIG. 11 may include one or more elements, processes, and/or devices in addition to, or instead of, those illustrated in FIG. 11, and/or may include more than one of any or all of the illustrated elements, processes and devices.

Flowchart(s) representative of example machine-readable instructions, which may be executed by programmable circuitry to implement and/or instantiate the trim circuitry 130 of FIG. 11 and/or representative of example operations which may be performed by programmable circuitry to implement and/or instantiate the trim circuitry 130 of FIG. 11, are shown in FIGS. 12A and 12B. The machine-readable instructions may be one or more executable programs or portion(s) of one or more executable programs for execution by programmable circuitry such as the programmable circuitry 1312 shown in the example processor platform 1300 described below in connection with FIG. 13 and/or may be one or more function(s) or portion(s) of functions to be performed by the example programmable circuitry (e.g., an FPGA) described below in connection with FIGS. 14 and/or 15. In some examples, the machine-readable instructions cause an operation, a task, etc., to be carried out and/or performed in an automated manner in the real world. As used herein, "automated" means without human involvement.

The program may be embodied in instructions (e.g., software and/or firmware) stored on one or more non-transitory computer readable and/or machine-readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), and/or any other storage device or storage disk. The instructions of the non-transitory computer readable and/or machine-readable medium may program and/or be executed by programmable circuitry located in one or more hardware devices, but the entire program and/or parts thereof could alternatively be executed and/or instantiated by one or more hardware devices other than the programmable circuitry and/or embodied in dedicated hardware. The machine-readable instructions may be distributed across multiple hardware devices and/or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart(s) illustrated in FIGS. 12A and 12B, many other methods of implementing the example trim circuitry 130 may alternatively be used. For example, the order of execution of the blocks of the flowchart(s) may be changed, and/or some of the blocks described may be changed, eliminated, or combined. Also or alternatively, any or all of the blocks of the flow chart may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations and/or local to one or more hardware devices (e.g., a single-core processor (e.g., a single core CPU), a multi-core processor (e.g., a multi-core CPU, an XPU, etc.)). For example, the programmable circuitry may be a CPU and/or an FPGA located in the same package (e.g., the same integrated circuit (IC) package or in two or more separate housings), one or more processors in a single machine, multiple processors distributed across multiple servers of a server rack, multiple processors distributed across one or more server racks, etc., and/or any combination(s) thereof.

The machine-readable instructions described herein may be stored in one or more of a compressed format, an encrypted format, a fragmented format, a compiled format, an executable format, a packaged format, etc. Machine-readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, and/or produce machine executable instructions. For example, the machine-readable instructions may be fragmented and stored on one or more storage devices, disks and/or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to be directly readable, interpretable, and/or executable by a computing device and/or other machine. For example, the machine-readable instructions may be stored in multiple parts, which are individually compressed, encrypted, and/or stored on separate computing devices, where the parts when decrypted, decompressed, and/or combined form a set of computer-executable and/or machine executable instructions that implement one or more functions and/or operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, machine-readable, computer readable and/or machine-readable media, as used herein, may include instructions and/or program(s) regardless of the particular format or state of the machine-readable instructions and/or program(s).

The machine-readable instructions described herein can be represented by any past, present, or future instruction language, scripting language, programming language, etc. For example, the machine-readable instructions may be represented using any of the following languages: C, C++, Java, C-Sharp, Perl, Python, JavaScript, HyperText Markup Language (HTML), Structured Query Language (SQL), Swift, etc.

As mentioned above, the example operations of FIGS. 12A and 12B may be implemented using executable instructions (e.g., computer readable and/or machine-readable instructions) stored on one or more non-transitory computer readable and/or machine-readable media. As used herein, the terms non-transitory computer readable medium, non-transitory computer readable storage medium, non-transitory machine-readable medium, and/or non-transitory machine-readable storage medium are expressly defined to include any type of computer readable storage device and/or storage disk and to exclude propagating signals and to exclude transmission media. Examples of such non-transitory computer readable medium, non-transitory computer readable storage medium, non-transitory machine-readable medium, and/or non-transitory machine-readable storage medium include optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms "non-transitory computer readable storage device" and "non-transitory machine-readable storage device" are defined to include any physical (mechanical, magnetic and/or electrical) hardware to retain information for a time period, but to exclude propagating signals and to exclude transmission media. Examples of non-transitory computer readable storage devices and/or non-transitory machine-readable storage devices include random access memory of any type, read only memory of any type, solid state memory, flash memory, optical discs, magnetic disks, disk drives, and/or redundant array of independent disks (RAID) systems. As used herein, the term "device" refers to physical structure such as mechanical and/or electrical equipment, hardware, and/or circuitry that may or may not be configured by computer readable instructions, machine-readable instructions, etc., and/or manufactured to execute computer-readable instructions, machine-readable instructions, etc.

Figure 13:
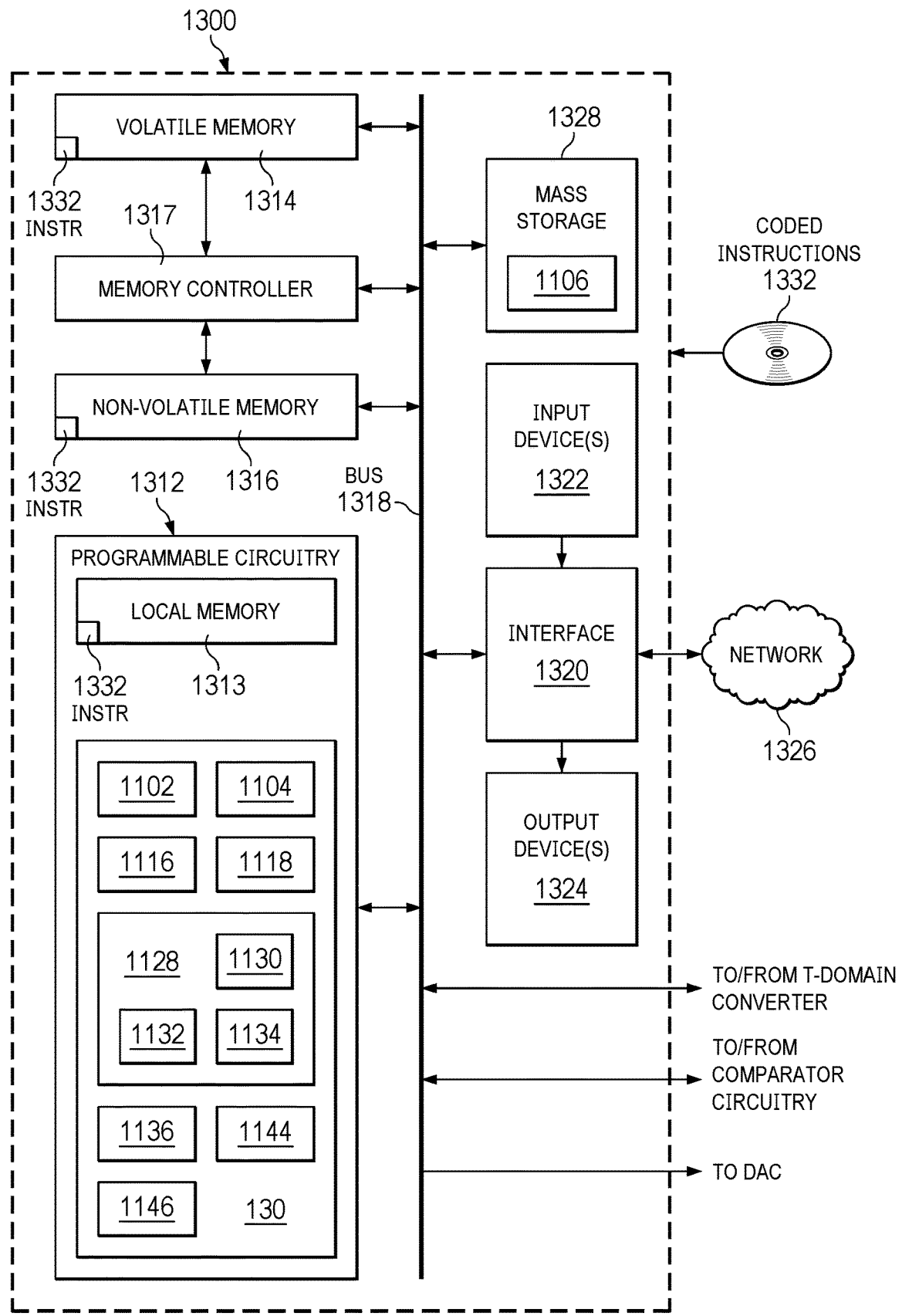
FIG. 13 is a block diagram of an example processing platform including programmable circuitry structured to execute, instantiate, and/or perform the example machine-readable instructions and/or perform the example operations of FIGS. 12A and 12B to implement the trim circuitry 130 of FIG. 11.

FIG. 13 is a block diagram of an example programmable circuitry platform 1300 structured to execute and/or instantiate the example machine-readable instructions and/or the example operations of FIGS. 12A and 12B to implement the trim circuitry 130 of FIG. 11. The programmable circuitry platform 1300 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 1300 of the illustrated example includes programmable circuitry 1312. The programmable circuitry 1312 of the illustrated example is hardware. For example, the programmable circuitry 1312 can be implemented by one or more integrated circuits, logic circuits, FPGAs, microprocessors, CPUs, GPUs, DSPs, and/or microcontrollers from any desired family or manufacturer. The programmable circuitry 1312 may be implemented by one or more semiconductor based (e.g., silicon based) devices. In this example, the programmable circuitry 1312 implements the circuitry 1102, 1104, 1116, 1118, 1128, 1130, 1132, 1134, 1136, 1144, 1146.

The programmable circuitry 1312 of the illustrated example includes a local memory 1313 (e.g., a cache, registers, etc.). The programmable circuitry 1312 of the illustrated example is in communication with main memory 1314, 1316, which includes a volatile memory 1314 and a non-volatile memory 1316, by a bus 1318. The volatile memory 1314 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1316 may be implemented by flash memory and/or any other desired type of memory device. Access to the main memory 1314, 1316 of the illustrated example is controlled by a memory controller 1317. In some examples, the memory controller 1317 may be implemented by one or more integrated circuits, logic circuits, microcontrollers from any desired family or manufacturer, or any other type of circuitry to manage the flow of data going to and from the main memory 1314, 1316.

The programmable circuitry platform 1300 of the illustrated example also includes interface circuitry 1320. The interface circuitry 1320 may be implemented by hardware in any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 1322 are connected to the interface circuitry 1320. The input device(s) 1322 permit(s) a user (e.g., a human user, a machine user, etc.) to enter data and/or commands into the programmable circuitry 1312. The input device(s) 1322 can be implemented by, for example, an audio sensor, a microphone, a camera (still or video), a keyboard, a button, a mouse, a touchscreen, a trackpad, a trackball, an isopoint device, and/or a voice recognition system.

One or more output devices 1324 are also connected to the interface circuitry 1320 of the illustrated example. The output device(s) 1324 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1320 of the illustrated example, thus, may include a graphics driver card, a graphics driver chip, and/or graphics processor circuitry such as a GPU.

The interface circuitry 1320 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1326. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 1300 of the illustrated example also includes one or more mass storage discs or devices 1328 to store firmware, software, and/or data. Examples of such mass storage discs or devices 1328 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine-readable instructions 1332, which may be implemented by the machine-readable instructions of FIGS. 12A and 12B, may be stored in the mass storage device 1328, in the volatile memory 1314, in the non-volatile memory 1316, and/or on at least one non-transitory computer readable storage medium such as a CD or DVD which may be removable.

Figure 14:
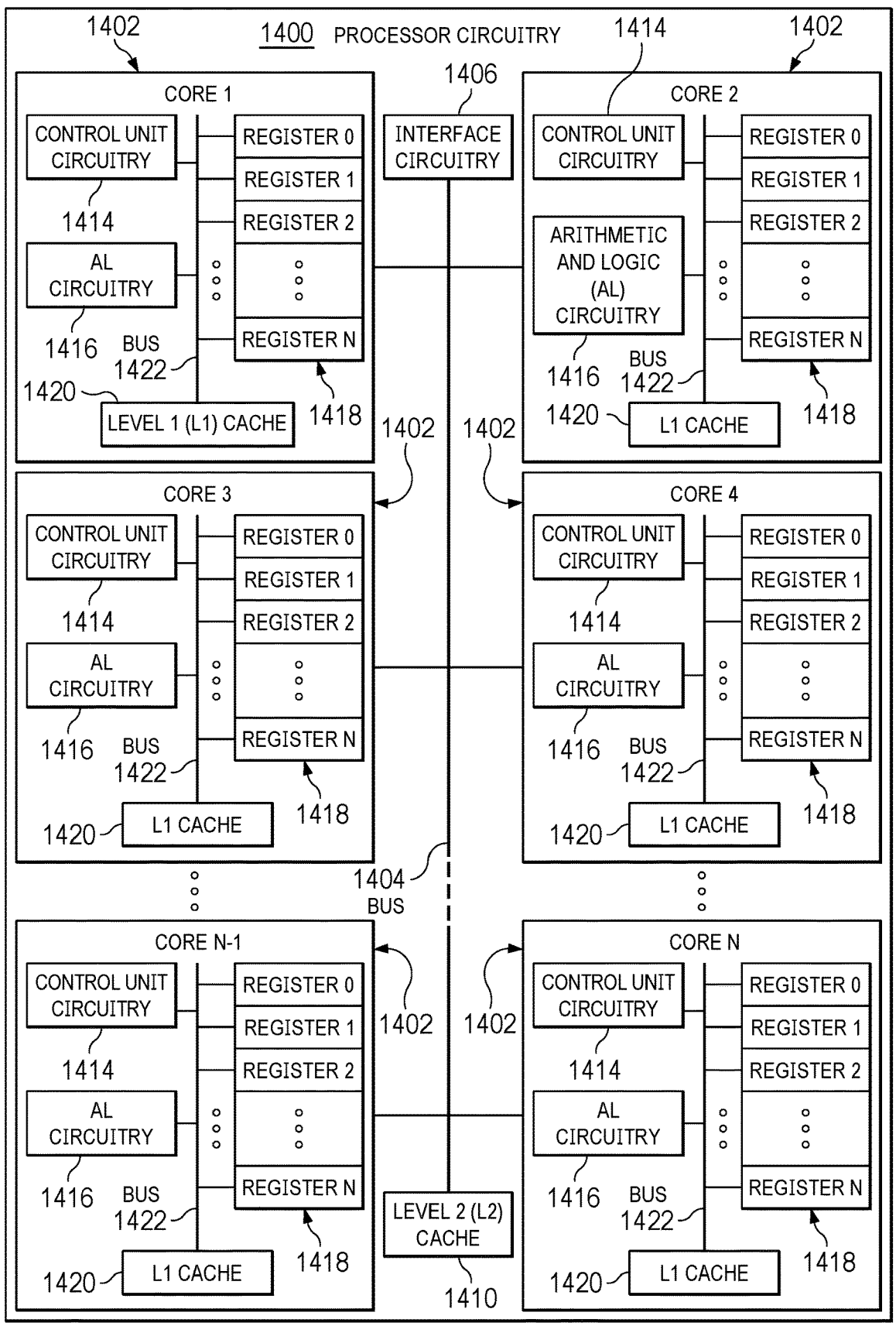
FIG. 14 is a block diagram of an example implementation of the programmable circuitry of FIG. 13.

FIG. 14 is a block diagram of an example implementation of the programmable circuitry 1312 of FIG. 13. In this example, the programmable circuitry 1312 of FIG. 13 is implemented by a microprocessor 1400. For example, the microprocessor 1400 may be a general-purpose microprocessor (e.g., general-purpose microprocessor circuitry). The microprocessor 1400 executes some or all of the machine-readable instructions of the flowcharts of FIGS. 12A and 12B to effectively instantiate the circuitry of FIG. 2 as logic circuits to perform operations corresponding to those machine-readable instructions. In some such examples, the circuitry of FIG. 11 is instantiated by the hardware circuits of the microprocessor 1400 in combination with the machine-readable instructions. For example, the microprocessor 1400 may be implemented by multi-core hardware circuitry such as a CPU, a DSP, a GPU, an XPU, etc. Although it may include any number of example cores 1402 (e.g., 1 core), the microprocessor 1400 of this example is a multi-core semiconductor device including N cores. The cores 1402 of the microprocessor 1400 may operate independently or may cooperate to execute machine-readable instructions. For example, machine code corresponding to a firmware program, an embedded software program, or a software program may be executed by one of the cores 1402 or may be executed by multiple ones of the cores 1402 at the same or different times. In some examples, the machine code corresponding to the firmware program, the embedded software program, or the software program is split into threads and executed in parallel by two or more of the cores 1402. The software program may correspond to a portion or all of the machine-readable instructions and/or operations represented by the flowcharts of FIGS. 12A and 12B.

The cores 1402 may communicate by a first example bus 1404. In some examples, the first bus 1404 may be implemented by a communication bus to effectuate communication associated with one(s) of the cores 1402. For example, the first bus 1404 may be implemented by at least one of an Inter-Integrated Circuit (I2C) bus, a Serial Peripheral Interface (SPI) bus, a PCI bus, or a PCIe bus. Also or alternatively, the first bus 1404 may be implemented by any other type of computing or electrical bus. The cores 1402 may obtain data, instructions, and/or signals from one or more external devices by example interface circuitry 1406. The cores 1402 may output data, instructions, and/or signals to the one or more external devices by the interface circuitry 1406. Although the cores 1402 of this example include example local memory 1420 (e.g., Level 1 (L1) cache that may be split into an L1 data cache and an L1 instruction cache), the microprocessor 1400 also includes example shared memory 1410 that may be shared by the cores (e.g., Level 2 (L2 cache)) for high-speed access to data and/or instructions. Data and/or instructions may be transferred (e.g., shared) by writing to and/or reading from the shared memory 1410. The local memory 1420 of each of the cores 1402 and the shared memory 1410 may be part of a hierarchy of storage devices including multiple levels of cache memory and the main memory (e.g., the main memory 1314, 1316 of FIG. 13). Higher levels of memory in the hierarchy exhibit lower access time and have smaller storage capacity than lower levels of memory. Changes in the various levels of the cache hierarchy are managed (e.g., coordinated) by a cache coherency policy.

Each core 1402 may be referred to as a CPU, DSP, GPU, etc., or any other type of hardware circuitry. Each core 1402 includes control unit circuitry 1414, arithmetic and logic (AL) circuitry (sometimes referred to as an ALU) 1416, a plurality of registers 1418, the local memory 1420, and a second example bus 1422. Other structures may be present. For example, each core 1402 may include vector unit circuitry, single instruction multiple data (SIMD) unit circuitry, load/store unit (LSU) circuitry, branch/jump unit circuitry, floating-point unit (FPU) circuitry, etc. The control unit circuitry 1414 includes semiconductor-based circuits structured to control (e.g., coordinate) data movement within the corresponding core 1402. The AL circuitry 1416 includes semiconductor-based circuits structured to perform one or more mathematic and/or logic operations on the data within the corresponding core 1402. The AL circuitry 1416 of some examples performs integer-based operations. In other examples, the AL circuitry 1416 also performs floating-point operations. In yet other examples, the AL circuitry 1416 may include first AL circuitry that performs integer-based operations and second AL circuitry that performs floating-point operations. In some examples, the AL circuitry 1416 may be referred to as an Arithmetic Logic Unit (ALU).

The registers 1418 are semiconductor-based structures to store data and/or instructions such as results of one or more of the operations performed by the AL circuitry 1416 of the corresponding core 1402. For example, the registers 1418 may include vector register(s), SIMD register(s), general-purpose register(s), flag register(s), segment register(s), machine-specific register(s), instruction pointer register(s), control register(s), debug register(s), memory management register(s), machine check register(s), etc. The registers

1418 may be arranged in a bank as shown in FIG. 14. Alternatively, the registers 1418 may be organized in any other arrangement, format, or structure, such as by being distributed throughout the core 1402 to shorten access time. The second bus 1422 may be implemented by at least one of an I2C bus, a SPI bus, a PCI bus, or a PCIe bus.

Each core 1402 and/or, more generally, the microprocessor 1400 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1400 is a semiconductor device fabricated to include many transistors interconnected to implement the structures described above in one or more integrated circuits (ICs) contained in one or more packages.

The microprocessor 1400 may include and/or cooperate with one or more accelerators (e.g., acceleration circuitry, hardware accelerators, etc.). In some examples, accelerators are implemented by logic circuitry to perform certain tasks more quickly and/or efficiently than can be done by a general-purpose processor. Examples of accelerators include ASICs and FPGAs such as those described herein. A GPU, DSP and/or other programmable device can also be an accelerator. Accelerators may be on-board the microprocessor 1400, in the same chip package as the microprocessor 1400 and/or in one or more separate packages from the microprocessor 1400.

Figure 15:
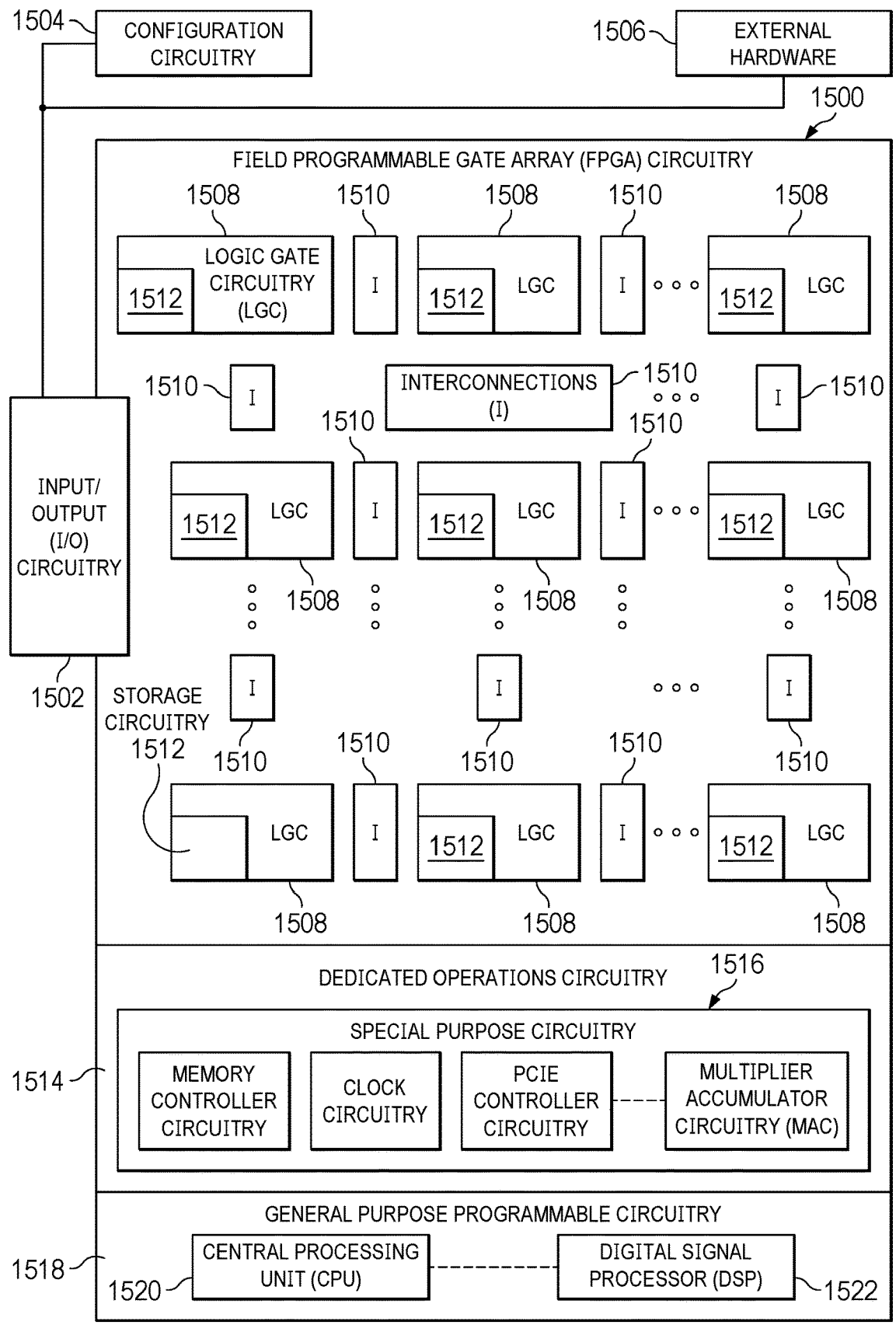
FIG. 15 is a block diagram of another example implementation of the programmable circuitry of FIG. 13.

FIG. 15 is a block diagram of another example implementation of the programmable circuitry 1312 of FIG. 13. In this example, the programmable circuitry 1312 is implemented by FPGA circuitry 1500. For example, the FPGA circuitry 1500 may be implemented by an FPGA. The FPGA circuitry 1500 can be used, for example, to perform operations that could otherwise be performed by the example microprocessor 1400 of FIG. 14 executing corresponding machine-readable instructions. However, once configured, the FPGA circuitry 1500 instantiates the operations and/or functions corresponding to the machine-readable instructions in hardware and, thus, can often execute the operations/functions faster than they could be performed by a general-purpose microprocessor executing the corresponding software.

More specifically, in contrast to the microprocessor 1400 of FIG. 14 described above (which is a general purpose device that may be programmed to execute some or all of the machine-readable instructions represented by the flowchart(s) of FIGS. 12A and 12B but whose interconnections and logic circuitry are fixed once fabricated), the FPGA circuitry 1500 of the example of FIG. 15 includes interconnections and logic circuitry that may be configured, structured, programmed, and/or interconnected in different ways after fabrication to instantiate, for example, some or all of the operations/functions corresponding to the machine-readable instructions represented by the flowchart(s) of FIGS. 12A and 12B. In particular, the FPGA circuitry 1500 may be thought of as an array of logic gates, interconnections, and switches. The switches can be programmed to change how the logic gates are interconnected by the interconnections, effectively forming one or more dedicated logic circuits (unless and until the FPGA circuitry 1500 is reprogrammed). The configured logic circuits enable the logic gates to cooperate in different ways to perform different operations on data received by input circuitry. Those operations may correspond to some or all of the instructions (e.g., the software and/or firmware) represented by the flowchart(s) of FIGS. 12A and 12B. As such, the FPGA circuitry 1500 may be configured and/or structured to effectively instantiate some or all of the operations/functions corresponding to the machine-readable instructions of the flowchart(s) of FIGS. 12A and 12B as dedicated logic circuits to perform the operations/functions corresponding to those software instructions in a dedicated manner analogous to an ASIC. Therefore, the FPGA circuitry 1500 may perform the operations/functions corresponding to the some or all of the machine-readable instructions of FIGS. 12A and 12B faster than the general-purpose microprocessor can execute the same.

In the example of FIG. 15, the FPGA circuitry 1500 is configured and/or structured in response to being programmed (and/or reprogrammed one or more times) based on a binary file. In some examples, the binary file may be compiled and/or generated based on instructions in a hardware description language (HDL) such as Lucid, Very High-Speed Integrated Circuits (VHSIC) Hardware Description Language (VHDL), or Verilog. For example, a user (e.g., a human user, a machine user, etc.) may write code or a program corresponding to one or more operations/functions in an HDL; the code/program may be translated into a low-level language as needed; and the code/program (e.g., the code/program in the low-level language) may be converted (e.g., by a compiler, a software application, etc.) into the binary file. In some examples, the FPGA circuitry 1500 of FIG. 15 may access and/or load the binary file to configure and/or structure the FPGA circuitry 1500 of FIG. 15 to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 1500 of FIG. 15 to configure and/or structure the FPGA circuitry 1500 of FIG. 15, or portion(s) thereof.

In some examples, the binary file is compiled, generated, transformed, and/or otherwise output from a uniform software platform utilized to program FPGAs. For example, the uniform software platform may translate first instructions (e.g., code or a program) that correspond to one or more operations/functions in a high-level language (e.g., C, C++, Python, etc.) into second instructions that correspond to the one or more operations/functions in an HDL. In some such examples, the binary file is compiled, generated, and/or otherwise output from the uniform software platform based on the second instructions. In some examples, the FPGA circuitry 1500 of FIG. 15 may access and/or load the binary file to the FPGA circuitry 1500 of FIG. 15 to be configured and/or structured to perform the one or more operations/functions. For example, the binary file may be implemented by a bit stream (e.g., one or more computer-readable bits, one or more machine-readable bits, etc.), data (e.g., computer-readable data, machine-readable data, etc.), and/or machine-readable instructions accessible to the FPGA circuitry 1500 of FIG. 15 to configure and/or structure the FPGA circuitry 1500 of FIG. 15, or portion(s) thereof.

The FPGA circuitry 1500 of FIG. 15, includes example input/output (I/O) circuitry 1502 to obtain and/or output data to/from example configuration circuitry 1504 and/or external hardware 1506. For example, the configuration circuitry 1504 may be implemented by interface circuitry that may obtain a binary file, which may be implemented by a bit stream, data, and/or machine-readable instructions, to configure the FPGA circuitry 1500, or portion(s) thereof. In some such examples, the configuration circuitry 1504 may obtain the binary file from a user, a machine (e.g., hardware circuitry (e.g., programmable or dedicated circuitry) that may implement an Artificial Intelligence/Machine Learning (AI/ML) model to generate the binary file), etc., and/or any combination(s) thereof). In some examples, the external hardware 1506 may be implemented by external hardware circuitry. For example, the external hardware 1506 may be implemented by the microprocessor 1400 of FIG. 14.

The FPGA circuitry 1500 also includes an array of example logic gate circuitry 1508, a plurality of example configurable interconnections 1510, and example storage circuitry 1512. The logic gate circuitry 1508 and the configurable interconnections 1510 are configurable to instantiate one or more operations/functions that may correspond to at least some of the machine-readable instructions of FIGS. 12A and 12B and/or other desired operations. The logic gate circuitry 1508 shown in FIG. 15 is fabricated in blocks or groups. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1508 to enable configuration of the electrical structures and/or the logic gates to form circuits to perform desired operations/functions. The logic gate circuitry 1508 may include other electrical structures such as look-up tables (LUTs), registers (e.g., flip-flops or latches), multiplexers, etc.

The configurable interconnections 1510 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1508 to program desired logic circuits.

The storage circuitry 1512 of the illustrated example is structured to store result(s) of the one or more of the operations performed by corresponding logic gates. The storage circuitry 1512 may be implemented by registers or the like. In the illustrated example, the storage circuitry 1512 is distributed amongst the logic gate circuitry 1508 to facilitate access and increase execution speed.

The example FPGA circuitry 1500 of FIG. 15 also includes example dedicated operations circuitry 1514. In this example, the dedicated operations circuitry 1514 includes special purpose circuitry 1516 that may be invoked to implement commonly used functions to avoid the need to program those functions in the field. Examples of such special purpose circuitry 1516 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1500 may also include example general purpose programmable circuitry 1518 such as an example CPU 1520 and/or an example DSP 1522. Other general purpose programmable circuitry 1518 may also or alternatively be present such as a GPU, an XPU, etc., that can be programmed to perform other operations.

Although FIGS. 14 and 15 illustrate two example implementations of the programmable circuitry 1312 of FIG. 13, many other approaches are contemplated. For example, FPGA circuitry may include an on-board CPU, such as one or more of the example CPU 1520 of FIG. 14. Therefore, the programmable circuitry 1312 of FIG. 13 may also be implemented by combining at least the example microprocessor 1400 of FIG. 14 and the example FPGA circuitry 1500 of FIG. 15. In some such hybrid examples, one or more cores 1402 of FIG. 14 may execute a first portion of the machine-readable instructions represented by the flowchart(s) of FIGS. 12A and 12B to perform first operation(s)/function(s), the FPGA circuitry 1500 of FIG. 15 may be configured and/or structured to perform second operation(s)/function(s) corresponding to a second portion of the machine-readable instructions represented by the flowcharts of FIGS. 12A and 12B, and/or an ASIC may be configured and/or structured to perform third operation(s)/function(s) corresponding to a third portion of the machine-readable instructions represented by the flowcharts of FIGS. 12A and 12B.

Some or all of the circuitry of FIG. 11 may, thus, be instantiated at the same or different times. For example, same and/or different portion(s) of the microprocessor 1400 of FIG. 14 may be programmed to execute portion(s) of machine-readable instructions at the same and/or different times. In some examples, same and/or different portion(s) of the FPGA circuitry 1500 of FIG. 15 may be configured and/or structured to perform operations/functions corresponding to portion(s) of machine-readable instructions at the same and/or different times.

In some examples, some or all of the circuitry of FIG. 11 may be instantiated, for example, in one or more threads executing concurrently and/or in series. For example, the microprocessor 1400 of FIG. 14 may execute machine-readable instructions in one or more threads executing concurrently and/or in series. In some examples, the FPGA circuitry 1500 of FIG. 15 may be configured and/or structured to carry out operations/functions concurrently and/or in series. Moreover, in some examples, some or all of the circuitry of FIG. 11 may be implemented within one or more virtual machines and/or containers executing on the microprocessor 1400 of FIG. 14.

In some examples, the programmable circuitry 1312 of FIG. 13 may be in one or more packages. For example, the microprocessor 1400 of FIG. 14 and/or the FPGA circuitry 1500 of FIG. 15 may be in one or more packages. In some examples, an XPU may be implemented by the programmable circuitry 1312 of FIG. 13, which may be in one or more packages. For example, the XPU may include a CPU (e.g., the microprocessor 1400 of FIG. 14, the CPU 1520 of FIG. 15, etc.) in one package, a DSP (e.g., the DSP 1522 of FIG. 15) in another package, a GPU in yet another package, and an FPGA (e.g., the FPGA circuitry 1500 of FIG. 15) in still yet another package.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" refers to implementations including any of (1) at least one A, (2) at least one B, or (3) at least one A and at least one B. Similarly, as used herein in the context of describing structures, components, items, objects and/or things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is not feasible and/or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for case of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real-world imperfections will be interpreted by persons of ordinary skill in the art. For example, "approximately" and "about" may indicate such dimensions may be within a tolerance range of +/−10% unless otherwise specified herein.

As used herein "substantially real time" refers to occurrence in a near instantaneous manner recognizing there may be real world delays for computing time, transmission, etc. Thus, unless otherwise specified, "substantially real time" refers to real time+1 second.

As used herein, the phrase "in communication," including variations thereof, encompasses direct communication and/or indirect communication through one or more intermediary components, and does not require direct physical (e.g., wired) communication and/or constant communication, but rather also includes selective communication at periodic intervals, scheduled intervals, aperiodic intervals, and/or one-time events.

As used herein, "programmable circuitry" is defined to include (i) one or more special purpose electrical circuits (e.g., an application specific circuit (ASIC)) structured to perform specific operation(s) and including one or more semiconductor-based logic devices (e.g., electrical hardware implemented by one or more transistors), and/or (ii) one or more general purpose semiconductor-based electrical circuits programmable with instructions to perform specific functions(s) and/or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations and/or functions, Field Programmable Gate Arrays (FPGAs) that may be programmed with second instructions to configure and/or structure the FPGAs to instantiate one or more operations and/or functions corresponding to the first instructions, Graphics Processor Units (GPUs) that may execute first instructions to perform one or more operations and/or functions, Digital Signal Processors (DSPs) that may execute first instructions to perform one or more operations and/or functions, XPUs, Network Processing Units (NPUs) one or more microcontrollers that may execute first instructions to perform one or more operations and/or functions and/or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and/or any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

In this description, the term "and/or" (when used in a form such as A, B and/or C) refers to any combination or subset of A, B, C, such as: (a) A alone; (b) B alone; (c) C alone; (d) A with B; (c) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Numerical identifiers such as "first," "second," "third," etc. are used merely to distinguish between elements of substantially the same type in terms of structure and/or function. These identifiers, as used in the detailed description, do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

What is claimed is:

1. An apparatus comprising:
    first voltage-to-delay circuitry having an output;
    second voltage-to-delay circuitry having an output;
    time domain converter circuitry having a first input, a trim input, and an output, the first input of the time domain converter circuitry coupled to the first voltage-to-delay circuitry;
    comparator circuitry having a first input, a second input, and an output, the first input of the comparator circuitry coupled to the output of the first voltage-to-delay circuitry and the first input of the time domain converter circuitry, the second input of the comparator circuitry coupled to the output of the second voltage-to-delay circuitry; and
    trim circuitry having a first input, a second input, and an output, the first input of the trim circuitry coupled to the output of the time domain converter circuitry, the second input of the trim circuitry coupled to the output of the comparator circuitry, the output of the trim circuitry coupled to the trim input of the time domain converter circuitry.

2. The apparatus of claim 1, wherein the second voltage-to-delay circuitry further has an input, the output of the trim circuitry is a first output, the trim circuitry further having a second output, the apparatus further comprising a digital-to-analog converter (DAC) having an input and an output, the input of the DAC coupled to the second output of the trim circuitry, the output of the DAC coupled to the input of the second voltage-to-delay circuitry.

3. The apparatus of claim 1, wherein the output of the first voltage-to-delay circuitry is a first output, the first voltage-to-delay circuitry further having a second output, the comparator circuitry further having a third input, the time domain converter circuitry comprising:
    first stage circuitry having a first input, a second input, a first output, and a second output, the first input of the first stage circuitry coupled to the first output of the first voltage-to-delay circuitry and the first input of the comparator circuitry, the second input of the first stage circuitry coupled to the second output of the first voltage-to-delay circuitry and the third input of the comparator circuitry; and second stage circuitry having a first input and a second input, the first input of the second stage circuitry is coupled to the first output of the first stage circuitry, the second input of the second stage circuitry coupled to the second output of the first stage circuitry.

4. The apparatus of claim 3, wherein the comparator circuitry is first comparator circuitry, first stage circuitry comprising:

second comparator circuitry having a first input, a second input, and an output, the output of the second comparator circuitry coupled to the first input of the second stage circuitry; and a logic device having a first input, a second input, and an output, the first input of the logic device coupled to the first output of the first voltage-to-delay circuitry, the first input of the first comparator circuitry, and the first input of the second comparator circuitry, the second input of the logic device coupled to the second output of the first voltage-to-delay circuitry, the second input of the first comparator circuitry, and the second input of the second comparator circuitry, the output of the logic device coupled to the second input of the second stage circuitry.

5. The apparatus of claim 1, wherein the output of the trim circuitry is a first output of the trim circuitry, the trim circuitry further having a second output, the apparatus further comprising variable delay circuitry having a first input, a control input, and an output, the first input of the variable delay circuitry coupled to the output of the first voltage-to-delay circuitry and the first input of the comparator circuitry, the control input of the variable delay circuitry coupled to the second output of the trim circuitry, the output of the variable delay circuitry coupled to the first input of the time domain converter circuitry.

6. The apparatus of claim 1, wherein the comparator circuitry is first comparator circuitry, the output of the first voltage-to-delay circuitry is a first output, the first voltage-to-delay circuitry further having a second output, the output of the second voltage-to-delay circuitry is a first output, the second voltage-to-delay circuitry further having a second output, the apparatus further comprising:

second comparator circuitry having a first input and a second input, the first input of the second comparator circuitry coupled to the second output of the first voltage-to-delay circuitry; and third comparator circuitry having a first input and a second input, the first input of the third comparator circuitry coupled to the first output of the second voltage-to-delay circuitry and the second input of the first comparator circuitry, the second input of the third comparator circuitry coupled to the second output of the second voltage-to-delay circuitry and the second input of the third comparator circuitry.

7. The apparatus of claim 6, wherein the time domain converter circuitry further having a second input, the apparatus further comprising:

first delay circuitry coupled between the first output of the first voltage-to-delay circuitry and the first input of the time domain converter circuitry;

second delay circuitry coupled between the second output of the first voltage-to-delay circuitry and the second input of the time domain converter circuitry;

third delay circuitry coupled between the first output of the second voltage-to-delay circuitry and the first input of the third comparator circuitry; and fourth delay circuitry coupled between the second output of the second voltage-to-delay circuitry and the second input of the third comparator circuitry.

8. An apparatus comprising:

time domain converter circuitry having a first input, a second input, a trim input, and an output, wherein differences between timing of the first and second inputs of the time domain converter circuitry represent a first delay;

first comparator circuitry having a first input, a second input, and an output, the first input of the first comparator circuitry coupled to the first input of the time domain converter circuitry;

second comparator circuitry having a first input, a second input, and an output, the first input of the second comparator circuitry coupled to the second input of the time domain converter circuitry;

third comparator circuitry having a first input, a second input, and an output, the first input of the third comparator circuitry coupled to the second input of the first comparator circuitry, the second input of the third comparator circuitry coupled to the second input of the second comparator circuitry, wherein differences between timing of the first and second inputs of the time domain converter circuitry represent a second delay; and trim circuitry having a first input, a second input, a third input, and an output, the first input of the trim circuitry coupled to the output of the first comparator circuitry, the second input of the trim circuitry coupled to the output of the second comparator circuitry, the third input of the trim circuitry coupled to the output of the third comparator circuitry, the output of the trim circuitry coupled to the trim input of the time domain converter circuitry.

9. The apparatus of claim 8, further comprising voltage-to-delay circuitry having a first output and a second output, the first output of the voltage-to-delay circuitry coupled to the first input of the time domain converter circuitry and the first input of the first comparator circuitry, the second output of the voltage-to-delay circuitry coupled to the second input of the time domain converter circuitry and the first input of the second comparator circuitry.

10. The apparatus of claim 8, further comprising voltage-to-delay circuitry having a first output and a second output, the first output of the voltage-to-delay circuitry coupled to the second input of the first comparator circuitry and the first input of the third comparator circuitry, the second output of the voltage-to-delay circuitry coupled to the second input of the second comparator circuitry and the second input of the third comparator circuitry.

11. The apparatus of claim 8, further comprising delay circuitry coupled between the time domain converter circuitry and the first comparator circuitry.

12. The apparatus of claim 8, wherein the time domain converter circuitry further comprising:

first stage circuitry having a first input, a second input, a first output, and a second output, the first input of the first stage circuitry coupled to the first input of the first comparator circuitry, the second input of the first stage circuitry coupled to the first input of the second comparator circuitry; and second stage circuitry having a first input and a second input, the first input of the second stage circuitry is coupled to the first output of the first stage circuitry, the second input of the second stage circuitry coupled to the second output of the first stage circuitry.

13. The apparatus of claim 12, wherein the first stage circuitry comprising:
fourth comparator circuitry having a first input, a second input, and an output, the output of the fourth comparator circuitry coupled to the first input of the second stage circuitry; and
a logic device having a first input, a second input, and an output, the first input of the logic device coupled to the first input of the first comparator circuitry and the first input of the fourth comparator circuitry, the second input of the logic device coupled to the first input of the second comparator circuitry, and the second input of the fourth comparator circuitry, the output of the logic device coupled to the second input of the second stage circuitry.

14. An apparatus comprising:
time domain converter circuitry configured to determine a digital value that represents a first delay, the first delay being a delay between a first signal and a second signal;
comparator circuitry coupled to the time domain converter circuitry, the comparator circuitry configured to compare the first delay to a second delay; and
trim circuitry coupled to the time domain converter circuitry and the comparator circuitry, the trim circuitry is configured to adjust the time domain converter circuitry responsive to the digital value and the comparison.

15. The apparatus of claim 14, wherein the time domain converter circuitry further comprising:
first stage circuitry configured to:
compare the first signal and the second signal;
determine a first sign bit responsive to the first signal and the second signal; and
logically combine the first signal and the second signal; and
second stage circuitry configured to:
compare the comparison of the first stage circuitry to the logical combination of the first stage circuitry;
determine a second sign bit responsive to the comparison of the first stage circuitry and the logical combination of the first stage circuitry; and
logically combine the comparison of the first stage circuitry and the logical combination of the first stage circuitry.

16. The apparatus of claim 15, wherein the comparator circuitry is first comparator circuitry, first stage circuitry comprising:
second comparator circuitry configured to:
compare the first signal to the second signal;
determine the first sign bit responsive to the first delay of the first signal and the second signal; and
a logic device configured to logically AND the first signal and the second signal.

17. The apparatus of claim 14, further comprising variable delay circuitry configured to shift a common mode delay of the first delay by a third delay from the trim circuitry.

18. The apparatus of claim 14, wherein the first delay is a difference between edges of the first signal and the second signal, and the second delay is a difference between edges of a third signal and a fourth signal.

19. The apparatus of claim 18, wherein the comparator circuitry is first comparator circuitry, the apparatus further comprising:
the first comparator circuitry is configured to compare the first signal to the third signal;
second comparator circuitry configured to compare the second signal to the fourth signal; and
third comparator circuitry configured to compare the third signal to the fourth signal.

20. The apparatus of claim 19, further comprising:
first delay circuitry is configured to delay the first signal by a third delay;
second delay circuitry is configured to delay the second signal by a fourth delay;
third delay circuitry is configured to delay the third signal by a fifth delay; and
fourth delay circuitry is configured to delay the fourth signal by a sixth delay.

* * * * *